(12) United States Patent
Yu et al.

(10) Patent No.: US 10,707,228 B2
(45) Date of Patent: Jul. 7, 2020

(54) THREE-DIMENSIONAL MEMORY DEVICE HAVING BONDING STRUCTURES CONNECTED TO BIT LINES AND METHODS OF MAKING THE SAME

(71) Applicant: SANDISK TECHNOLOGIES LLC, Addison, TX (US)

(72) Inventors: Jixin Yu, Milpitas, CA (US); Tae-Kyung Kim, San Jose, CA (US); Johann Alsmeier, San Jose, CA (US); Yan Li, Milpitas, CA (US); Jian Chen, Menlo Park, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 16/284,502

(22) Filed: Feb. 25, 2019

(65) Prior Publication Data

US 2020/0066745 A1 Feb. 27, 2020

Related U.S. Application Data

(60) Provisional application No. 62/720,327, filed on Aug. 21, 2018.

(51) Int. Cl.
*H01L 27/088* (2006.01)
*H01L 27/11578* (2017.01)
(Continued)

(52) U.S. Cl.
CPC .......... *H01L 27/11578* (2013.01); *G11C 5/02* (2013.01); *G11C 5/06* (2013.01); *H01L 2224/10* (2013.01)

(58) Field of Classification Search
None
See application file for complete search history.

(56) References Cited

U.S. PATENT DOCUMENTS 5,915,167 A 6/1999 Leedy
9,305,934 B1 * 4/2016 Ding ................. H01L 27/11573
(Continued)

OTHER PUBLICATIONS

Notification of Transmittal of the International Search Report and Written Opinion of the International Search Authority or International Patent Application No. PCT/US2019/033619, dated Sep. 11, 2019, 11 pages.

(Continued)

*Primary Examiner* — Ali Naraghi
(74) *Attorney, Agent, or Firm* — The Marbury Law Group PLLC

(57) ABSTRACT

Three-dimensional memory devices in the form of a memory die includes an alternating stack of insulating layers and electrically conductive layers located over a substrate, and memory stack structures extending through the alternating stack, in which each of the memory stack structures includes a memory film and a vertical semiconductor channel contacting an inner sidewall of the memory film. Bit lines are electrically connected to an end portion of a respective one of the vertical semiconductor channels. Bump connection via structures contact a top surface of a respective one of the bit lines, in which each of the bump connection via structures has a greater lateral dimension along a lengthwise direction of the bit lines than along a widthwise direction of the bit lines. Metallic bump structures of another semiconductor die contact respective ones of the bump connection via structures to make respective electrical connections between the two dies.

13 Claims, 54 Drawing Sheets

(51) Int. Cl.
  *G11C 5/02*  (2006.01)
  *G11C 5/06*  (2006.01)

(56) References Cited

U.S. PATENT DOCUMENTS

| | | | |
|---|---|---|---|
| 9,754,923 B1 * | 9/2017 | Xie | H01L 23/5286 |
| 9,761,620 B1 * | 9/2017 | Salmon | H01L 27/1462 |
| 2015/0097283 A1 | 4/2015 | Daubenspeck et al. | |
| 2015/0380549 A1 * | 12/2015 | Yun | H01L 23/528 |
| | | | 257/329 |
| 2016/0005688 A1 | 1/2016 | Hirano et al. | |
| 2016/0079164 A1 | 3/2016 | Fukuzumi et al. | |
| 2016/0307910 A1 * | 10/2016 | Son | H01L 27/11573 |
| 2017/0125433 A1 | 5/2017 | Ogawa et al. | |

OTHER PUBLICATIONS

Endoh et al., "Novel Ultra High Density Memory with a Stacked-Surrounding Gate Transistor (S-SGT) Structured Cell," IEDM Proc. (2001) 33-36.
U.S. Appl. No. 15/873,101, filed Jan. 17, 2018, Sandisk Technologies LLC.
U.S. Appl. No. 15/892,648, filed Feb. 9, 2018, Sandisk Technologies LLC.
U.S. Appl. No. 15/928,340, filed Mar. 22, 2018, Sandisk Technologies LLC.
U.S. Appl. No. 15/928,407, filed Mar. 22, 2018, Sandisk Technologies LLC.
U.S. Appl. No. 15/960,267, filed Apr. 23, 2018, Sandisk Technologies LLC.
U.S. Appl. No. 15/979,885, filed May 15, 2018, Sandisk Technologies LLC.

\* cited by examiner

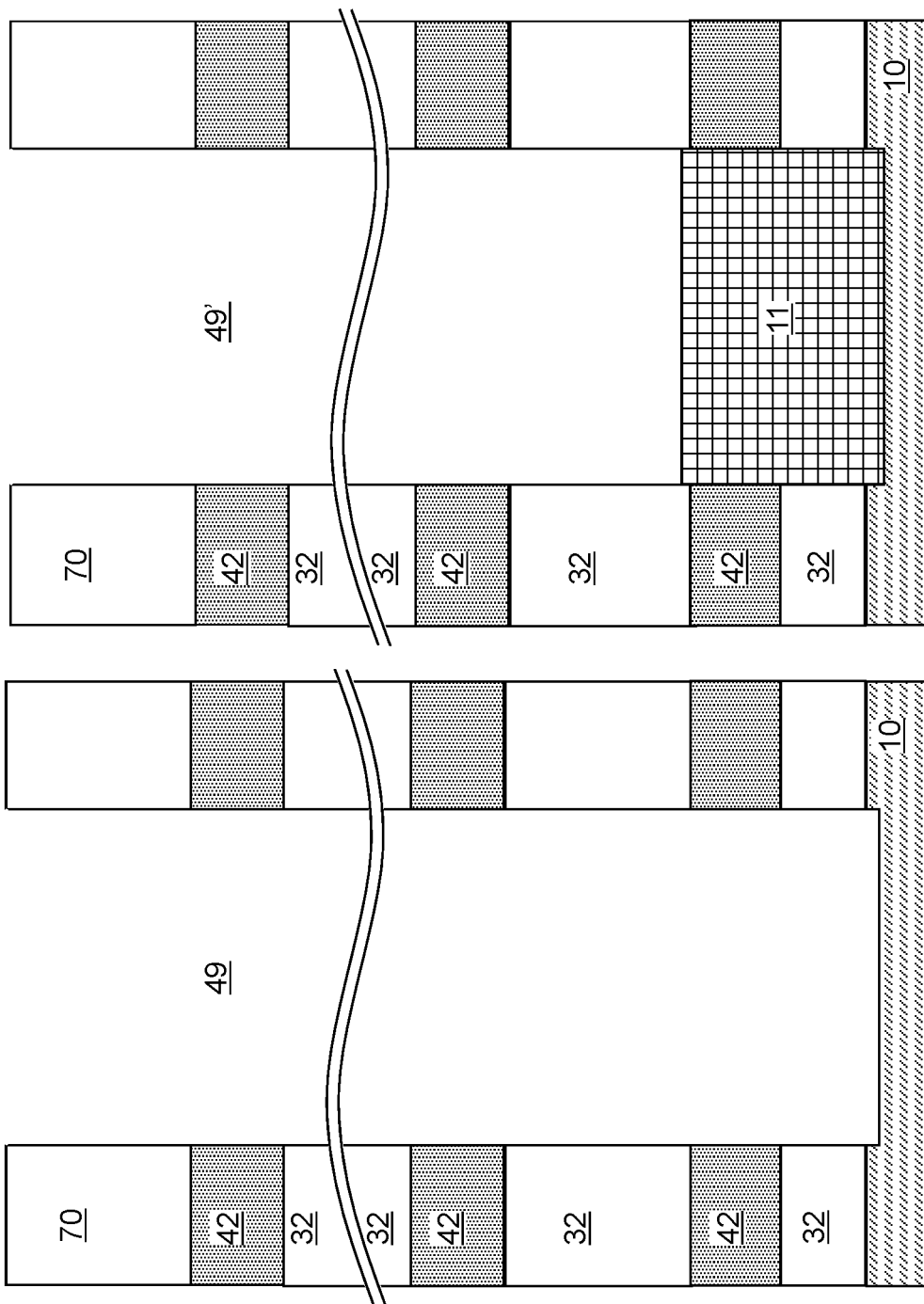

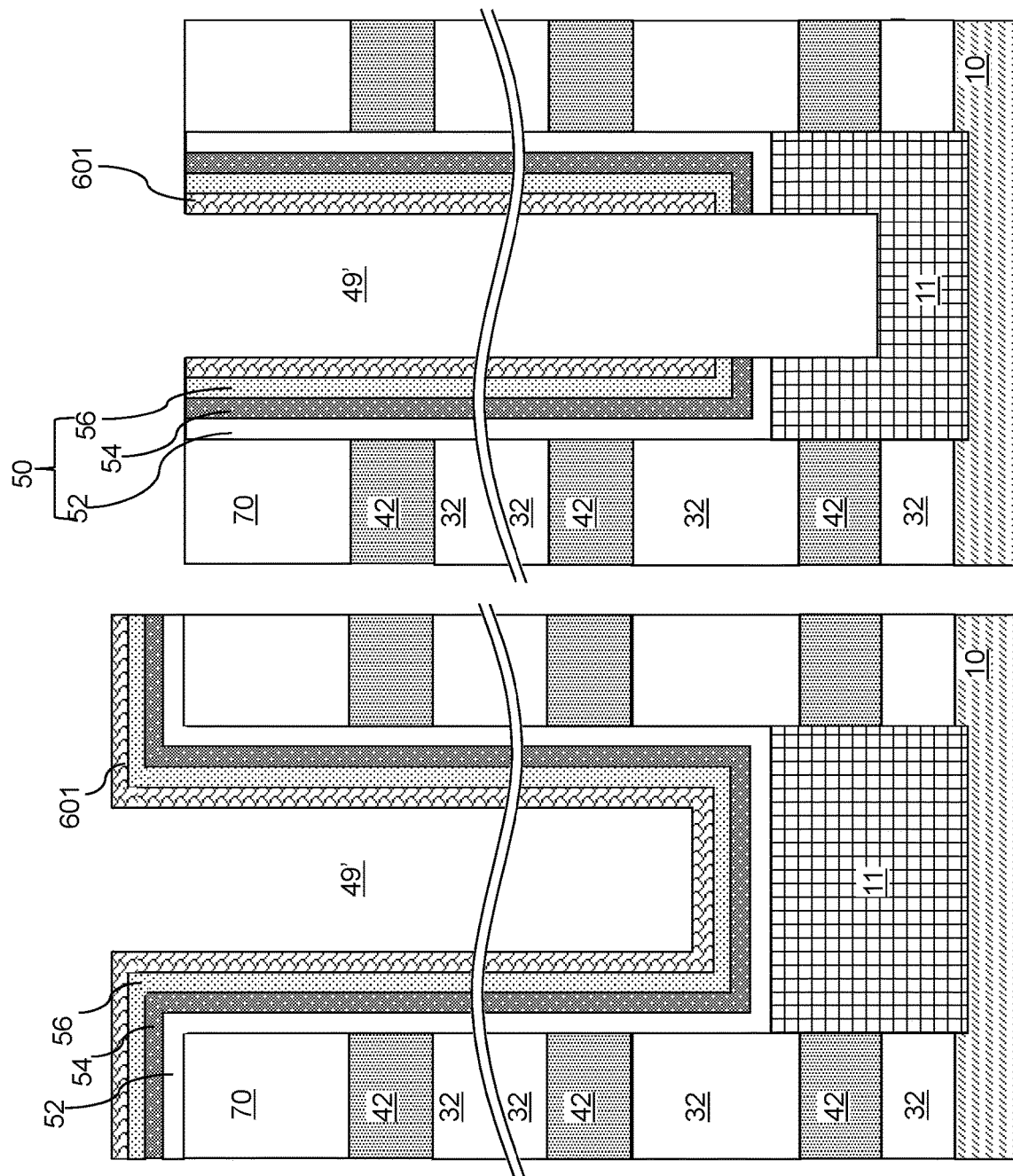

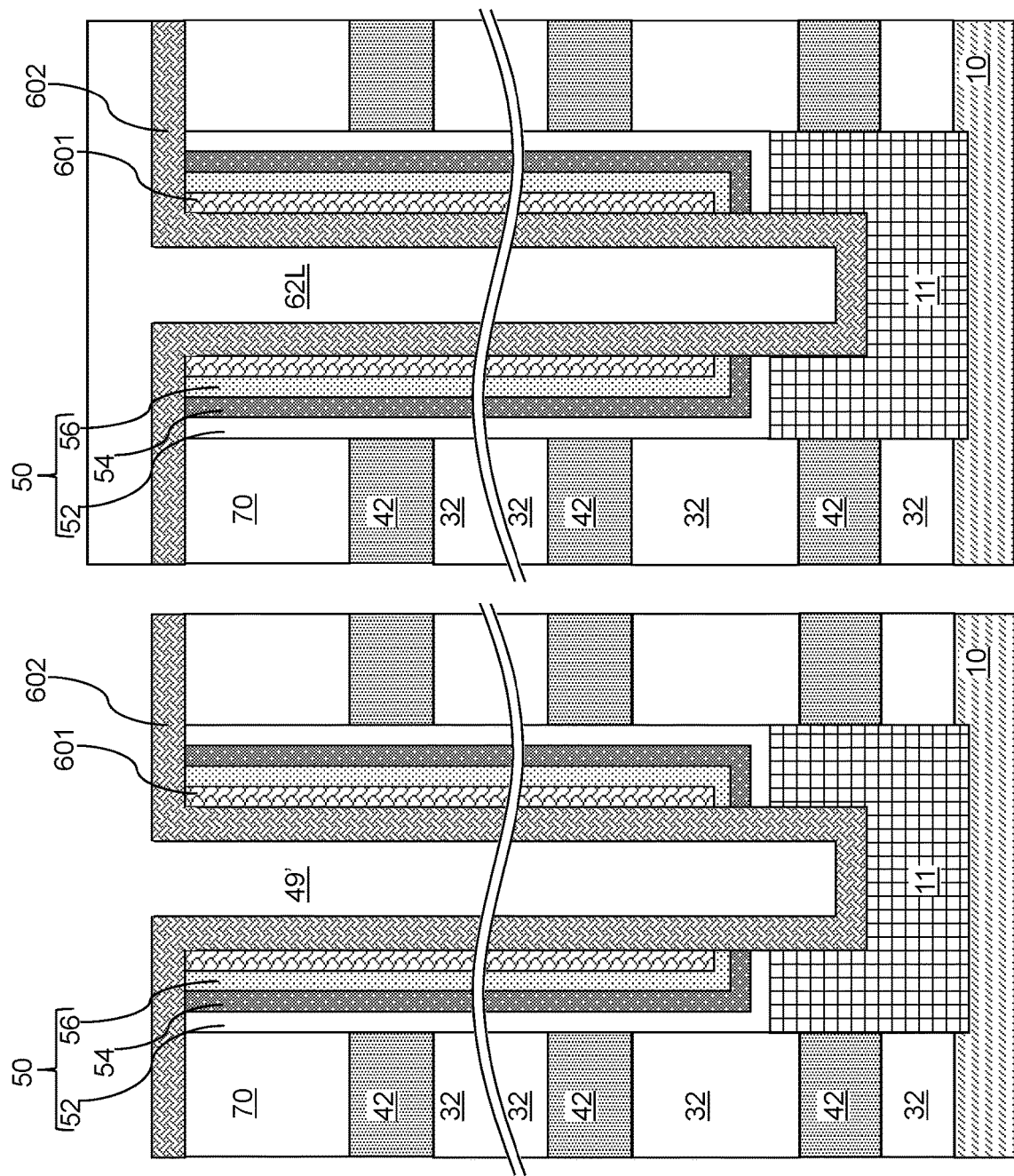

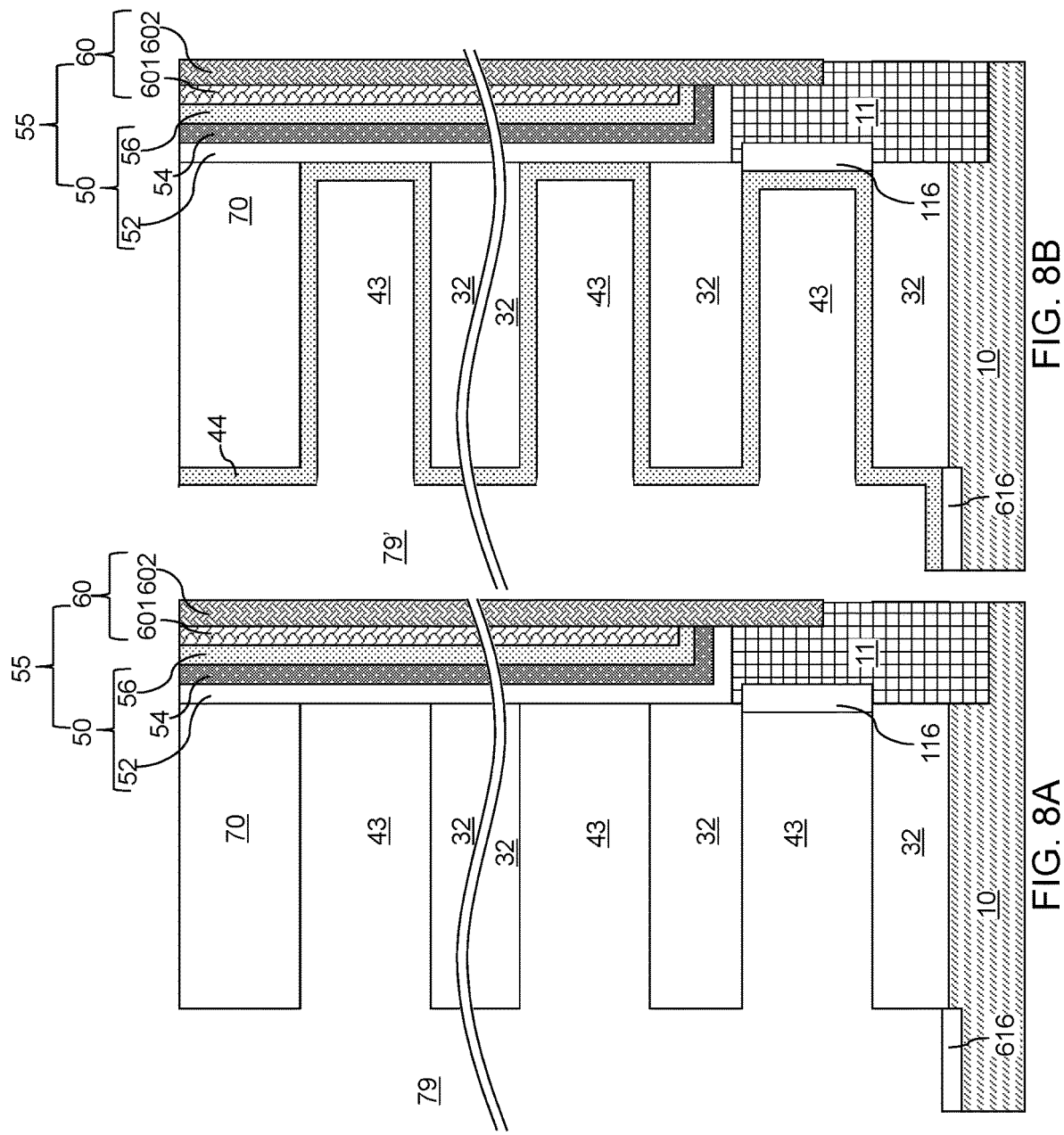

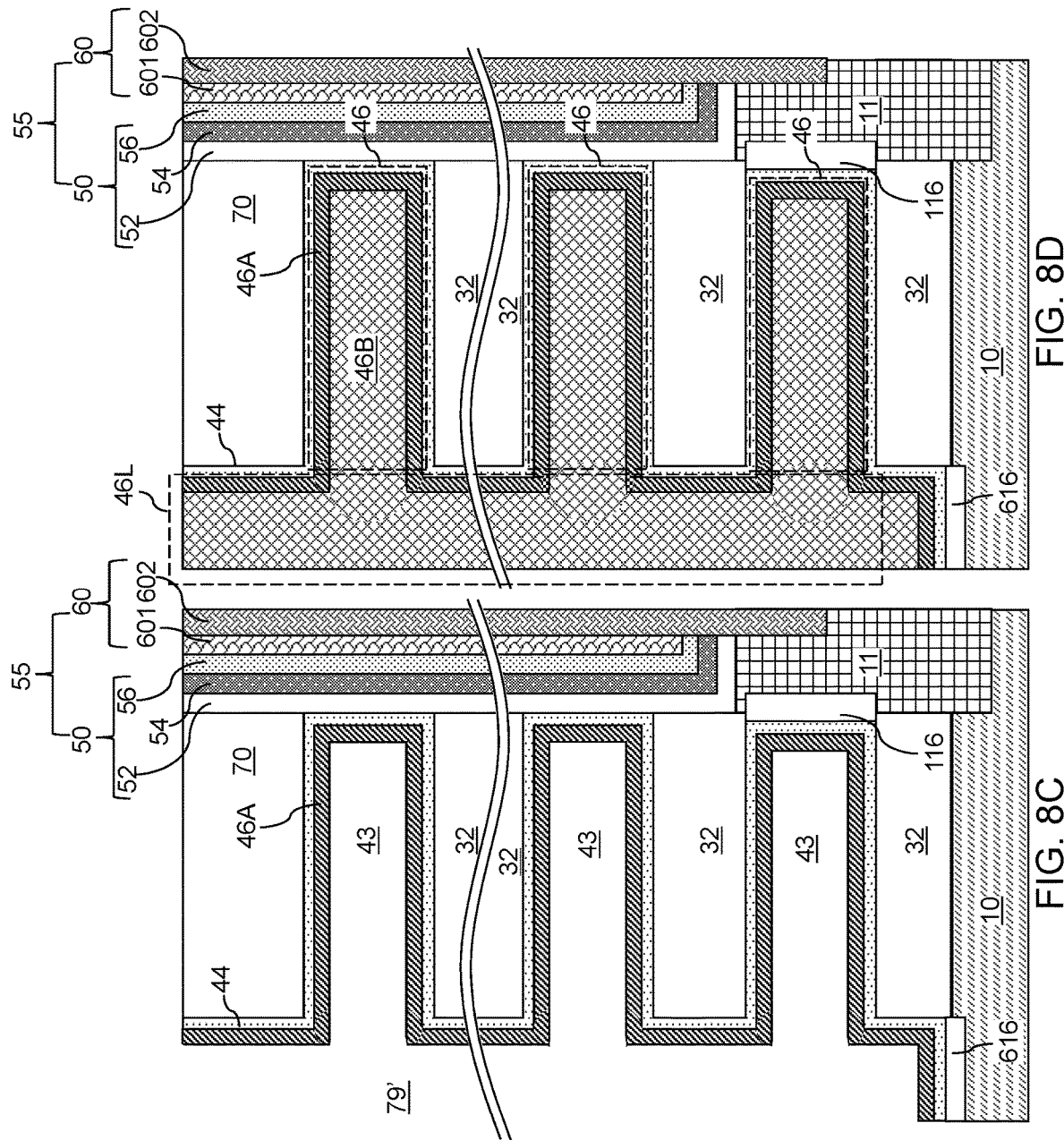

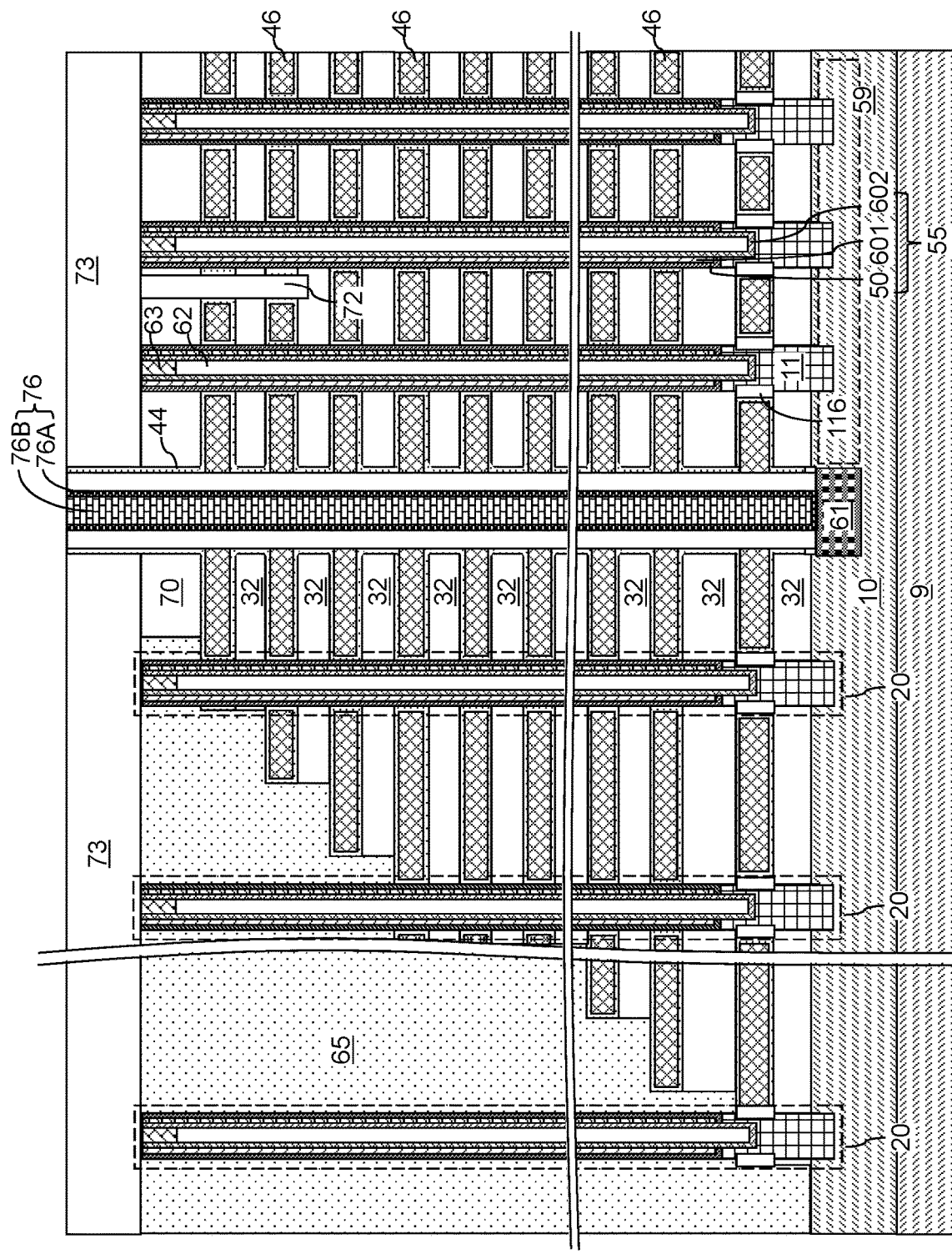

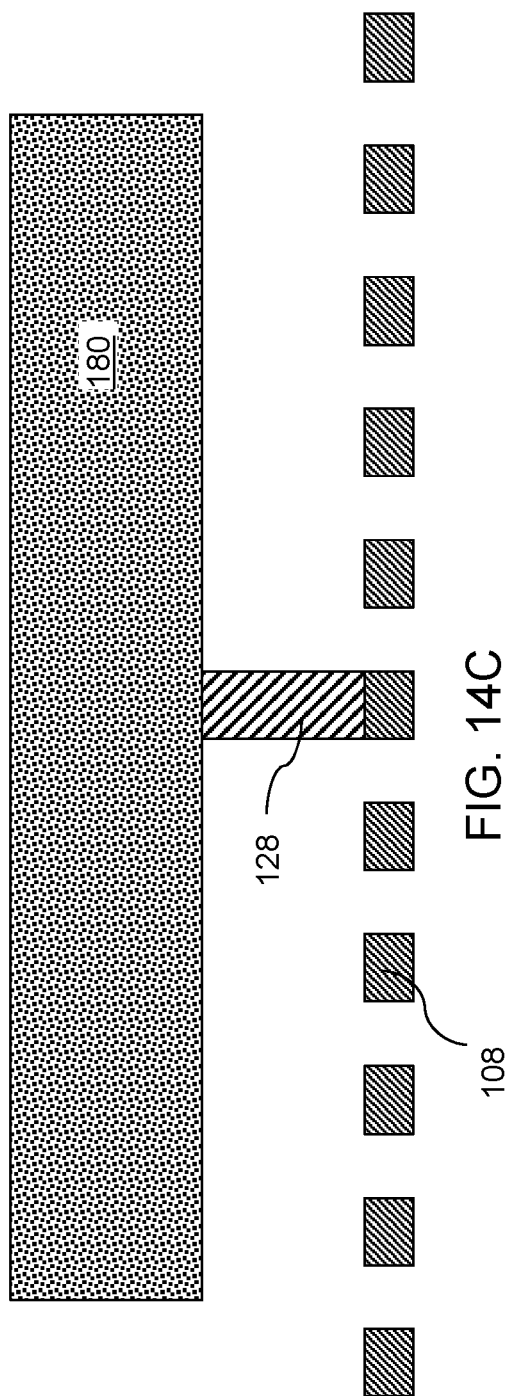
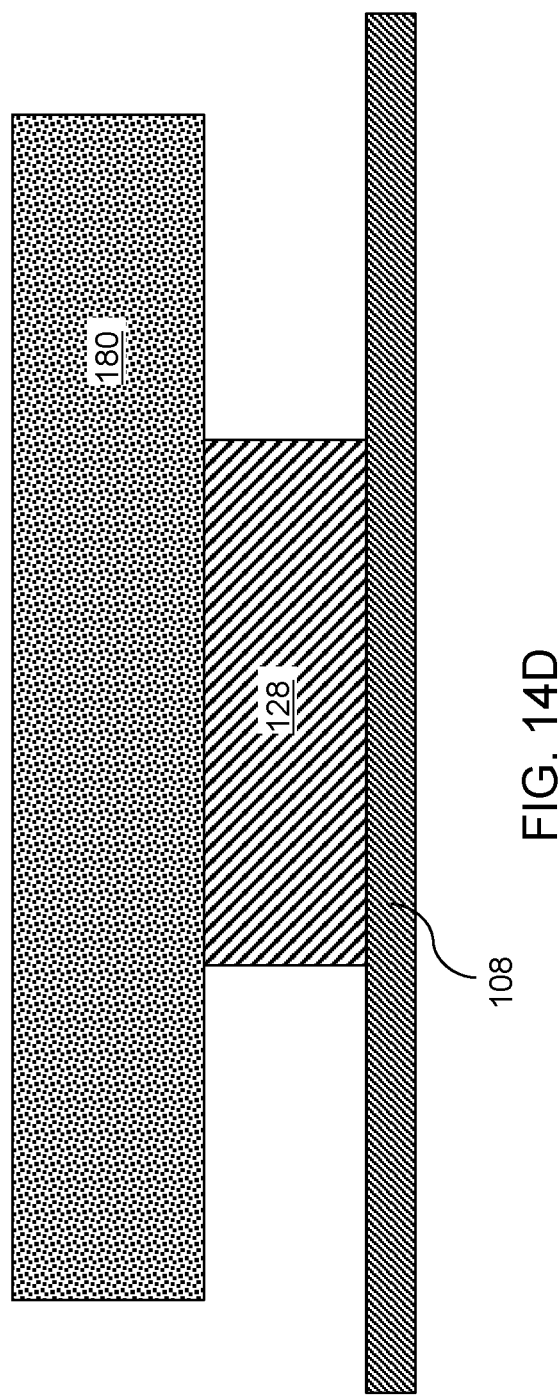

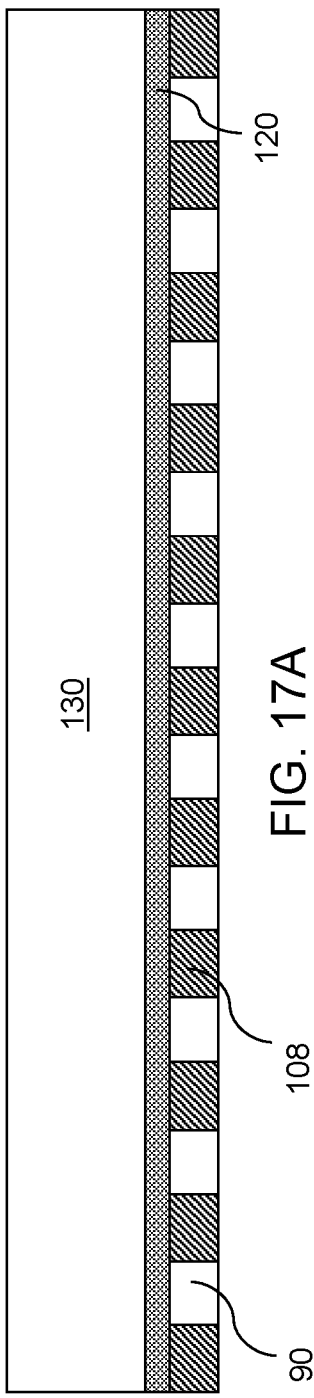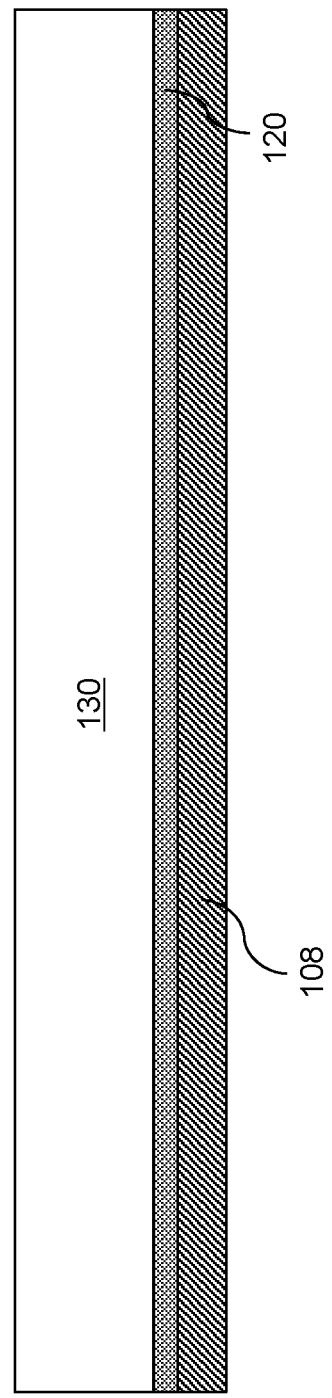

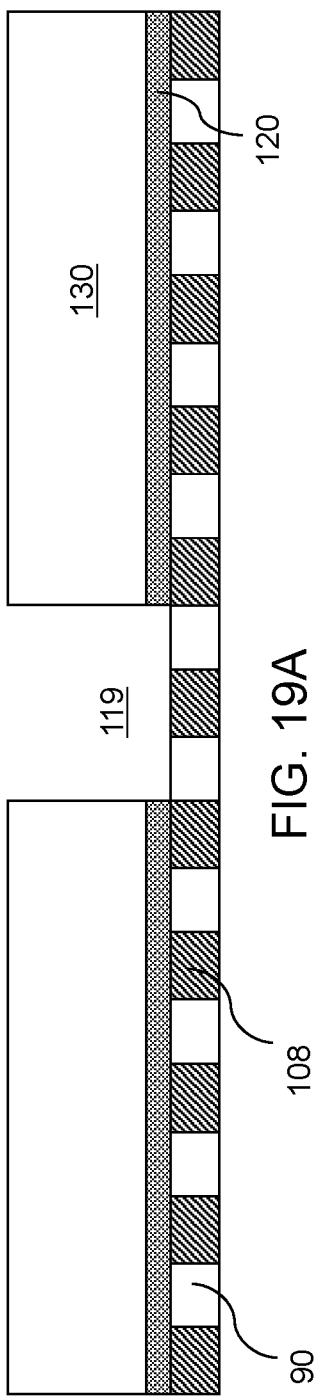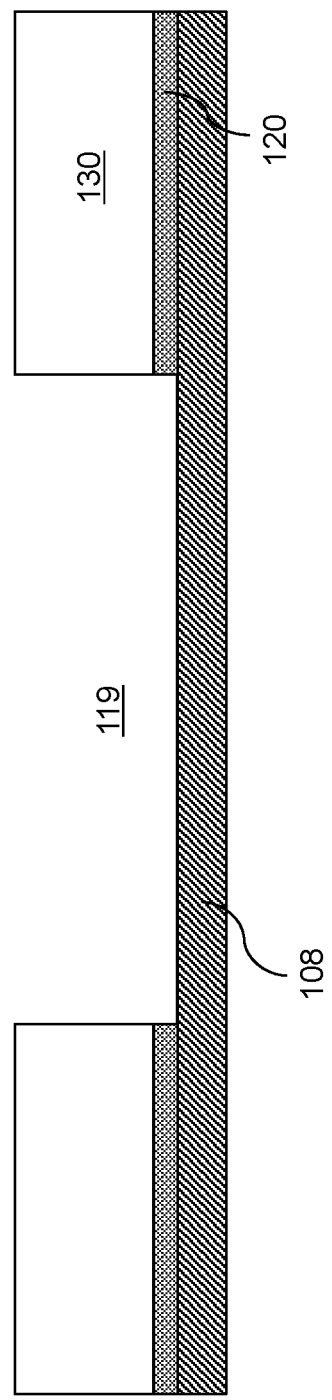

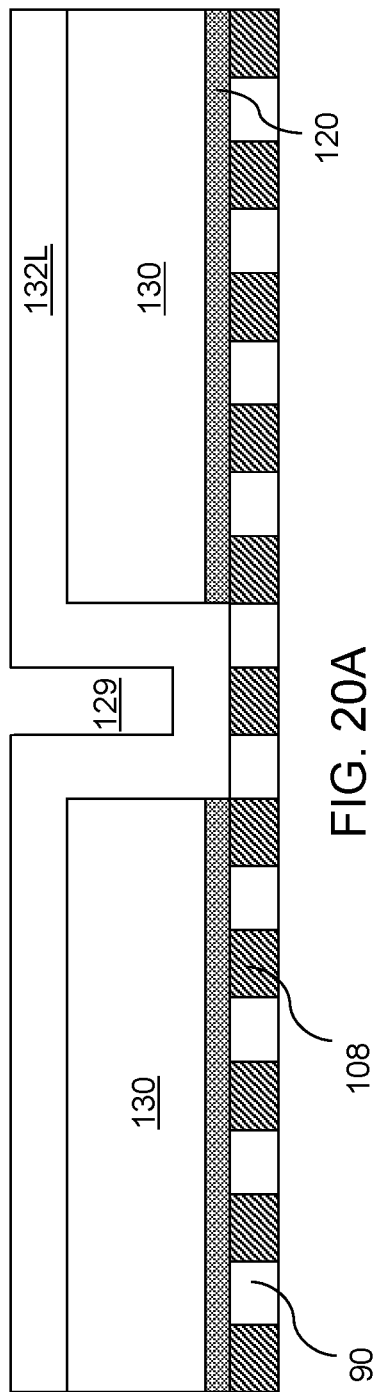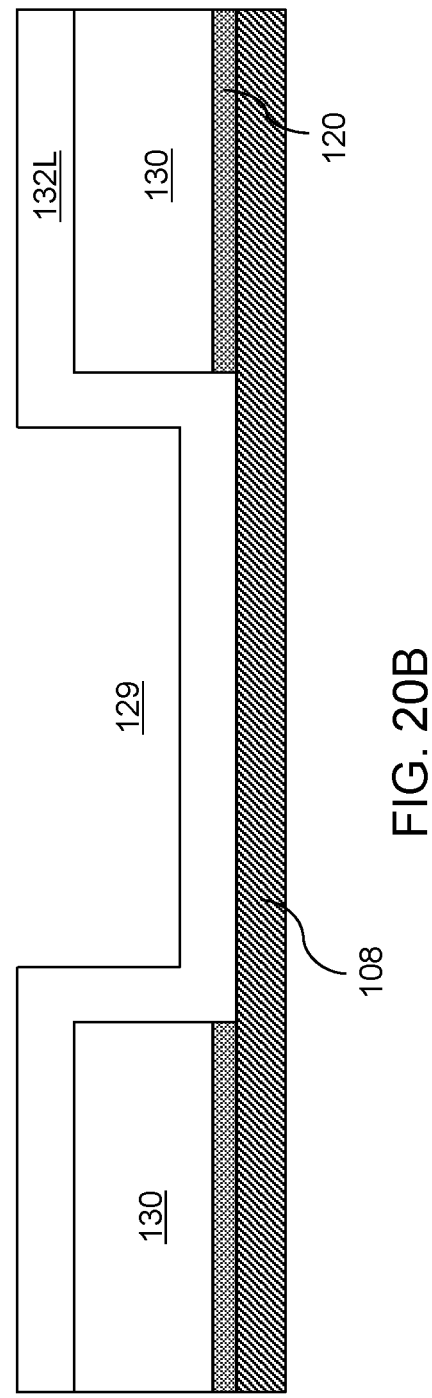

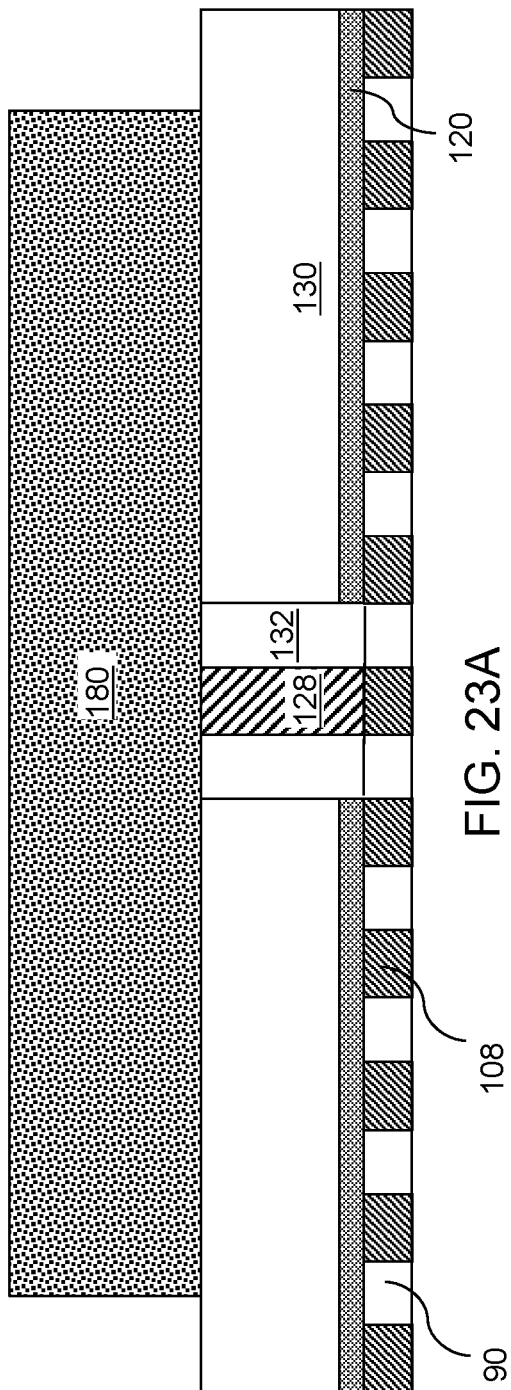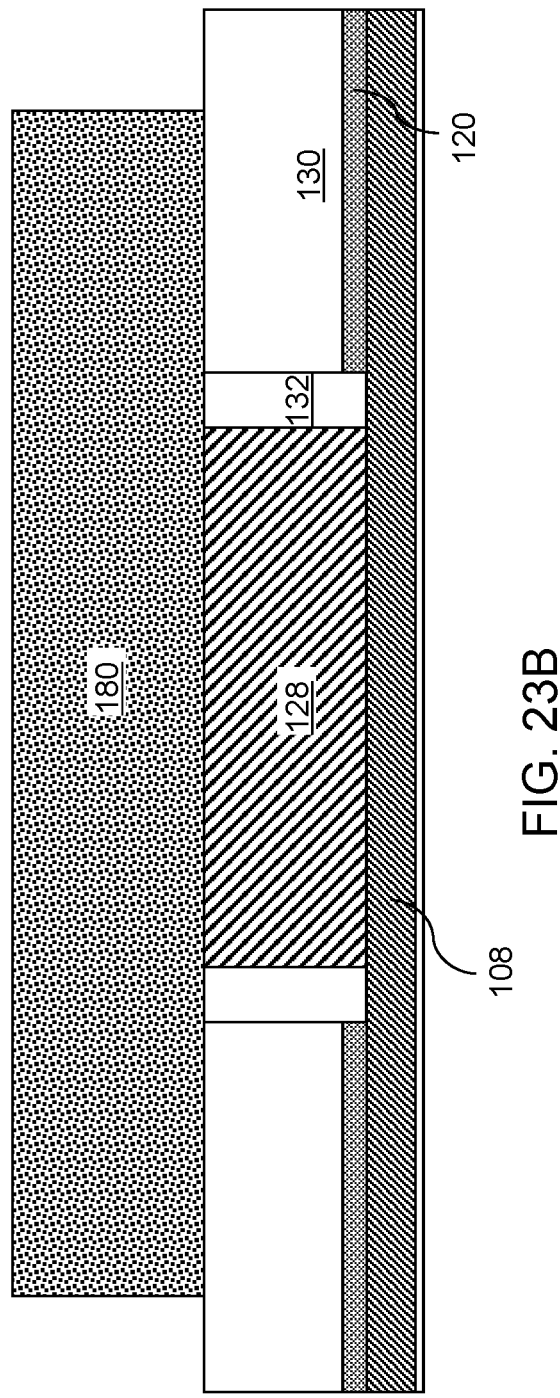

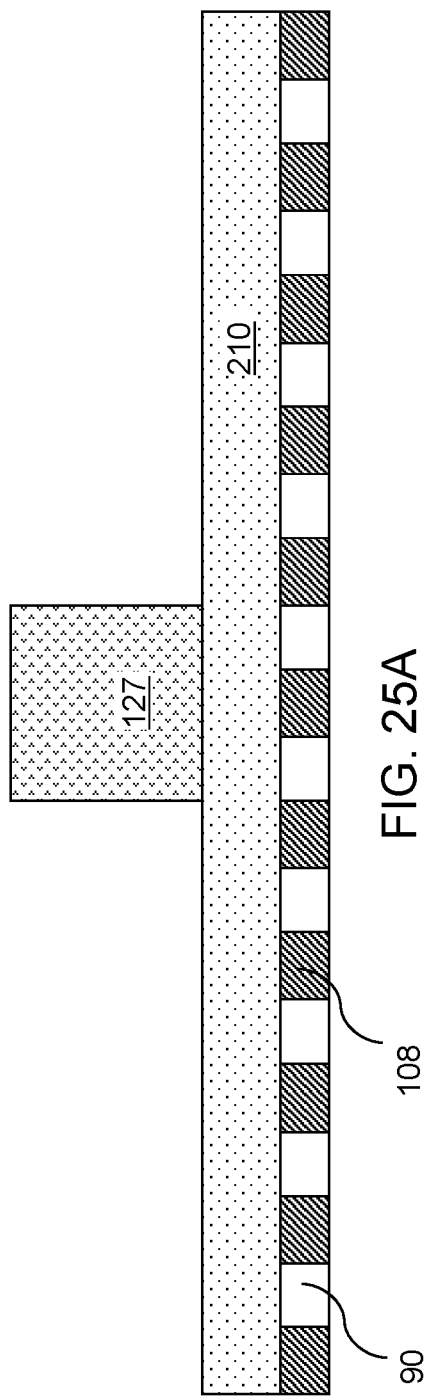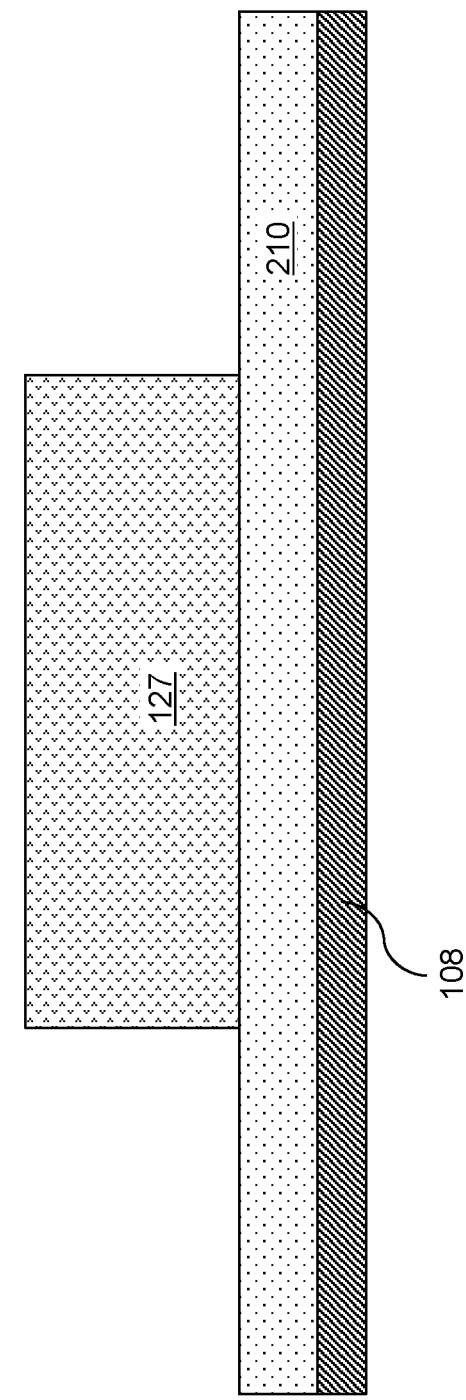

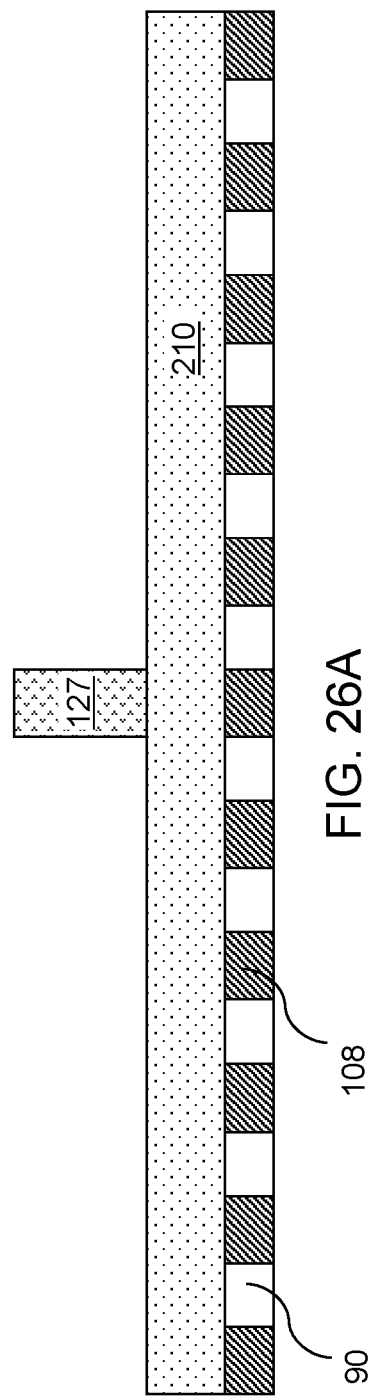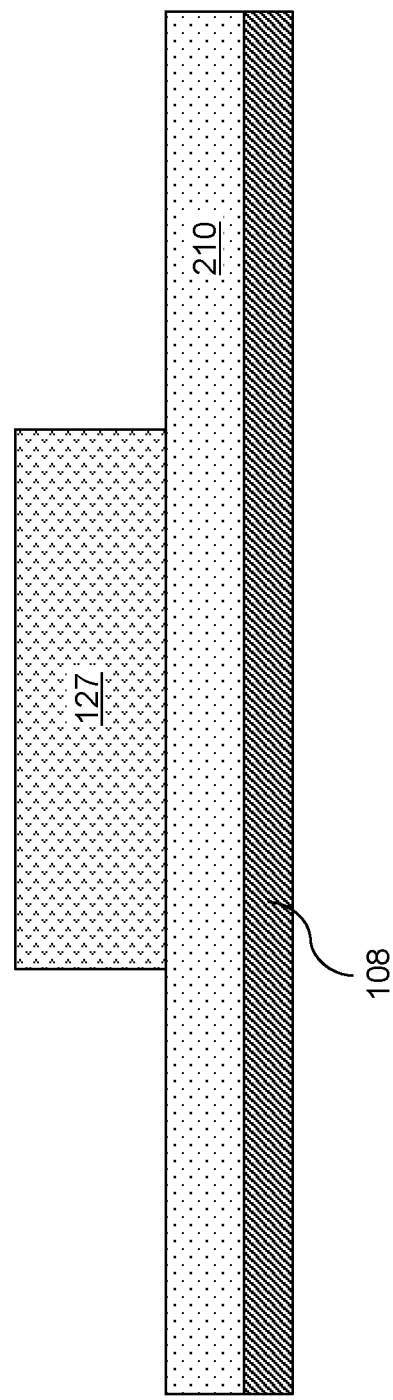

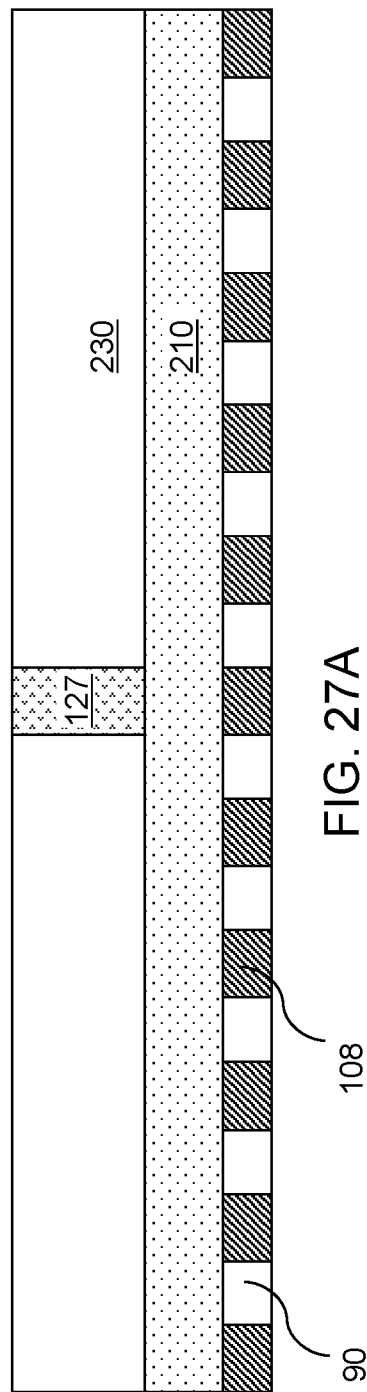
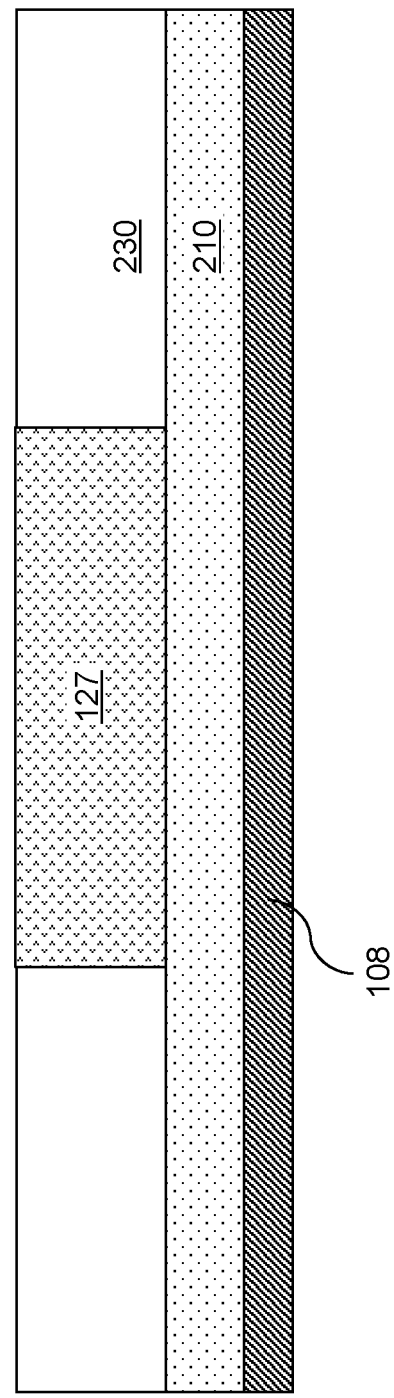

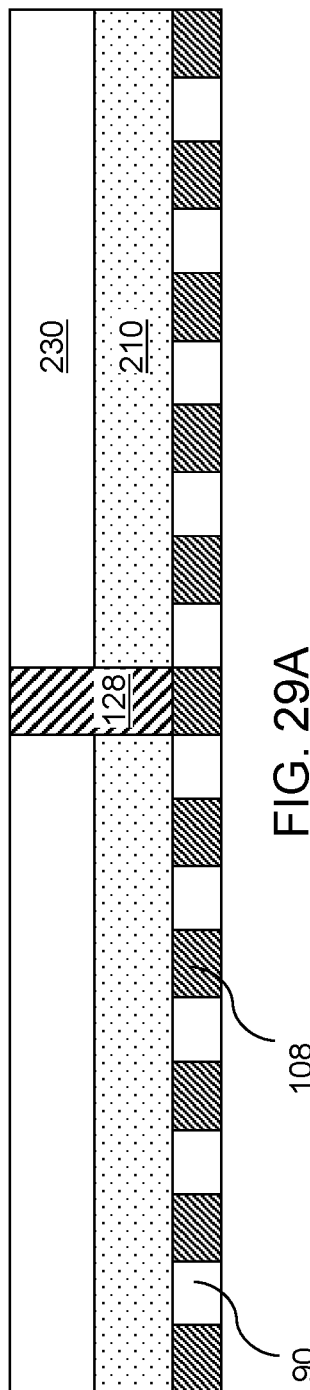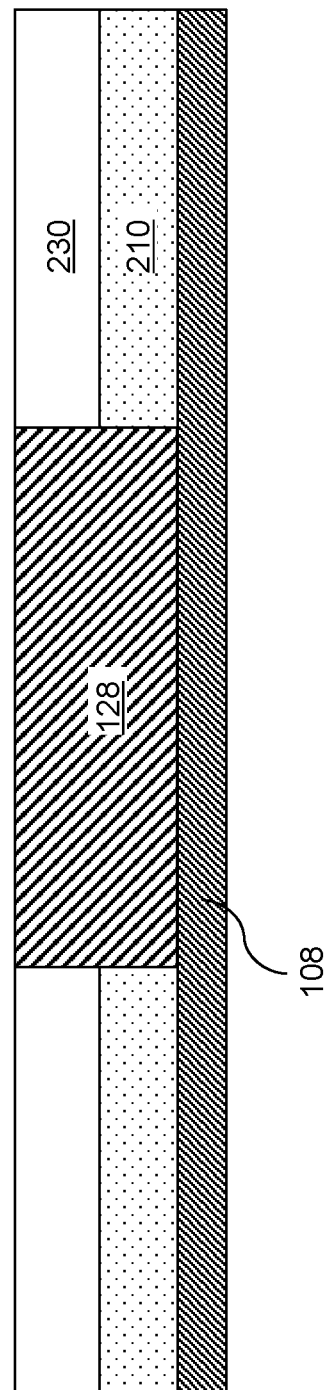

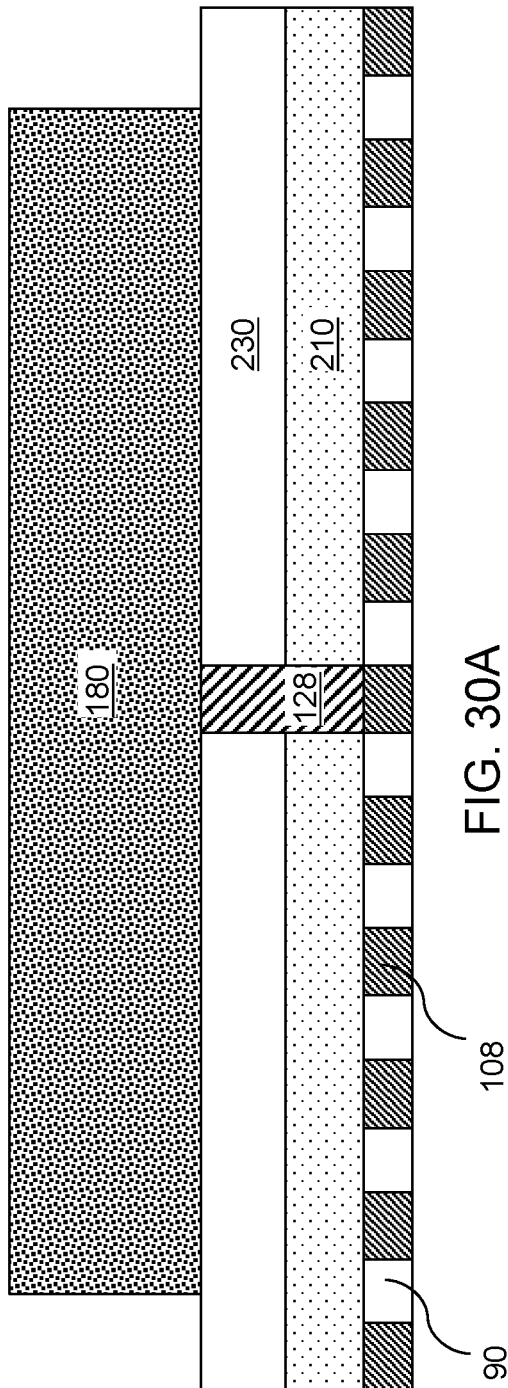
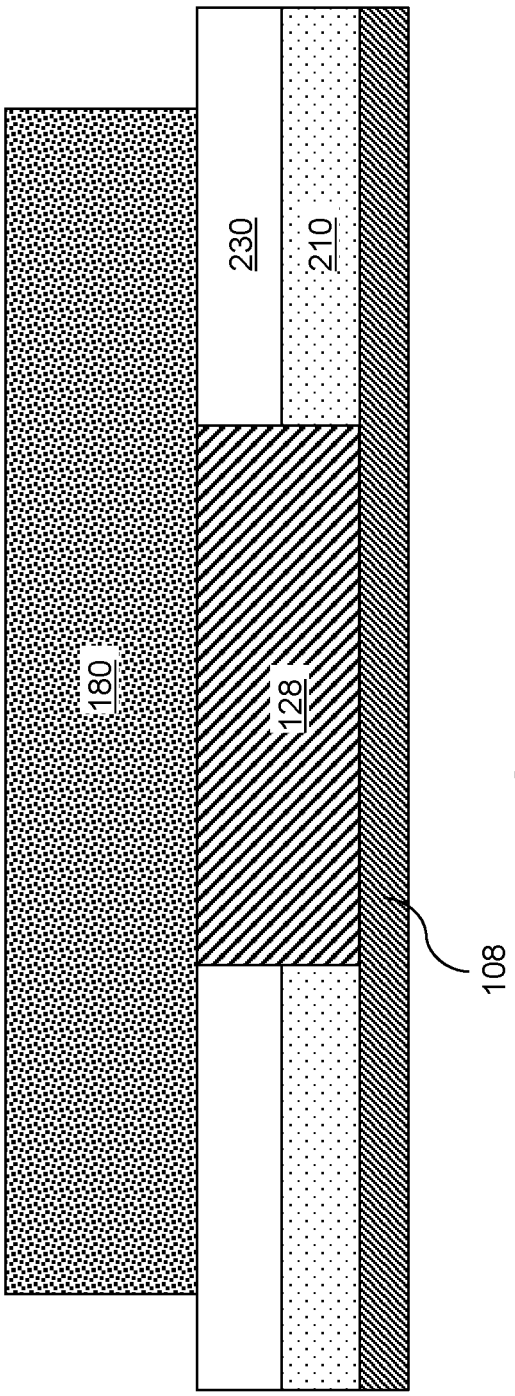

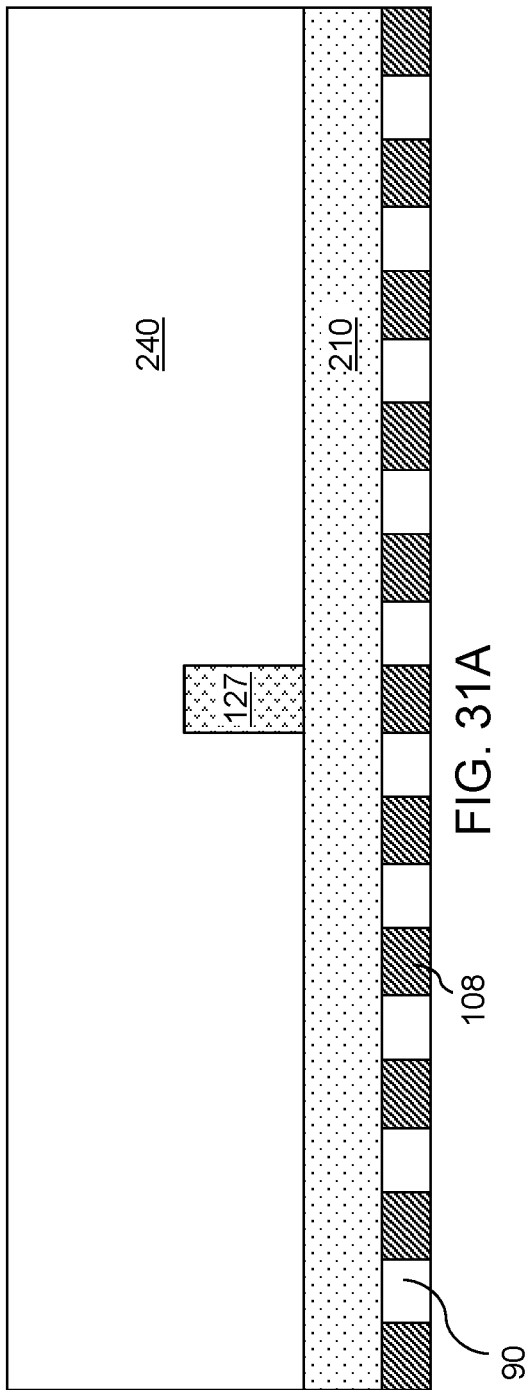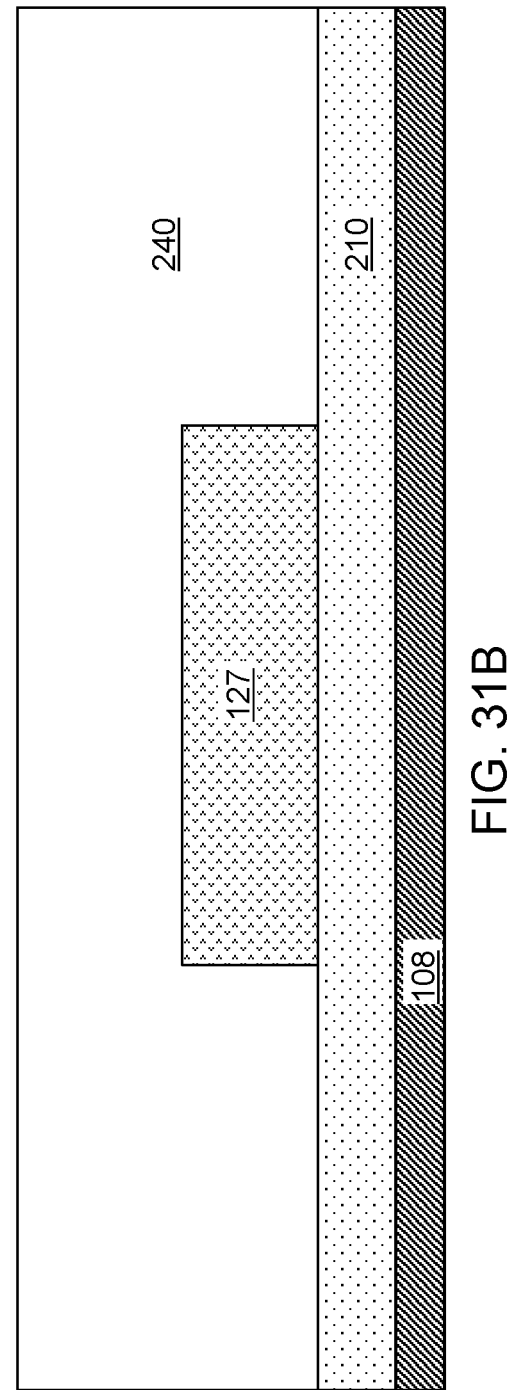

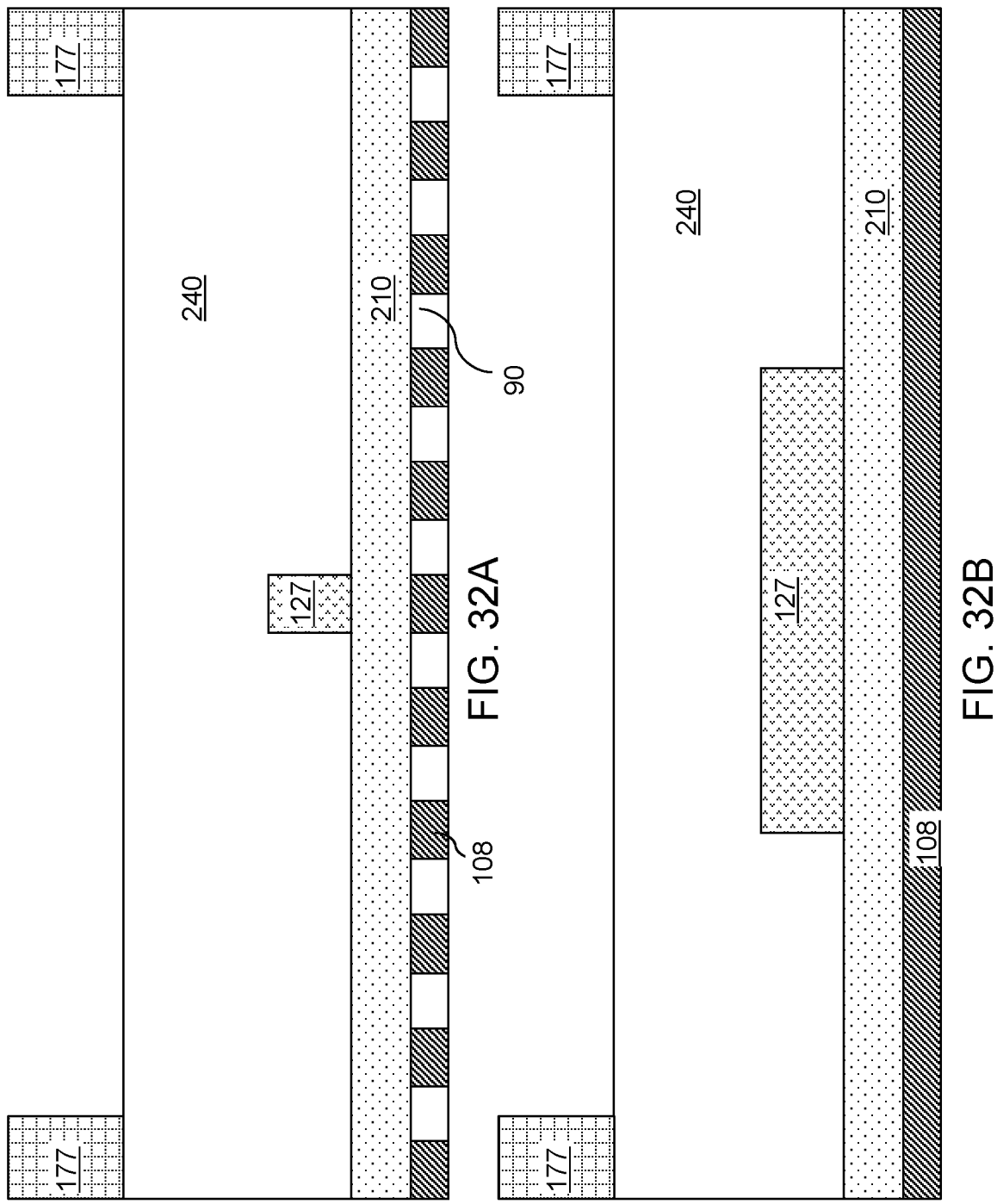

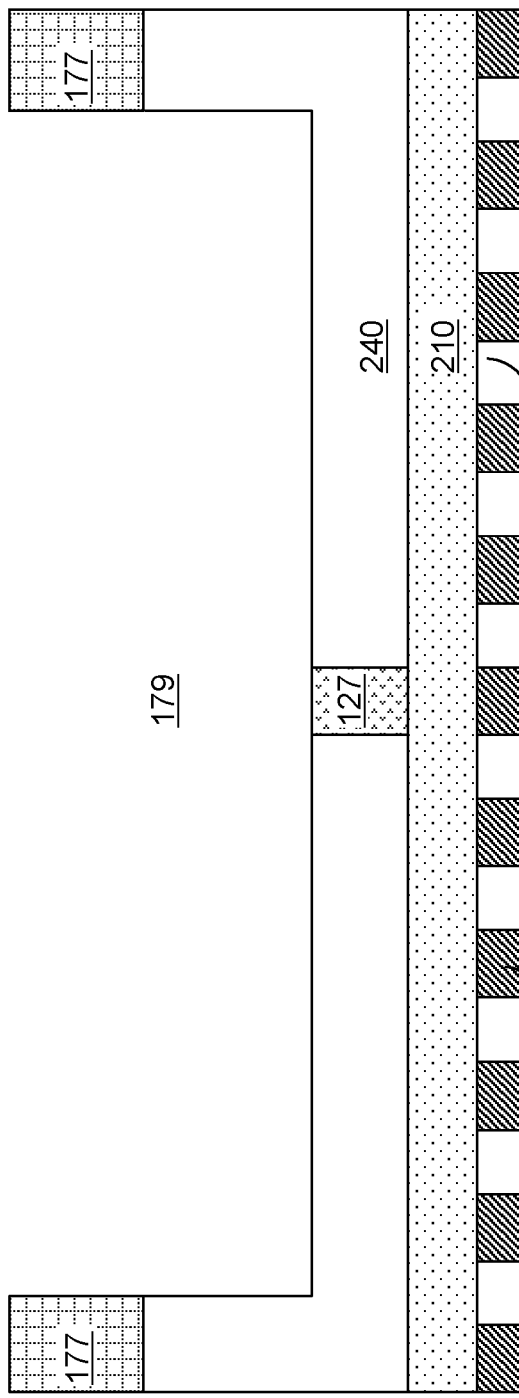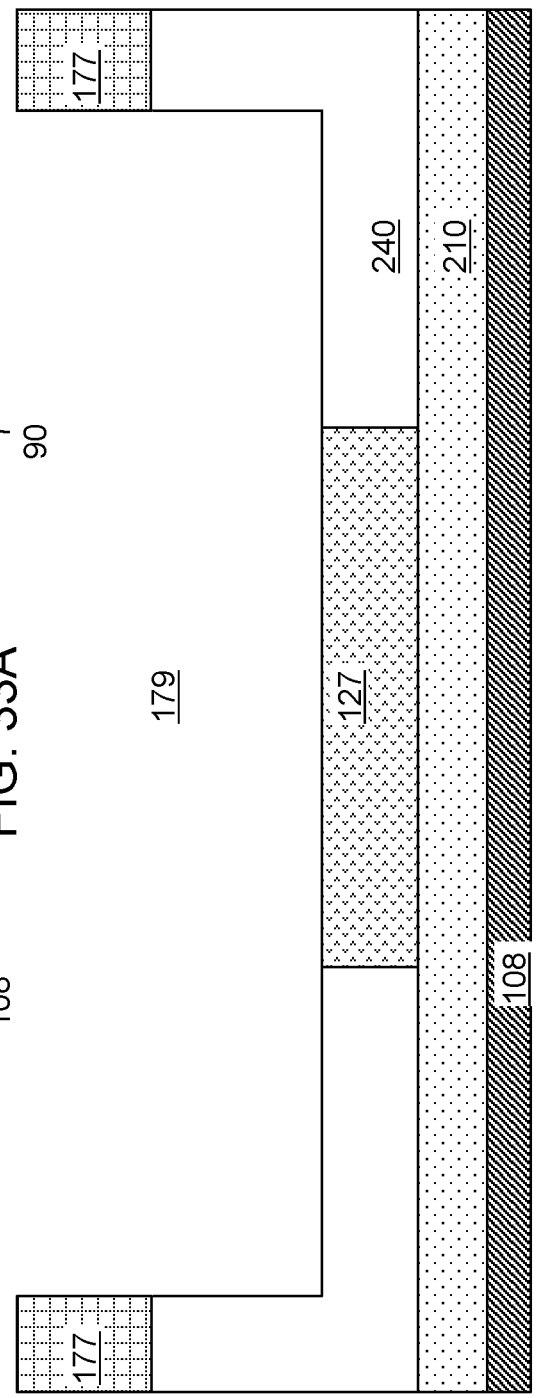

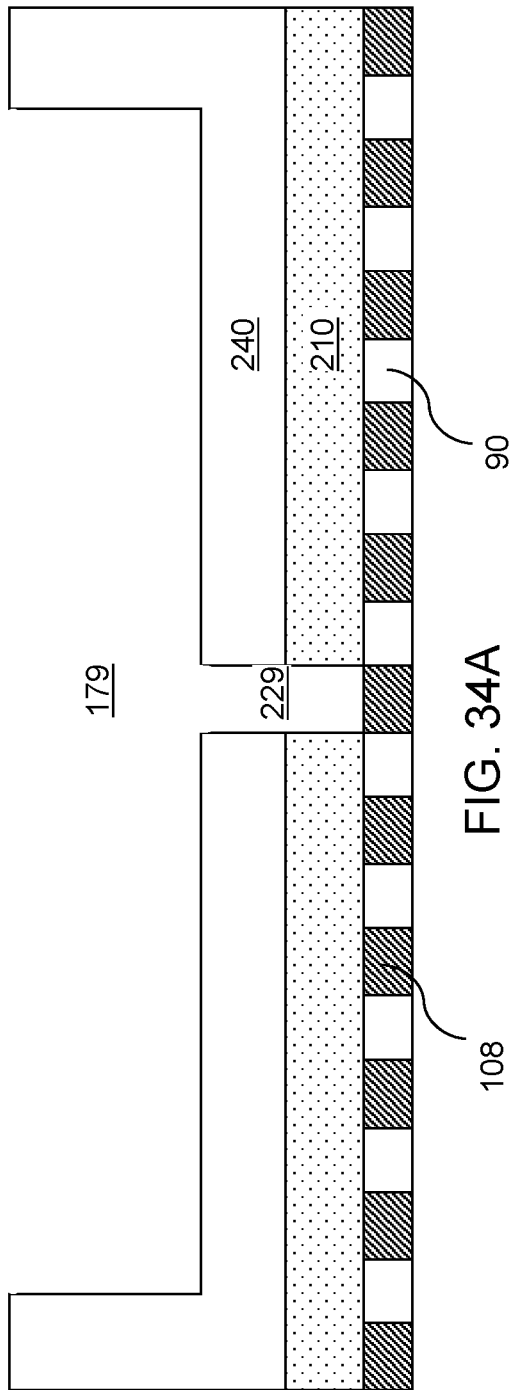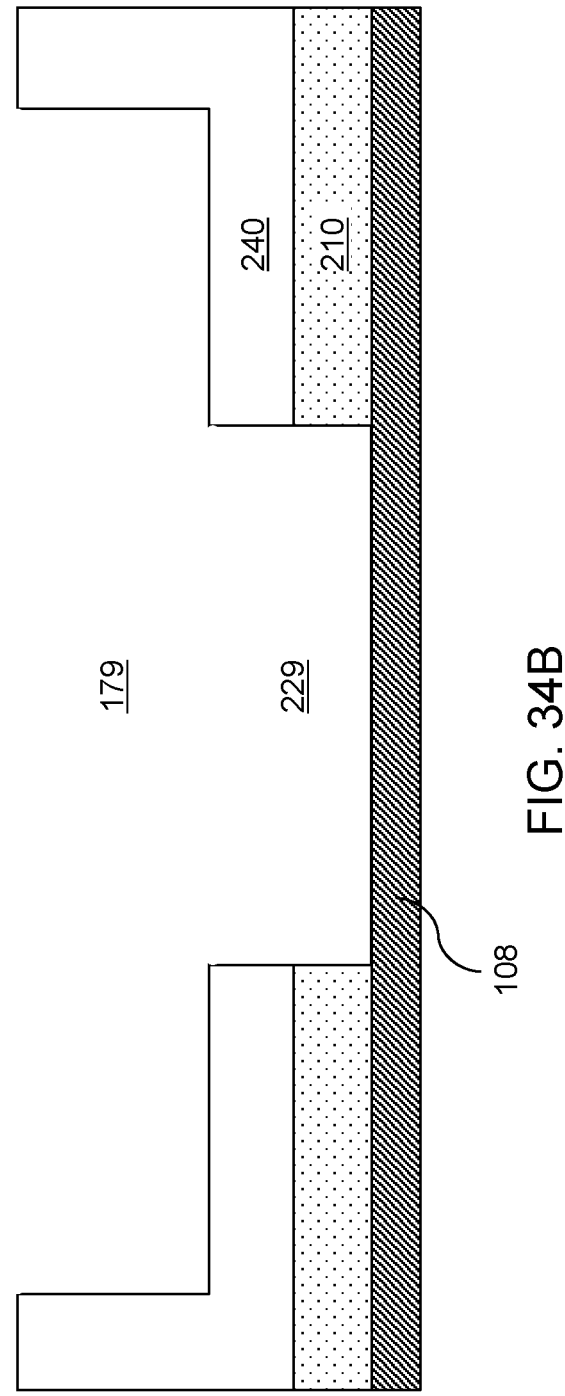

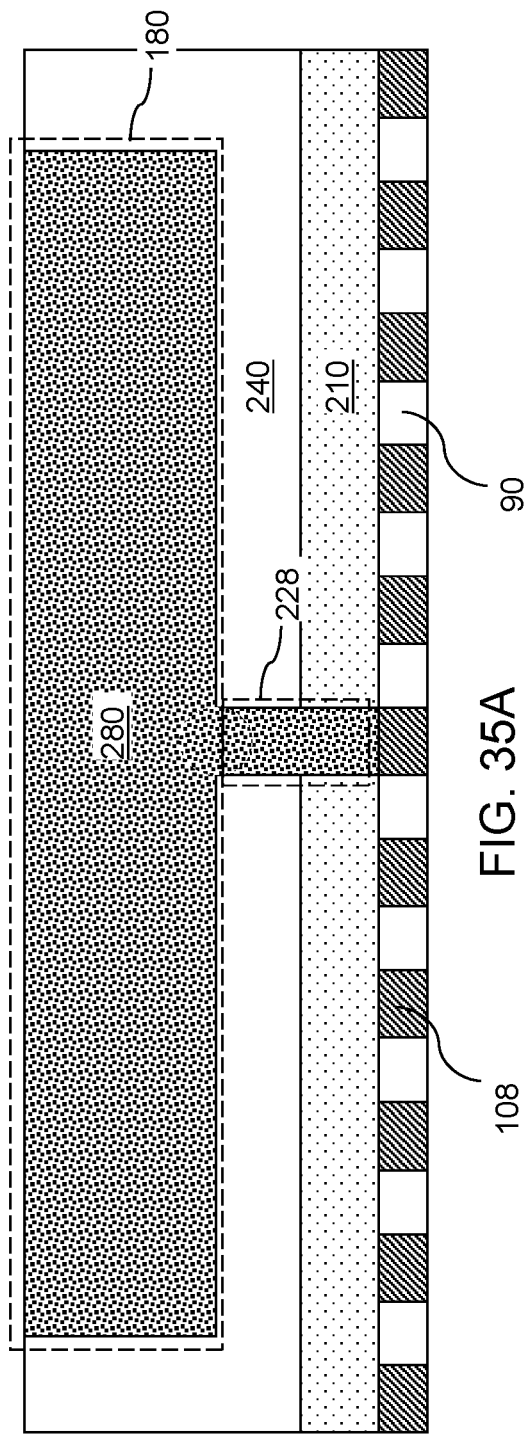
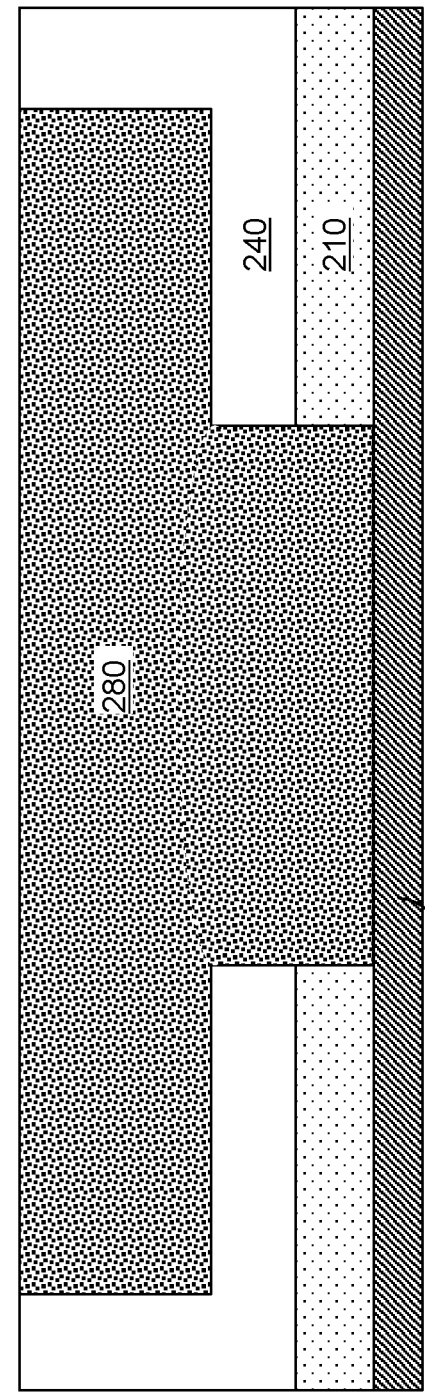
FIG. 35A
FIG. 35B

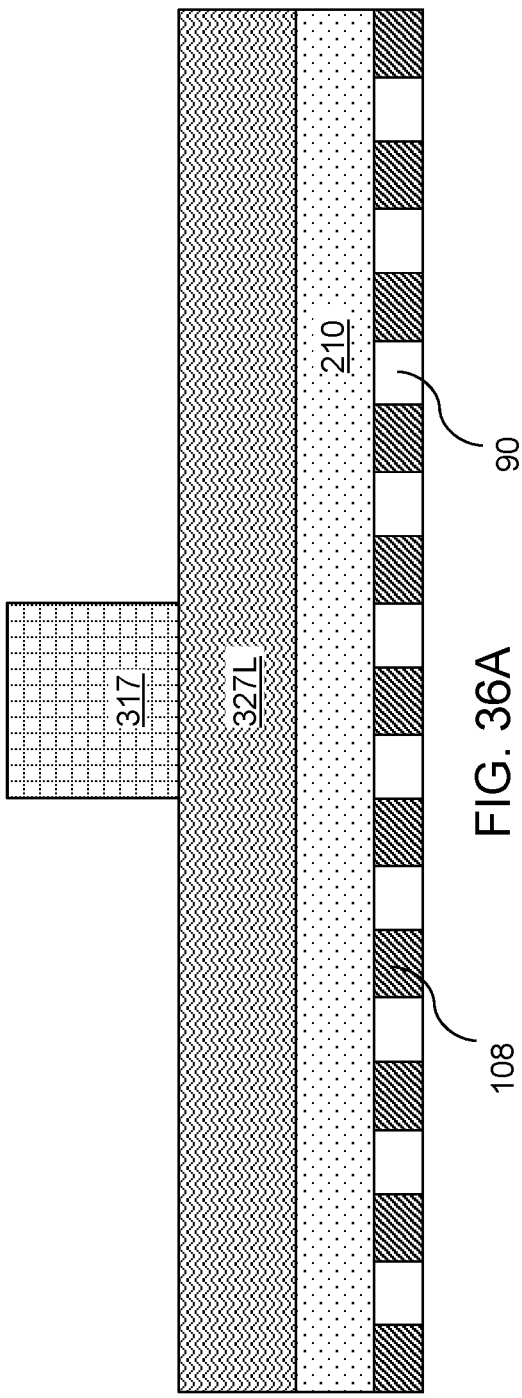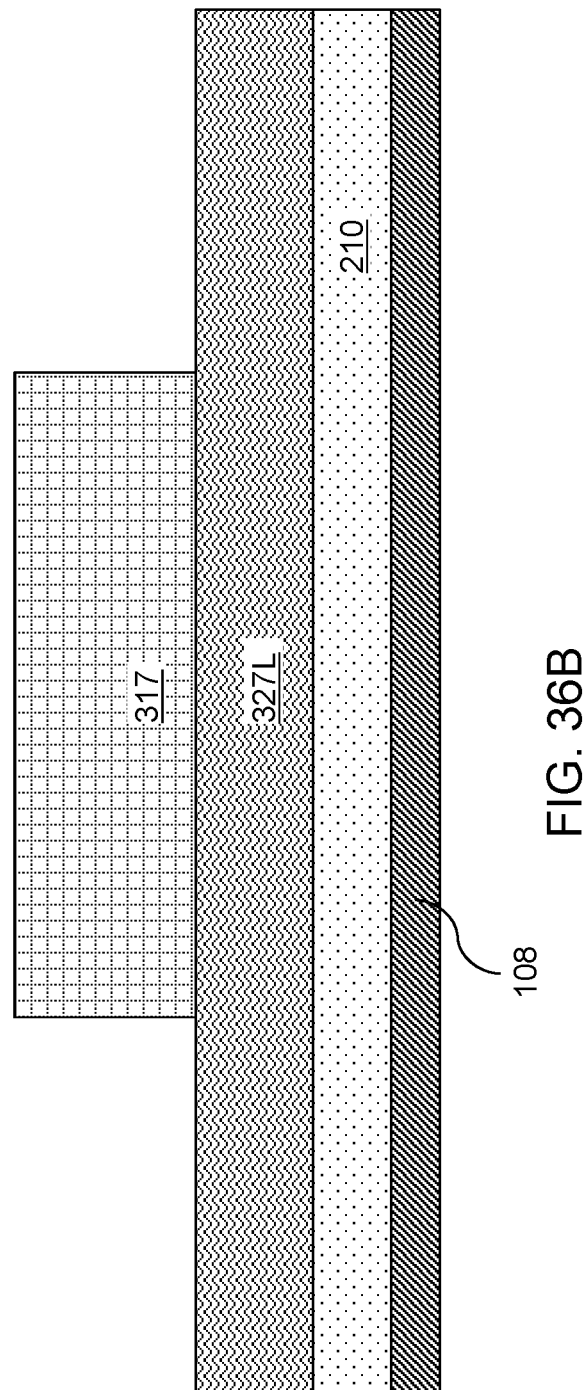

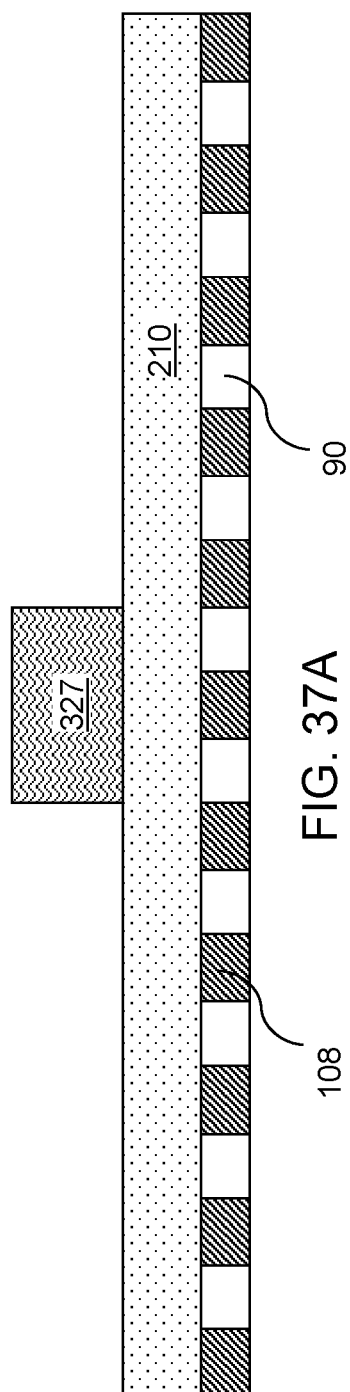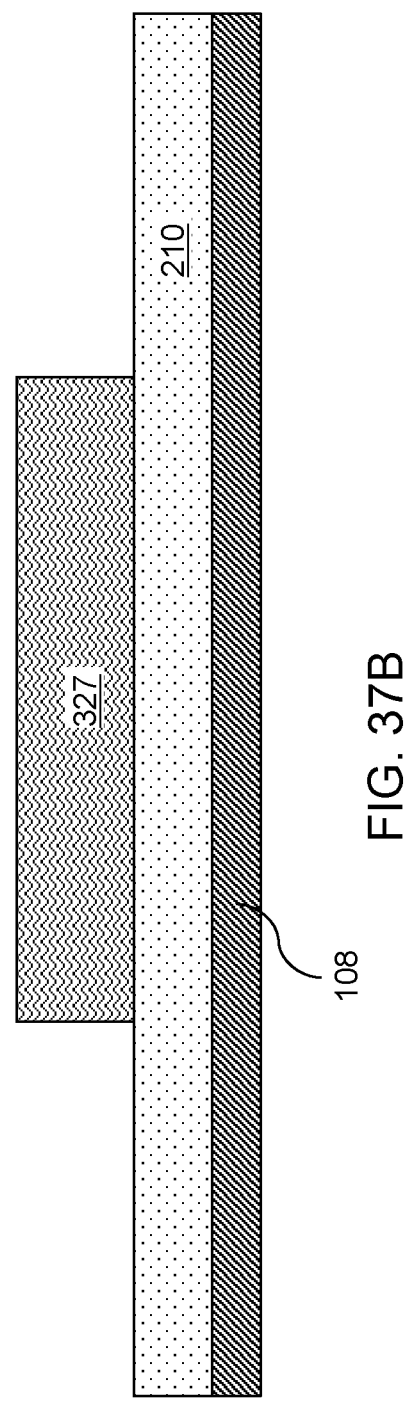

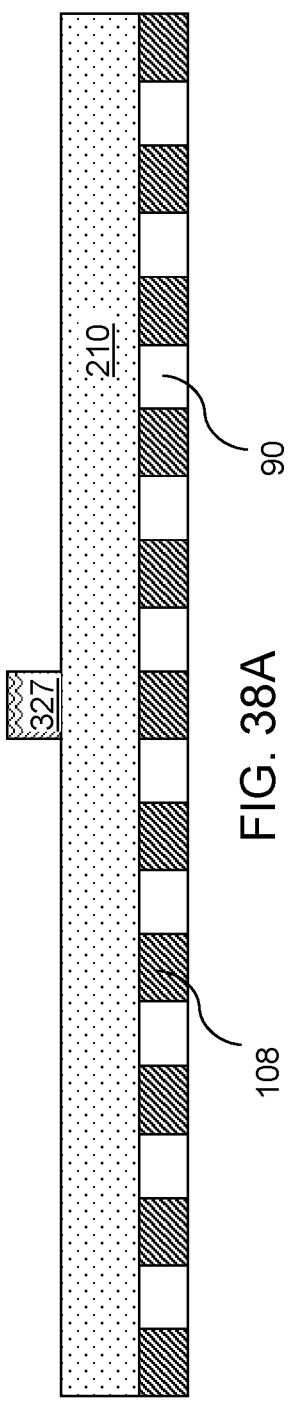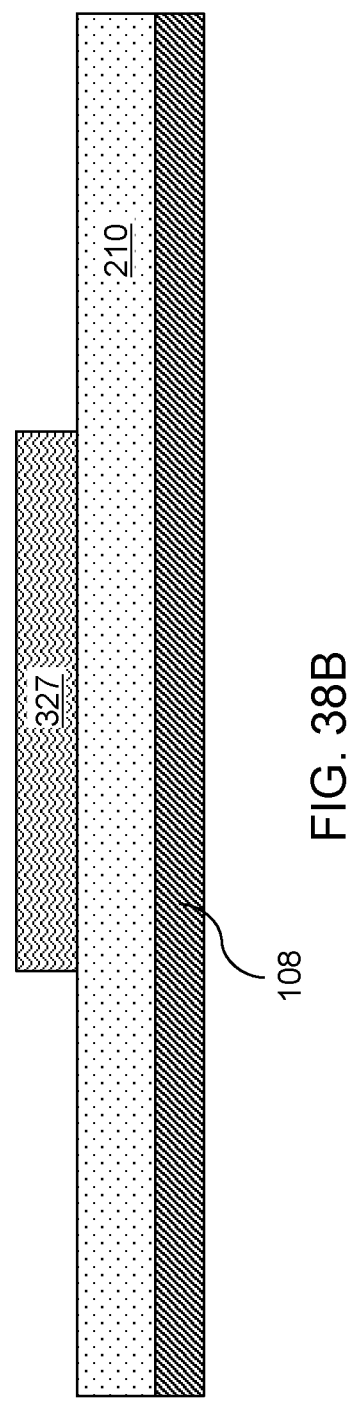

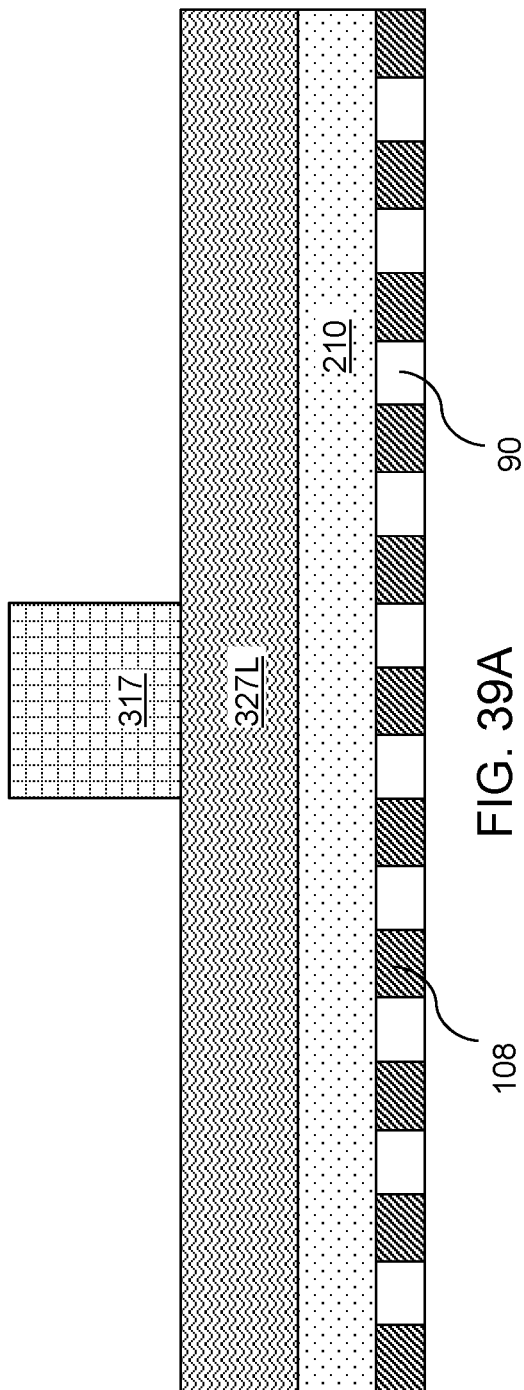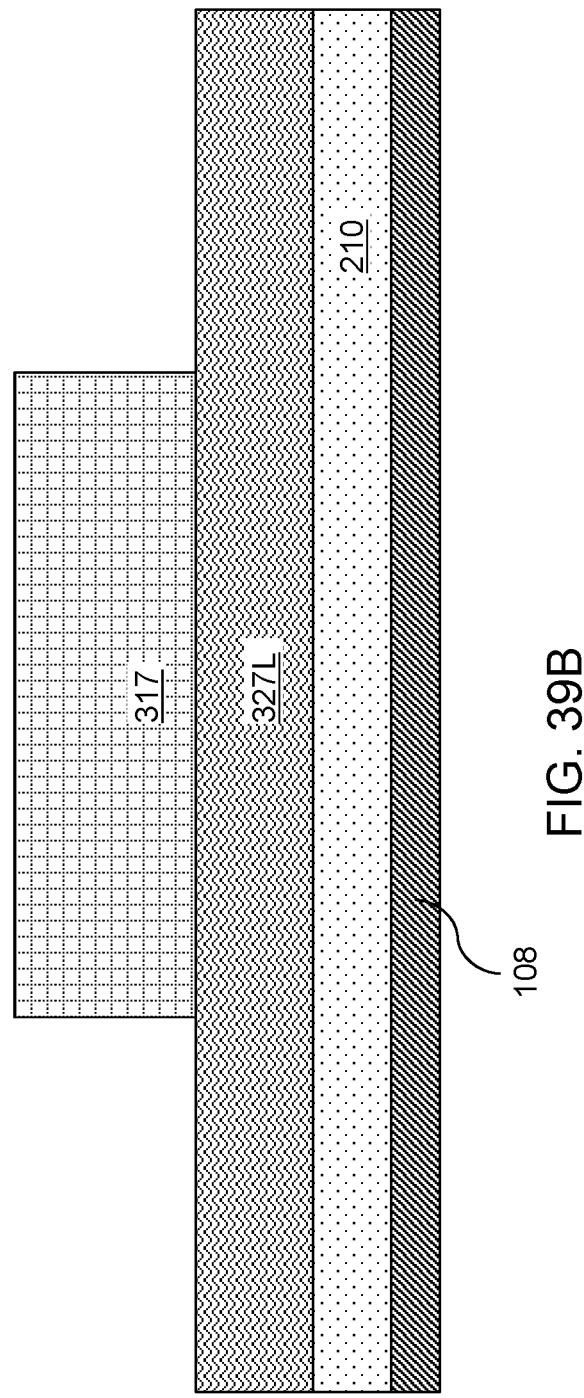

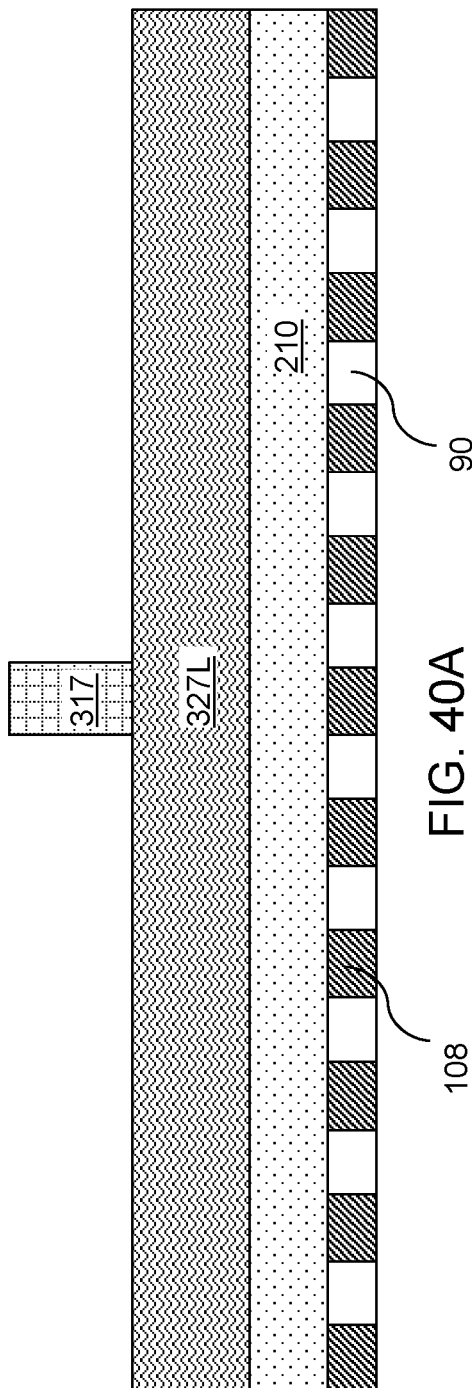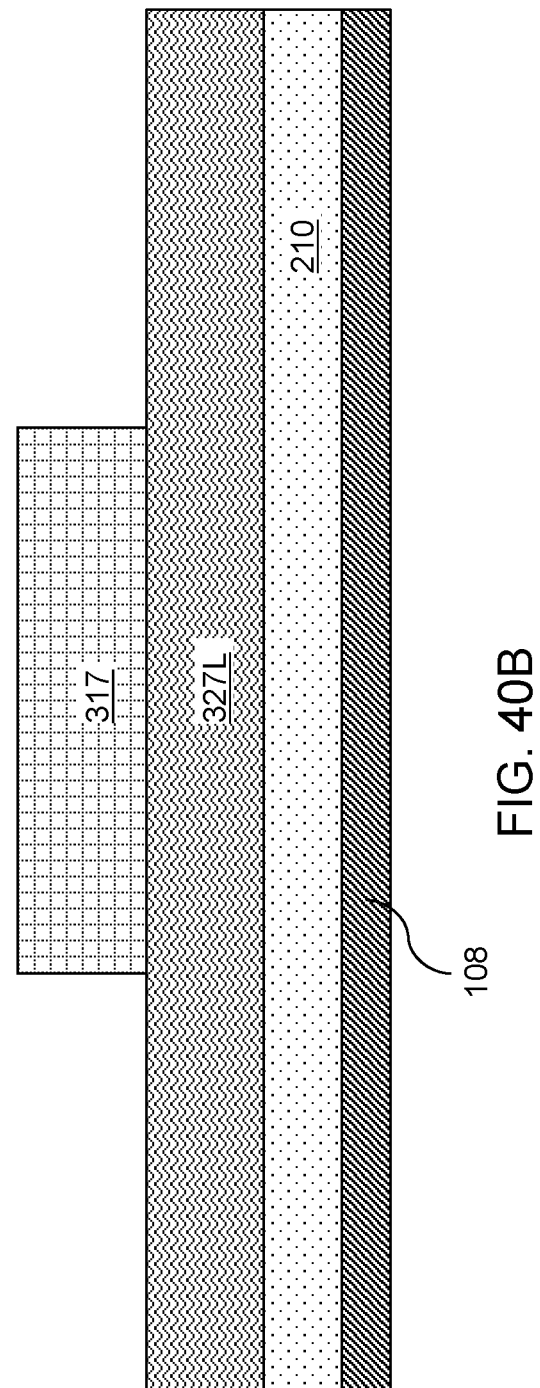
FIG. 40A
FIG. 40B

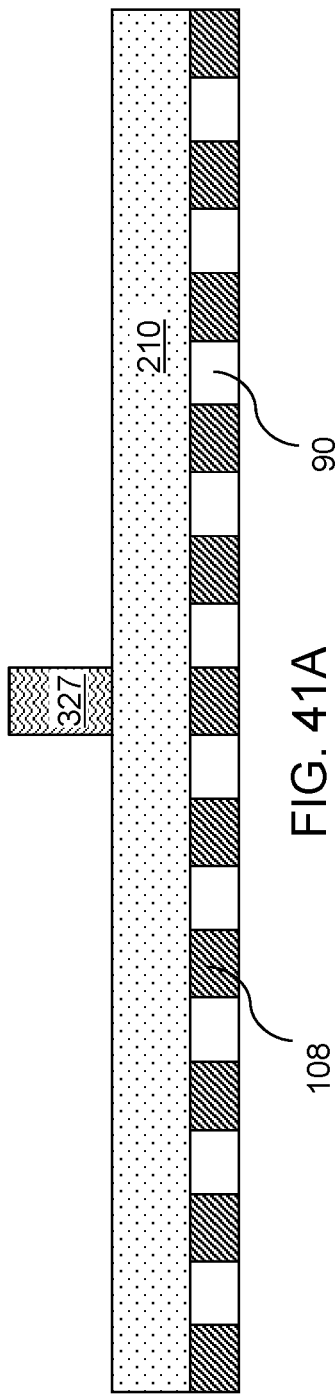
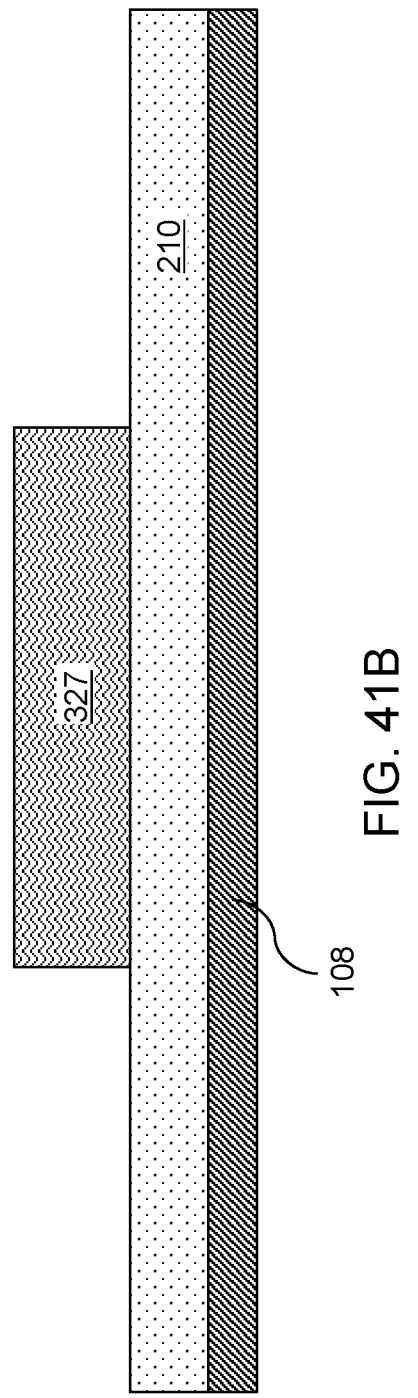

US 10,707,228 B2

THREE-DIMENSIONAL MEMORY DEVICE HAVING BONDING STRUCTURES CONNECTED TO BIT LINES AND METHODS OF MAKING THE SAME

RELATED APPLICATIONS

This application claims the benefit or priority to U.S. Provisional Application No. 62/720,327 entitled BIT LINE TO BONDING STRUCTURE CONNECTIONS FOR A THREE-DIMENSIONAL MEMORY DEVICE, filed Aug. 21, 2018, the entire contents of which are herein incorporated by reference.

FIELD

The present disclosure relates generally to the field of semiconductor devices, and particular to three-dimensional memory devices using bonding structures connected to individual bit lines and methods of manufacturing the same.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a three-dimensional memory device comprising a memory die is provided. The memory die comprises: an alternating stack of insulating layers and electrically conductive layers located over a substrate; memory stack structures extending through the alternating stack, wherein each of the memory stack structures comprises a memory film and a vertical semiconductor channel contacting an inner sidewall of the memory film; bit lines electrically connected to an end portion of a respective one of the vertical semiconductor channels; bump connection via structures contacting a top surface of a respective one of the bit lines, wherein each of the bump connection via structures has a greater lateral dimension along a lengthwise direction of the bit lines than along a widthwise direction of the bit lines; and metallic bump structures contacting a respective one of the bump connection via structures.

According to another aspect of the present disclosure, a method of forming a three-dimensional memory device is provided, which comprises: forming memory stack structures extending through an alternating stack of insulating layers and electrically conductive layers over a substrate, wherein each of the memory stack structures comprises a memory film and a vertical semiconductor channel contacting an inner sidewall of the memory film; forming bit lines that are electrically connected to an end portion of a respective one of the vertical semiconductor channels; forming bump connection via structures directly on a respective one of the bit lines, wherein each of the bump connection via structures has a greater lateral dimension along a lengthwise direction of the bit lines than along a widthwise direction of the bit lines; and forming metallic bump structures overlying a respective one of the bump connection via structures after, or concurrently with, formation of the bump connection via structures.

BRIEF DESCRIPTION OF THE DRAWINGS

FIGS. 4A-4H are sequential schematic vertical cross-sectional views of a memory opening within the exemplary structure during formation of a memory stack structure, an optional dielectric core, and a drain region therein according to an embodiment of the present disclosure.

FIGS. 8A-8D are sequential vertical cross-sectional views of a region of the exemplary structure during formation of electrically conductive layers according to an embodiment of the present disclosure.

FIG. 11A is a schematic vertical cross-sectional view of the exemplary structure after formation of an insulating spacer and a backside contact structure according to an embodiment of the present disclosure.

FIG. 14C is a vertical cross-sectional view of the exemplary structure along the vertical plane C-C' of FIG. 14B. Dielectric material layers are omitted for clarity.

FIG. 14D is a vertical cross-sectional view of the exemplary structure along the vertical plane D-D' of FIG. 14B. Dielectric material layers are omitted for clarity.

FIGS. 17A and 17B are vertical cross-sectional views of a first exemplary configuration of a region of the exemplary structure corresponding to the region R in FIG. 14B along vertical planes that correspond to the vertical planes C-C' and D-D' of FIG. 14B, respectively, after formation of a planar dielectric spacer layer and a bump-connection-level dielectric layer according to an embodiment of the present disclosure.

FIGS. 19A and 19B are vertical cross-sectional views of the first exemplary configuration of the region of the exemplary structure corresponding to the region R in FIG. 14B along vertical planes that correspond to the vertical planes C-C' and D-D' of FIG. 14B, respectively, after formation of elongated openings through the bump-connection-level dielectric layer and the planar dielectric spacer layer according to an embodiment of the present disclosure.

FIGS. 20A and 20B are vertical cross-sectional views of the first exemplary configuration of the region of the exemplary structure corresponding to the region R in FIG. 14B along vertical planes that correspond to the vertical planes C-C' and D-D' of FIG. 14B, respectively, after formation of a conformal dielectric spacer layer according to an embodiment of the present disclosure.

FIGS. 23A and 23B are vertical cross-sectional views of the first exemplary configuration of the region of the exemplary structure corresponding to the region R in FIG. 14B along vertical planes that correspond to the vertical planes C-C' and D-D' of FIG. 14B, respectively, after formation of metallic bump structures according to an embodiment of the present disclosure.

FIGS. 25A and 25B are vertical cross-sectional views of the second exemplary configuration of the region of the exemplary structure corresponding to the region R in FIG. 14B along vertical planes that correspond to the vertical planes C-C' and D-D' of FIG. 14B, respectively, after application and patterning a photoresist layer according to an embodiment of the present disclosure.

FIGS. 26A and 26B are vertical cross-sectional views of the second exemplary configuration of the region of the exemplary structure corresponding to the region R in FIG. 14B along vertical planes that correspond to the vertical planes C-C' and D-D' of FIG. 14B, respectively, after isotropically trimming the sacrificial matrix material portions to provide sacrificial matrix material portions according to an embodiment of the present disclosure.

FIGS. 27A and 27B are vertical cross-sectional views of the second exemplary configuration of the region of the exemplary structure corresponding to the region R in FIG. 14B along vertical planes that correspond to the vertical planes C-C' and D-D' of FIG. 14B, respectively, after formation of a bump-connection-level dielectric layer according to an embodiment of the present disclosure.

FIGS. 29A and 29B are vertical cross-sectional views of the second exemplary configuration of the region of the exemplary structure corresponding to the region R in FIG. 14B along vertical planes that correspond to the vertical planes C-C' and D-D' of FIG. 14B, respectively, after formation of bump connection via structures according to an embodiment of the present disclosure.

FIGS. 30A and 30B are vertical cross-sectional views of the second exemplary configuration of the region of the exemplary structure corresponding to the region R in FIG. 14B along vertical planes that correspond to the vertical planes C-C' and D-D' of FIG. 14B, respectively, after formation of metallic bump structures according to an embodiment of the present disclosure.

FIGS. 31A and 31B are vertical cross-sectional views of a third exemplary configuration of the region of the exemplary structure corresponding to the region R in FIG. 14B along vertical planes that correspond to the vertical planes C-C' and D-D' of FIG. 14B, respectively, after formation of a bump-connection-level dielectric layer according to an embodiment of the present disclosure.

FIGS. 32A and 32B are vertical cross-sectional views of the third exemplary configuration of the region of the exemplary structure corresponding to the region R in FIG. 14B along vertical planes that correspond to the vertical planes C-C' and D-D' of FIG. 14B, respectively, after application and patterning another photoresist layer according to an embodiment of the present disclosure.

FIGS. 33A and 33B are vertical cross-sectional views of the third exemplary configuration of the region of the exemplary structure corresponding to the region R in FIG. 14B along vertical planes that correspond to the vertical planes C-C' and D-D' of FIG. 14B, respectively, after formation of bump-region recesses according to an embodiment of the present disclosure.

FIGS. 34A and 34B are vertical cross-sectional views of the third exemplary configuration of the region of the exemplary structure corresponding to the region R in FIG. 14B along vertical planes that correspond to the vertical planes C-C' and D-D' of FIG. 14B, respectively, after formation of elongated cavities through the bump-connection-level dielectric layer and the planar dielectric spacer layer according to an embodiment of the present disclosure.

FIGS. 35A and 35B are vertical cross-sectional views of the third exemplary configuration of the region of the exemplary structure corresponding to the region R in FIG. 14B along vertical planes that correspond to the vertical planes C-C' and D-D' of FIG. 14B, respectively, after formation of integrated plate and via structures that include a respective combination of a bump connection via structure and a metallic bump structure according to an embodiment of the present disclosure.

FIGS. 36A and 36B are vertical cross-sectional views of a fourth exemplary configuration of the region of the exemplary structure corresponding to the region R in FIG. 14B along vertical planes that correspond to the vertical planes C-C' and D-D' of FIG. 14B, respectively, after formation of a planar dielectric spacer layer, a sacrificial matrix material layer, and a patterned photoresist layer according to an embodiment of the present disclosure.

FIGS. 37A and 37B are vertical cross-sectional views of the fourth exemplary configuration of the region of the exemplary structure corresponding to the region R in FIG. 14B along vertical planes that correspond to the vertical planes C-C' and D-D' of FIG. 14B, respectively, after formation of sacrificial matrix material portions according to an embodiment of the present disclosure.

FIGS. 38A and 38B are vertical cross-sectional views of the fourth exemplary configuration of the region of the exemplary structure corresponding to the region R in FIG. 14B along vertical planes that correspond to the vertical planes C-C' and D-D' of FIG. 14B, respectively, after trimming the sacrificial matrix material portions according to an embodiment of the present disclosure.

FIGS. 39A and 39B are vertical cross-sectional views of a fifth exemplary configuration of the region of the exemplary structure corresponding to the region R in FIG. 14B along vertical planes that correspond to the vertical planes C-C' and D-D' of FIG. 14B, respectively, after formation of a bump-connection-level dielectric layer, a sacrificial matrix material layer, and a patterned photoresist layer according to an embodiment of the present disclosure.

FIGS. 40A and 40B are vertical cross-sectional views of the fourth exemplary configuration of the region of the exemplary structure corresponding to the region R in FIG. 14B along vertical planes that correspond to the vertical planes C-C' and D-D' of FIG. 14B, respectively, after trimming the photoresist layer according to an embodiment of the present disclosure.

FIGS. 41A and 41B are vertical cross-sectional views of the fourth exemplary configuration of the region of the exemplary structure corresponding to the region R in FIG. 14B along vertical planes that correspond to the vertical planes C-C' and D-D' of FIG. 14B, respectively, after formation of sacrificial matrix material portions according to an embodiment of the present disclosure.

DETAILED DESCRIPTION

Figure 1:
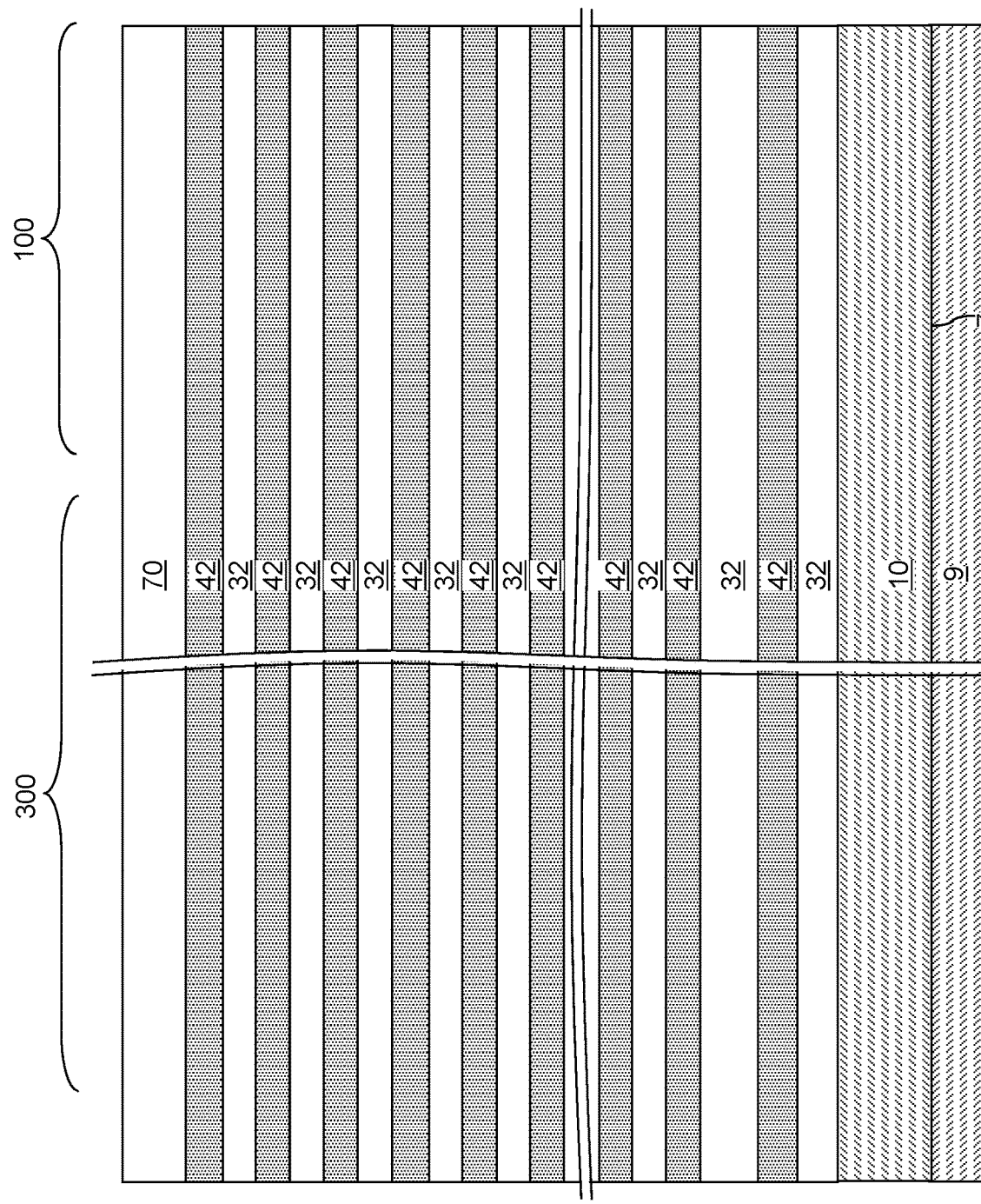
FIG. 1 is a schematic vertical cross-sectional view of an exemplary structure after formation of an alternating stack of insulating layers and sacrificial material layers according to an embodiment of the present disclosure.

As discussed above, the present disclosure is directed to three-dimensional memory devices using bonding structures connected to individual bit lines and methods of manufacturing the same, the various aspects of which are described below. The embodiments of the disclosure can be used to form various structures including a multilevel memory structure, non-limiting examples of which include semiconductor devices such as three-dimensional monolithic memory array devices comprising a plurality of NAND memory strings. The embodiments of the disclosure can be used to form a bonded assembly of a memory die and a semiconductor die, which may be a logic die or an additional memory die.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are used merely to identify similar elements, and different ordinals may be used across the specification and the claims of the instant disclosure. The same reference numerals refer to the same element or similar element. Unless otherwise indicated, elements having the same reference numerals are presumed to have the same composition. Unless otherwise indicated, a "contact" between elements refers to a direct contact between elements that provides an edge or a surface shared by the elements. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. Three-dimensional memory devices of various embodiments of the present disclosure include monolithic three-dimensional NAND string memory devices, and can be fabricated using the various embodiments described herein.

Generally, a semiconductor package (or a "package") refers to a unit semiconductor device that can be attached to a circuit board through a set of pins or solder balls. A semiconductor package may include a semiconductor chip (or a "chip") or a plurality of semiconductor chips that are bonded thereamongst, for example, by flip-chip bonding or another chip-to-chip bonding. A package or a chip may include a single semiconductor die (or a "die") or a plurality of semiconductor dies. A die is the smallest unit that can independently execute external commands or report status. Typically, a package or a chip with multiple dies is capable of simultaneously executing as many external commands as the total number of dies therein. Each die includes one or more planes. Identical concurrent operations can be executed in each plane within a same die, although there may be some restrictions. When a die is a memory die, i.e., a die including memory elements, concurrent read operations, concurrent write operations, or concurrent erase operations can be performed in each plane within a same memory die. Each plane contains a number of memory blocks (or "blocks"), which are the smallest unit that can be erased by in a single erase operation. Each memory block contains a number of pages, which are the smallest units that can be selected for programming.

Referring to FIG. 1, an exemplary structure according to an embodiment of the present disclosure is illustrated, which can be used, for example, to fabricate a device structure containing vertical NAND memory devices. The exemplary structure includes a substrate (9, 10), which can be a semiconductor substrate. The substrate can include a substrate semiconductor layer 9 and an optional semiconductor material layer 10. The substrate semiconductor layer 9 may be a semiconductor wafer or a semiconductor material layer, and can include at least one elemental semiconductor material (e.g., single crystal silicon wafer or layer), at least one III-V compound semiconductor material, at least one II-VI compound semiconductor material, at least one organic semiconductor material, or other semiconductor materials known in the art. The substrate can have a major surface 7, which can be, for example, a topmost surface of the substrate semiconductor layer 9. The major surface 7 can be a semiconductor surface. In one embodiment, the major surface 7 can be a single crystalline semiconductor surface, such as a single crystalline semiconductor surface.

As used herein, a "semiconducting material" refers to a material having electrical conductivity in the range from $1.0 \times 10^{-6}$ S/cm to $1.0 \times 10^5$ S/cm. As used herein, a "semiconductor material" refers to a material having electrical conductivity in the range from $1.0 \times 10^{-6}$ S/cm to $1.0 \times 10^5$ S/cm in the absence of electrical dopants therein, and is capable of producing a doped material having electrical conductivity in a range from 1.0 S/cm to $1.0 \times 10^5$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^5$ S/cm. As used herein, an "insulator material" or a "dielectric material" refers to a material having electrical conductivity less than $1.0 \times 10^{-6}$ S/cm. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0 \times 10^5$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-6}$ S/cm to $1.0 \times 10^5$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

A stack of an alternating plurality of first material layers (which can be insulating layers 32) and second material layers (which can be sacrificial material layer 42) is formed over the top surface of the substrate (9, 10). As used herein, a "material layer" refers to a layer including a material throughout the entirety thereof. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulating layer 32, and each second material layer can be a sacrificial material layer 42. In this case, the stack can include an alternating plurality of insulating layers 32 and sacrificial material layers 42, and constitutes a prototype stack of alternating layers comprising insulating layers 32 and sacrificial material layers 42.

The stack of the alternating plurality is herein referred to as an alternating stack (32, 42). In one embodiment, the alternating stack (32, 42) can include insulating layers 32 composed of the first material, and sacrificial material layers 42 composed of a second material different from that of insulating layers 32. The first material of the insulating layers 32 can be at least one insulating material. As such, each insulating layer 32 can be an insulating material layer. Insulating materials that can be used for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 can be silicon oxide.

The second material of the sacrificial material layers 42 is a sacrificial material that can be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an insulating material, a semiconductor material, or a conductive material. The second material of the sacrificial material layers 42 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 can be spacer material layers that comprise silicon nitride or a semiconductor material including at least one of silicon and germanium.

In one embodiment, the insulating layers 32 can include silicon oxide, and sacrificial material layers can include silicon nitride sacrificial material layers. The first material of the insulating layers 32 can be deposited, for example, by chemical vapor deposition (CVD). For example, if silicon oxide is used for the insulating layers 32, tetraethyl orthosilicate (TEOS) can be used as the precursor material for the CVD process. The second material of the sacrificial material layers 42 can be formed, for example, CVD or atomic layer deposition (ALD).

The sacrificial material layers 42 can be suitably patterned so that conductive material portions to be subsequently formed by replacement of the sacrificial material layers 42 can function as electrically conductive electrodes, such as the control gate electrodes of the monolithic three-dimensional NAND string memory devices to be subsequently formed. The sacrificial material layers 42 may comprise a portion having a strip shape extending substantially parallel to the major surface 7 of the substrate.

The thicknesses of the insulating layers 32 and the sacrificial material layers 42 can be in a range from 20 nm to 50 nm, although lesser and greater thicknesses can be used for each insulating layer 32 and for each sacrificial material layer 42. The number of repetitions of the pairs of an insulating layer 32 and a sacrificial material layer (e.g., a control gate electrode or a sacrificial material layer) 42 can be in a range from 2 to 1,024, and typically from 8 to 256, although a greater number of repetitions can also be used. The top and bottom gate electrodes in the stack may function as the select gate electrodes. In one embodiment, each sacrificial material layer 42 in the alternating stack (32, 42) can have a uniform thickness that is substantially invariant within each respective sacrificial material layer 42.

While the descriptions of the present disclosure use an embodiment in which the spacer material layers are sacrificial material layers 42 that are subsequently replaced with electrically conductive layers, in other embodiments the sacrificial material layers are formed as electrically conductive layers. In this case, steps for replacing the spacer material layers with electrically conductive layers can be omitted.

Optionally, an insulating cap layer 70 can be formed over the alternating stack (32, 42). The insulating cap layer 70 includes a dielectric material that is different from the material of the sacrificial material layers 42. In one embodiment, the insulating cap layer 70 can include a dielectric material that can be used for the insulating layers 32 as described above. The insulating cap layer 70 can have a greater thickness than each of the insulating layers 32. The insulating cap layer 70 can be deposited, for example, by chemical vapor deposition. In one embodiment, the insulating cap layer 70 can be a silicon oxide layer.

Figure 2:
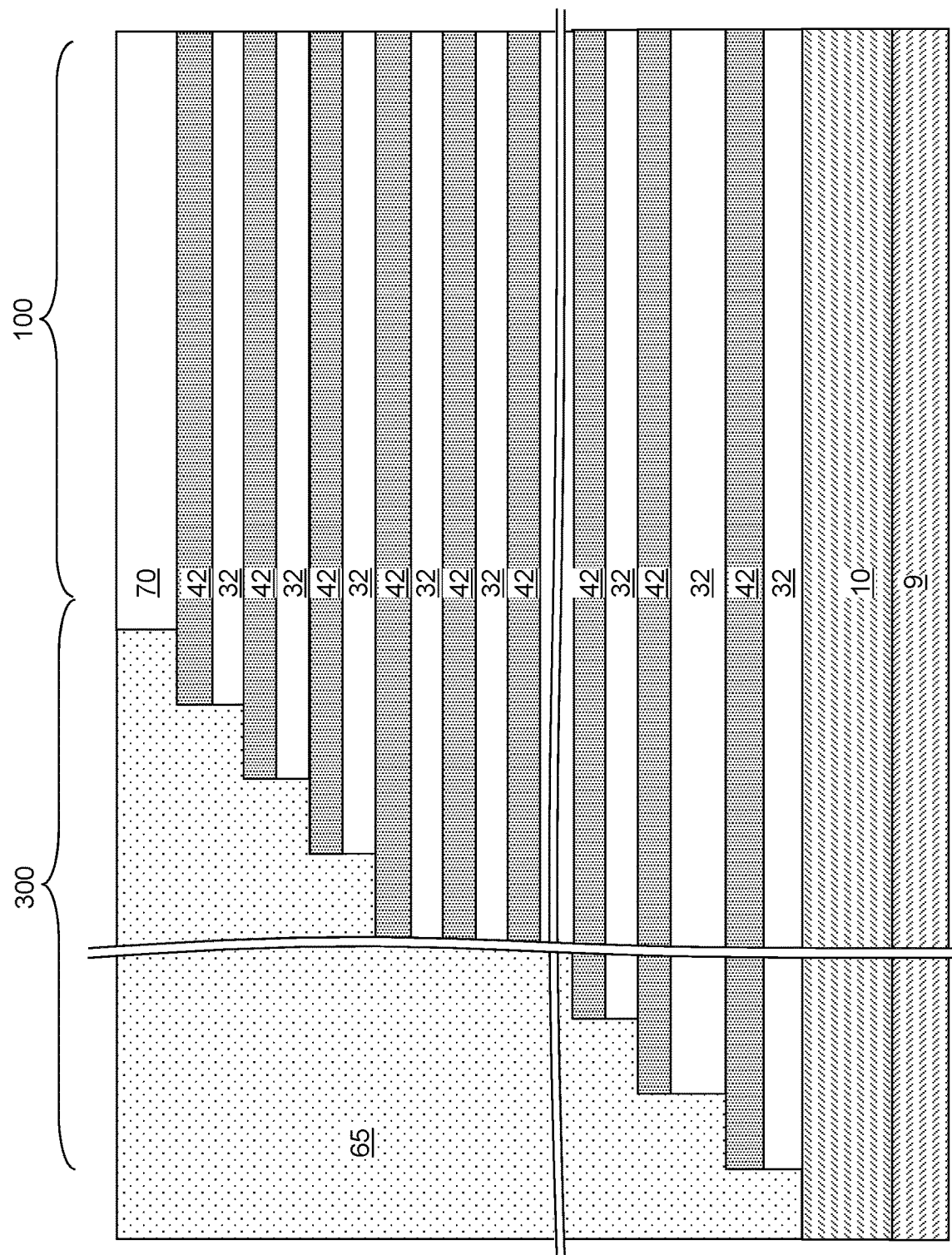
FIG. 2 is a schematic vertical cross-sectional view of the exemplary structure after formation of stepped terraces and a retro-stepped dielectric material portion according to an embodiment of the present disclosure.

Referring to FIG. 2, stepped surfaces are formed at a peripheral region of the alternating stack (32, 42), which is herein referred to as a terrace region. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A stepped cavity is formed within the volume from which portions of the alternating stack (32, 42) are removed through formation of the stepped surfaces. A "stepped cavity" refers to a cavity having stepped surfaces.

The terrace region is formed in the staircase region 300, which is located adjacent to the memory array region 100. The stepped cavity can have various stepped surfaces such that the horizontal cross-sectional shape of the stepped cavity changes in steps as a function of the vertical distance from the top surface of the substrate (9, 10). In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

Each sacrificial material layer 42 other than a topmost sacrificial material layer 42 within the alternating stack (32, 42) laterally extends farther than any overlying sacrificial material layer 42 within the alternating stack (32, 42) in the terrace region. The terrace region includes stepped surfaces of the alternating stack (32, 42) that continuously extend from a bottommost layer within the alternating stack (32, 42) to a topmost layer within the alternating stack (32, 42).

Each vertical step of the stepped surfaces can have the height of one or more pairs of an insulating layer 32 and a sacrificial material layer 42. In one embodiment, each vertical step can have the height of a single pair of an insulating layer 32 and a sacrificial material layer 42. In another embodiment, multiple "columns" of staircases can be formed along a first horizontal direction hd1 (as shown in FIG. 6B described below) such that each vertical step has the height of a plurality of pairs of an insulating layer 32 and a sacrificial material layer 42, and the number of columns can be at least the number of the plurality of pairs. Each column of staircase can be vertically offset one from another such that each of the sacrificial material layers 42 has a physically exposed top surface in a respective column of staircases. In one non-limiting example (not shown in FIG. 2), two columns of staircases are formed for each block of memory stack structures to be subsequently formed such that one column of staircases provide physically exposed top surfaces for odd-numbered sacrificial material layers 42 (as counted from the bottom) and another column of staircases provide physically exposed top surfaces for even-numbered sacrificial material layers (as counted from the bottom). Configurations using three, four, or more columns of staircases with a respective set of vertical offsets among the physically exposed surfaces of the sacrificial material layers 42 may also be used. Each sacrificial material layer 42 has a greater lateral extent, at least along one direction, than any overlying sacrificial material layers 42 such that each physically exposed surface of any sacrificial material layer 42 does not have an overhang. In one embodiment, the vertical steps within each column of staircases may be arranged along the first horizontal direction hd1, and the columns of staircases may be arranged along a second horizontal direction hd2 that is perpendicular to the first horizontal direction hd1. In one embodiment, the first horizontal direction hd1 may be perpendicular to the boundary between the memory array region 100 and the staircase region 300.

A retro-stepped dielectric material portion 65 (i.e., an insulating fill material portion) can be formed in the stepped cavity by deposition of a dielectric material therein. For example, a dielectric material such as silicon oxide can be deposited in the stepped cavity. Excess portions of the deposited dielectric material can be removed from above the top surface of the insulating cap layer 70, for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is used for the retro-stepped dielectric material portion 65, the silicon oxide of the retro-stepped dielectric material portion 65 may, or may not, be doped with dopants such as B, P, and/or F.

Optionally, drain select level isolation structures 72 can be formed through the insulating cap layer 70 and a subset of the sacrificial material layers 42 located at drain select levels. The drain select level isolation structures 72 can be formed, for example, by forming drain select level isolation trenches and filling the drain select level isolation trenches with a dielectric material such as silicon oxide. Excess portions of the dielectric material can be removed from above the top surface of the insulating cap layer 70.

Figure 3A:
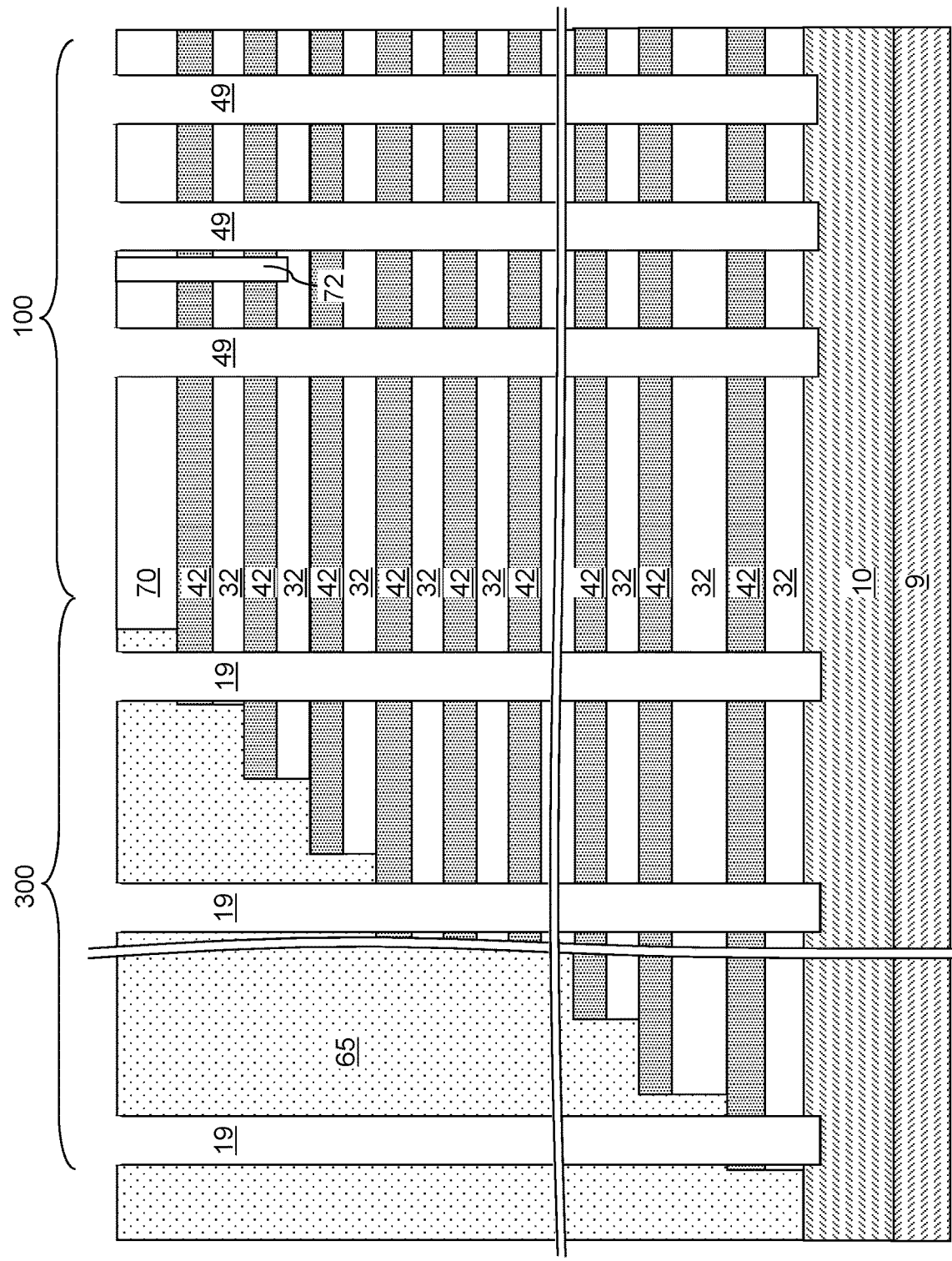
FIG. 3A is a schematic vertical cross-sectional view of the exemplary structure after formation of memory openings and support openings according to an embodiment of the present disclosure.
Figure 3B:
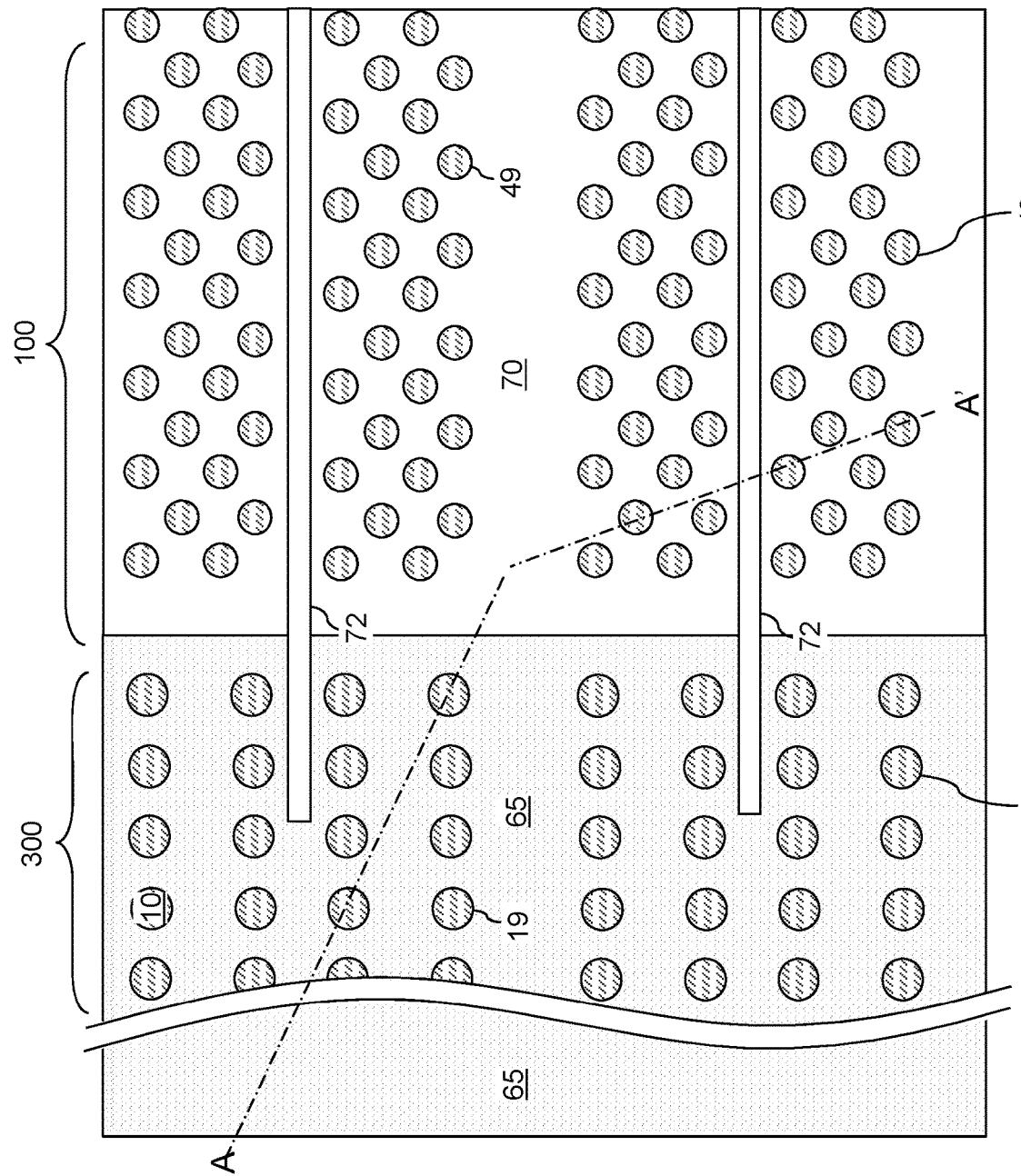
FIG. 3B is a top-down view of the exemplary structure of FIG. 3A. The vertical plane A-A' is the plane of the cross-section for FIG. 3A.

Referring to FIGS. 3A and 3B, a lithographic material stack (not shown) including at least a photoresist layer can be formed over the insulating cap layer 70 and the retro-stepped dielectric material portion 65, and can be lithographically patterned to form openings therein. The openings include a first set of openings formed over the memory array region 100 and a second set of openings formed over the staircase region 300. The pattern in the lithographic material stack can be transferred through the insulating cap layer 70 or the retro-stepped dielectric material portion 65, and through the alternating stack (32, 42) by at least one anisotropic etch that uses the patterned lithographic material stack as an etch mask. Portions of the alternating stack (32, 42) underlying the openings in the patterned lithographic material stack are etched to form memory openings 49 and support openings 19. As used herein, a "memory opening" refers to a structure in which memory elements, such as a memory stack structure, is subsequently formed. As used herein, a "support opening" refers to a structure in which a support structure (such as a support pillar structure) that mechanically supports other elements is subsequently formed. The memory openings 49 are formed through the insulating cap layer 70 and the entirety of the alternating stack (32, 42) in the memory array region 100. The support openings 19 are formed through the retro-stepped dielectric material portion 65 and the portion of the alternating stack (32, 42) that underlie the stepped surfaces in the staircase region 300.

The memory openings 49 extend through the entirety of the alternating stack (32, 42). The support openings 19 extend through a subset of layers within the alternating stack (32, 42). The chemistry of the anisotropic etch process used to etch through the materials of the alternating stack (32, 42) can alternate to optimize etching of the first and second materials in the alternating stack (32, 42). The anisotropic etch can be, for example, a series of reactive ion etches. The sidewalls of the memory openings 49 and the support openings 19 can be substantially vertical, or can be tapered. The patterned lithographic material stack can be subsequently removed, for example, by ashing.

The memory openings 49 and the support openings 19 can extend from the top surface of the alternating stack (32, 42) to at least the horizontal plane including the topmost surface of the semiconductor material layer 10. In one embodiment, an overetch into the semiconductor material layer 10 may be optionally performed after the top surface of the semiconductor material layer 10 is physically exposed at a bottom of each memory opening 49 and each support opening 19. The overetch may be performed prior to, or after, removal of the lithographic material stack. In other words, the recessed surfaces of the semiconductor material layer 10 may be vertically offset from the un-recessed top surfaces of the semiconductor material layer 10 by a recess depth. The recess depth can be, for example, in a range from 1 nm to 50 nm, although lesser and greater recess depths can also be used. The overetch is optional, and may be omitted. If the overetch is not performed, the bottom surfaces of the memory openings 49 and the support openings 19 can be coplanar with the topmost surface of the semiconductor material layer 10.

Each of the memory openings 49 and the support openings 19 may include a sidewall (or a plurality of sidewalls) that extends substantially perpendicular to the topmost surface of the substrate. A two-dimensional array of memory openings 49 can be formed in the memory array region 100. A two-dimensional array of support openings 19 can be formed in the staircase region 300. The substrate semiconductor layer 9 and the semiconductor material layer 10 collectively constitutes a substrate (9, 10), which can be a semiconductor substrate. Alternatively, the semiconductor material layer 10 may be omitted, and the memory openings 49 and the support openings 19 can be extend to a top surface of the substrate semiconductor layer 9.

FIGS. 4A-4H illustrate structural changes in a memory opening 49, which is one of the memory openings 49 in the exemplary structure of FIGS. 3A and 3B. The same structural change occurs simultaneously in each of the other memory openings 49 and in each support opening 19.

Referring to FIG. 4A, a memory opening 49 in the exemplary device structure of FIGS. 3A and 3B is illustrated. The memory opening 49 extends through the insulating cap layer 70, the alternating stack (32, 42), and optionally into an upper portion of the semiconductor material layer 10. At this processing step, each support opening 19 can extend through the retro-stepped dielectric material portion 65, a subset of layers in the alternating stack (32, 42), and optionally through the upper portion of the semiconductor material layer 10. The recess depth of the bottom surface of each memory opening with respect to the top surface of the semiconductor material layer 10 can be in a range from 0 nm to 30 nm, although greater recess depths can also be used. Optionally, the sacrificial material layers 42 can be laterally recessed partially to form lateral recesses (not shown), for example, by an isotropic etch.

Referring to FIG. 4B, an optional pedestal channel portion (e.g., an epitaxial pedestal) 11 can be formed at the bottom portion of each memory opening 49 and each support openings 19, for example, by selective epitaxy. Each pedestal channel portion 11 comprises a single crystalline semiconductor material in epitaxial alignment with the single crystalline semiconductor material of the semiconductor material layer 10. In one embodiment, the pedestal channel portion 11 can be doped with electrical dopants of the same conductivity type as the semiconductor material layer 10. In one embodiment, the top surface of each pedestal channel portion 11 can be formed above a horizontal plane including the top surface of a sacrificial material layer 42. In this case, at least one source select gate electrode can be subsequently formed by replacing each sacrificial material layer 42 located below the horizontal plane including the top surfaces of the pedestal channel portions 11 with a respective conductive material layer. The pedestal channel portion 11 can be a portion of a transistor channel that extends between a source region to be subsequently formed in the substrate (9, 10) and a drain region to be subsequently formed in an upper portion of the memory opening 49. A memory cavity 49' is present in the unfilled portion of the memory opening 49 above the pedestal channel portion 11. In one embodiment, the pedestal channel portion 11 can comprise single crystalline silicon. In one embodiment, the pedestal channel portion 11 can have a doping of the first conductivity type, which is the same as the conductivity type of the semiconductor material layer 10 that the pedestal channel portion contacts. If a semiconductor material layer 10 is not present, the pedestal channel portion 11 can be formed directly on the substrate semiconductor layer 9, which can have a doping of the first conductivity type.

Referring to FIG. 4C, a stack of layers including a blocking dielectric layer 52, a charge storage layer 54, a tunneling dielectric layer 56, and an optional first semiconductor channel layer 601 can be sequentially deposited in the memory openings 49.

The blocking dielectric layer 52 can include a single dielectric material layer or a stack of a plurality of dielectric material layers. In one embodiment, the blocking dielectric layer can include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 can include a dielectric metal oxide having a dielectric constant greater than 7.9, i.e., having a dielectric constant greater than the dielectric constant of silicon nitride.

Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof. The dielectric metal oxide layer can be deposited, for example, by chemical vapor deposition (CVD), atomic layer deposition (ALD), pulsed laser deposition (PLD), liquid source misted chemical deposition, or a combination thereof. The thickness of the dielectric metal oxide layer can be in a range from 1 nm to 20 nm, although lesser and greater thicknesses can also be used. The dielectric metal oxide layer can subsequently function as a dielectric material portion that blocks leakage of stored electrical charges to control gate electrodes. In one embodiment, the blocking dielectric layer 52 includes aluminum oxide. In one embodiment, the blocking dielectric layer 52 can include multiple dielectric metal oxide layers having different material compositions.

Alternatively or additionally, the blocking dielectric layer 52 can include a dielectric semiconductor compound such as silicon oxide, silicon oxynitride, silicon nitride, or a combination thereof. In one embodiment, the blocking dielectric layer 52 can include silicon oxide. In this case, the dielectric semiconductor compound of the blocking dielectric layer 52 can be formed by a conformal deposition method such as low pressure chemical vapor deposition, atomic layer deposition, or a combination thereof. The thickness of the dielectric semiconductor compound can be in a range from 1 nm to 20 nm, although lesser and greater thicknesses can also be used. Alternatively, the blocking dielectric layer 52 can be omitted, and a backside blocking dielectric layer can be formed after formation of backside recesses on surfaces of memory films to be subsequently formed.

Subsequently, the charge storage layer 54 can be formed. In one embodiment, the charge storage layer 54 can be a continuous layer or patterned discrete portions of a charge trapping material including a dielectric charge trapping material, which can be, for example, silicon nitride. Alternatively, the charge storage layer 54 can include a continuous layer or patterned discrete portions of a conductive material such as doped polysilicon or a metallic material that is patterned into multiple electrically isolated portions (e.g., floating gates), for example, by being formed within lateral recesses into sacrificial material layers 42. In one embodiment, the charge storage layer 54 includes a silicon nitride layer. In one embodiment, the sacrificial material layers 42 and the insulating layers 32 can have vertically coincident sidewalls, and the charge storage layer 54 can be formed as a single continuous layer.

In another embodiment, the sacrificial material layers 42 can be laterally recessed with respect to the sidewalls of the insulating layers 32, and a combination of a deposition process and an anisotropic etch process can be used to form the charge storage layer 54 as a plurality of memory material portions that are vertically spaced apart. While the descriptions in the present disclosure use an embodiment in which the charge storage layer 54 is a single continuous layer, in other embodiments the charge storage layer 54 is replaced with a plurality of memory material portions (which can be charge trapping material portions or electrically isolated conductive material portions) that are vertically spaced apart.

The charge storage layer 54 can be formed as a single charge storage layer of homogeneous composition, or can include a stack of multiple charge storage layers. The multiple charge storage layers, if used, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the charge storage layer 54 may comprise an insulating charge trapping material, such as one or more silicon nitride segments. Alternatively, the charge storage layer 54 may comprise conductive nanoparticles such as metal nanoparticles, which can be, for example, ruthenium nanoparticles. The charge storage layer 54 can be formed, for example, by chemical vapor deposition (CVD), atomic layer deposition (ALD), physical vapor deposition (PVD), or any suitable deposition technique for storing electrical charges therein. The thickness of the charge storage layer 54 can be in a range from 2 nm to 20 nm, although lesser and greater thicknesses can also be used.

The tunneling dielectric layer 56 includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 can include a stack of a first silicon oxide layer, a silicon oxynitride layer, and a second silicon oxide layer, which is commonly known as an ONO stack. In one embodiment, the tunneling dielectric layer 56 can include a silicon oxide layer that is substantially free of carbon or a silicon oxynitride layer that is substantially free of carbon. The thickness of the tunneling dielectric layer 56 can be in a range from 2 nm to 20 nm, although lesser and greater thicknesses can also be used.

The optional first semiconductor channel layer 601 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the first semiconductor channel layer 601 includes amorphous silicon or polysilicon. The first semiconductor channel layer 601 can be formed by a conformal deposition method such as low pressure chemical vapor deposition (LPCVD). The thickness of the first semiconductor channel layer 601 can be in a range from 2 nm to 10 nm, although lesser and greater thicknesses can also be used. A memory cavity 49' is formed in the volume of each memory opening 49 that is not filled with the deposited material layers (52, 54, 56, 601).

Referring to FIG. 4D, the optional first semiconductor channel layer 601, the tunneling dielectric layer 56, the charge storage layer 54, the blocking dielectric layer 52 are sequentially anisotropically etched using at least one anisotropic etch process. The portions of the first semiconductor channel layer 601, the tunneling dielectric layer 56, the charge storage layer 54, and the blocking dielectric layer 52 located above the top surface of the insulating cap layer 70 can be removed by the at least one anisotropic etch process. Further, the horizontal portions of the first semiconductor channel layer 601, the tunneling dielectric layer 56, the charge storage layer 54, and the blocking dielectric layer 52 at a bottom of each memory cavity 49' can be removed to form openings in remaining portions thereof. Each of the first semiconductor channel layer 601, the tunneling dielectric layer 56, the charge storage layer 54, and the blocking dielectric layer 52 can be etched by a respective anisotropic etch process using a respective etch chemistry, which may, or may not, be the same for the various material layers.

Each remaining portion of the first semiconductor channel layer 601 can have a tubular configuration. The charge storage layer 54 can comprise a charge trapping material or a floating gate material. In one embodiment, each charge storage layer 54 can include a vertical stack of charge storage regions that store electrical charges upon programming. In one embodiment, the charge storage layer 54 can be a charge storage layer in which each portion adjacent to the sacrificial material layers 42 constitutes a charge storage region.

A surface of the pedestal channel portion 11 (or a surface of the semiconductor material layer 10 in case the pedestal channel portions 11 are not used) can be physically exposed underneath the opening through the first semiconductor channel layer 601, the tunneling dielectric layer 56, the charge storage layer 54, and the blocking dielectric layer 52. Optionally, the physically exposed semiconductor surface at the bottom of each memory cavity 49' can be vertically recessed so that the recessed semiconductor surface underneath the memory cavity 49' is vertically offset from the topmost surface of the pedestal channel portion 11 (or of the semiconductor material layer 10 in case pedestal channel portions 11 are not used) by a recess distance. A tunneling dielectric layer 56 is located over the charge storage layer 54. A set of a blocking dielectric layer 52, a charge storage layer 54, and a tunneling dielectric layer 56 in a memory opening 49 constitutes a memory film 50, which includes a plurality of charge storage regions (comprising the charge storage layer 54) that are insulated from surrounding materials by the blocking dielectric layer 52 and the tunneling dielectric layer 56. In one embodiment, the first semiconductor channel layer 601, the tunneling dielectric layer 56, the charge storage layer 54, and the blocking dielectric layer 52 can have vertically coincident sidewalls.

Referring to FIG. 4E, a second semiconductor channel layer 602 can be deposited directly on the semiconductor surface of the pedestal channel portion 11 or the semiconductor material layer 10 if the pedestal channel portion 11 is omitted, and directly on the first semiconductor channel layer 601. In an alternative embodiment, the first semiconductor channel layer 601 may be removed before depositing the second semiconductor channel layer 602. The second semiconductor channel layer 602 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the second semiconductor channel layer 602 includes amorphous silicon or polysilicon. The second semiconductor channel layer 602 can be formed by a conformal deposition method such as low pressure chemical vapor deposition (LPCVD). The thickness of the second semiconductor channel layer 602 can be in a range from 2 nm to 10 nm, although lesser and greater thicknesses can also be used. The second semiconductor channel layer 602 may partially fill the memory cavity 49' in each memory opening, or may fully fill the cavity in each memory opening.

The materials of the first semiconductor channel layer 601 and the second semiconductor channel layer 602 are collectively referred to as a semiconductor channel material. In other words, the semiconductor channel material is a set of all semiconductor material in the first semiconductor channel layer 601 and the second semiconductor channel layer 602.

Referring to FIG. 4F, in case the memory cavity 49' in each memory opening is not completely filled by the second semiconductor channel layer 602, a dielectric core layer 62L can be deposited in the memory cavity 49' to fill any remaining portion of the memory cavity 49' within each memory opening. The dielectric core layer 62L includes a dielectric material such as silicon oxide or organosilicate glass. The dielectric core layer 62L can be deposited by a conformal deposition method such as low pressure chemical vapor deposition (LPCVD), or by a self-planarizing deposition process such as spin coating.

Figure 4H:
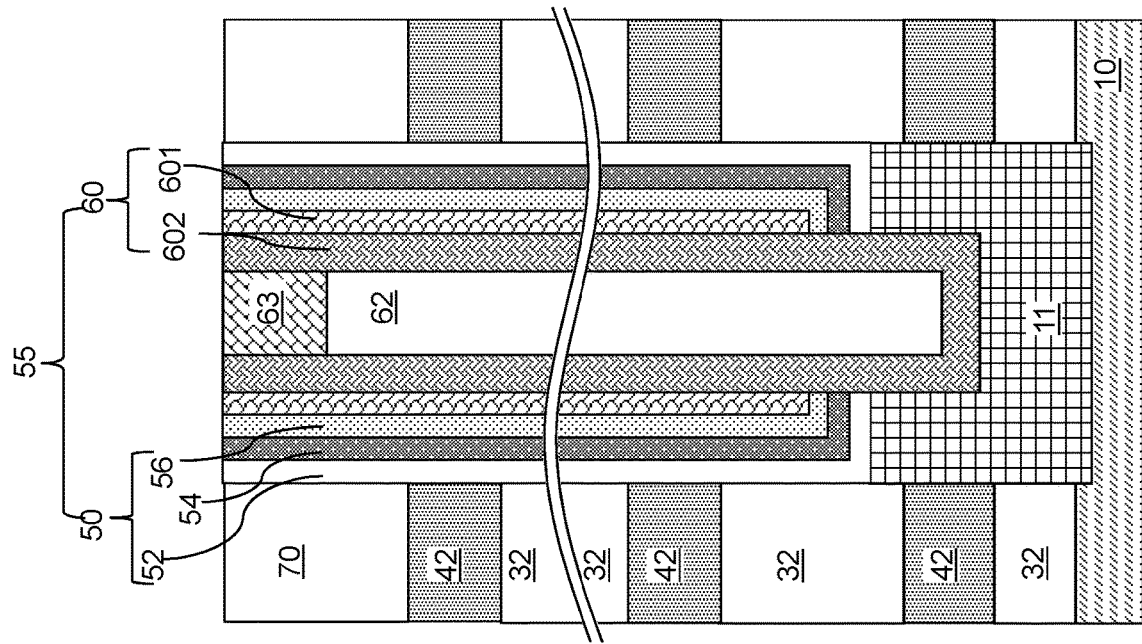
Figure 4G:
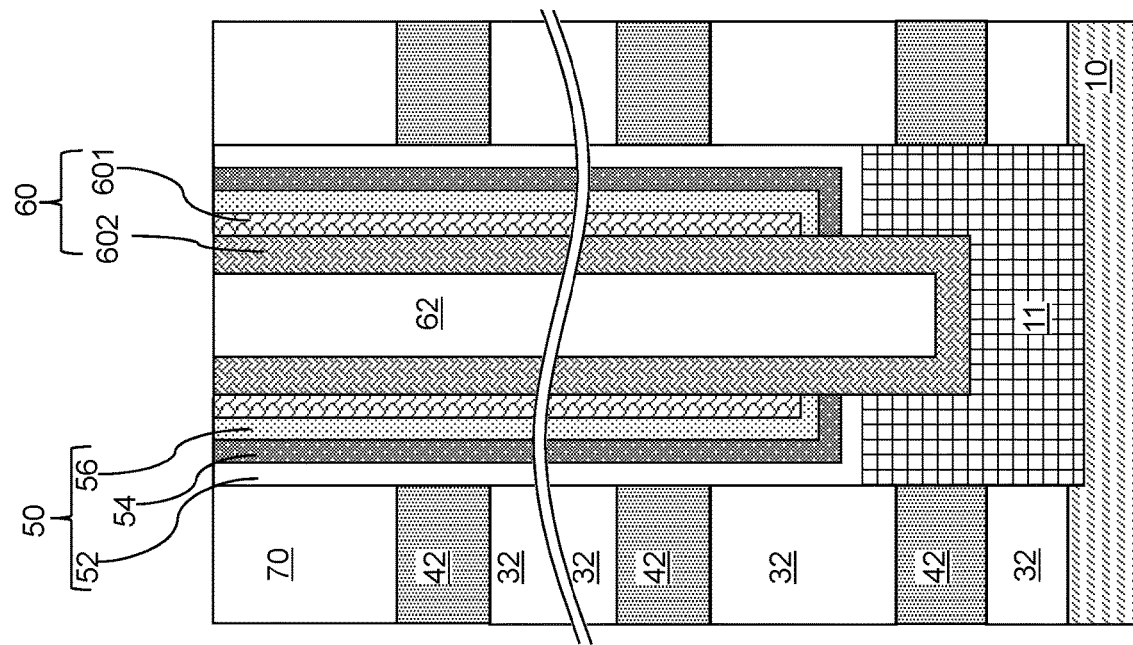

Referring to FIG. 4G, the horizontal portion of the dielectric core layer 62L can be removed, for example, by a recess etch from above the top surface of the insulating cap layer 70. Each remaining portion of the dielectric core layer 62L constitutes a dielectric core 62. Further, the horizontal portion of the second semiconductor channel layer 602 located above the top surface of the insulating cap layer 70 can be removed by a planarization process, which can use a recess etch or chemical mechanical planarization (CMP). Each remaining portion of the second semiconductor channel layer 602 can be located entirety within a memory opening 49 or entirely within a support opening 19.

Each adjoining pair of a first semiconductor channel layer 601 and a second semiconductor channel layer 602 can collectively form a vertical semiconductor channel 60 through which electrical current can flow when a vertical NAND device including the vertical semiconductor channel 60 is turned on. A tunneling dielectric layer 56 is surrounded by a charge storage layer 54, and laterally surrounds a portion of the vertical semiconductor channel 60. Each adjoining set of a blocking dielectric layer 52, a charge storage layer 54, and a tunneling dielectric layer 56 collectively constitute a memory film 50, which can store electrical charges with a macroscopic retention time. In some embodiments, a blocking dielectric layer 52 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours.

Referring to FIG. 4H, the top surface of each dielectric core 62 can be further recessed within each memory opening, for example, by a recess etch to a depth that is located between the top surface of the insulating cap layer 70 and the bottom surface of the insulating cap layer 70. Drain regions 63 can be formed by depositing a doped semiconductor material within each recessed region above the dielectric cores 62. The drain regions 63 can have a doping of a second conductivity type that is the opposite of the first conductivity type. For example, if the first conductivity type is p-type, the second conductivity type is n-type, and vice versa. The dopant concentration in the drain regions 63 can be in a range from $5.0 \times 10^{19}/cm^3$ to $2.0 \times 10^{21}/cm^3$, although lesser and greater dopant concentrations can also be used. The doped semiconductor material can be, for example, doped polysilicon. Excess portions of the deposited semiconductor material can be removed from above the top surface of the insulating cap layer 70, for example, by chemical mechanical planarization (CMP) or a recess etch to form the drain regions 63.

Each combination of a memory film 50 and a vertical semiconductor channel 60 within a memory opening 49 constitutes a memory stack structure 55. The memory stack structure 55 is a combination of a semiconductor channel, a tunneling dielectric layer, a plurality of memory elements comprising portions of the charge storage layer 54, and an optional blocking dielectric layer 52. Each combination of a pedestal channel portion 11 (if present), a memory stack structure 55, a dielectric core 62, and a drain region 63 within a memory opening 49 is herein referred to as a memory opening fill structure (11, 55, 62, 63). Each combination of a pedestal channel portion 11 (if present), a memory film 50, a vertical semiconductor channel 60, a dielectric core 62, and a drain region 63 within each support opening 19 fills the respective support openings 19, and constitutes a support pillar structure.

Figure 5:
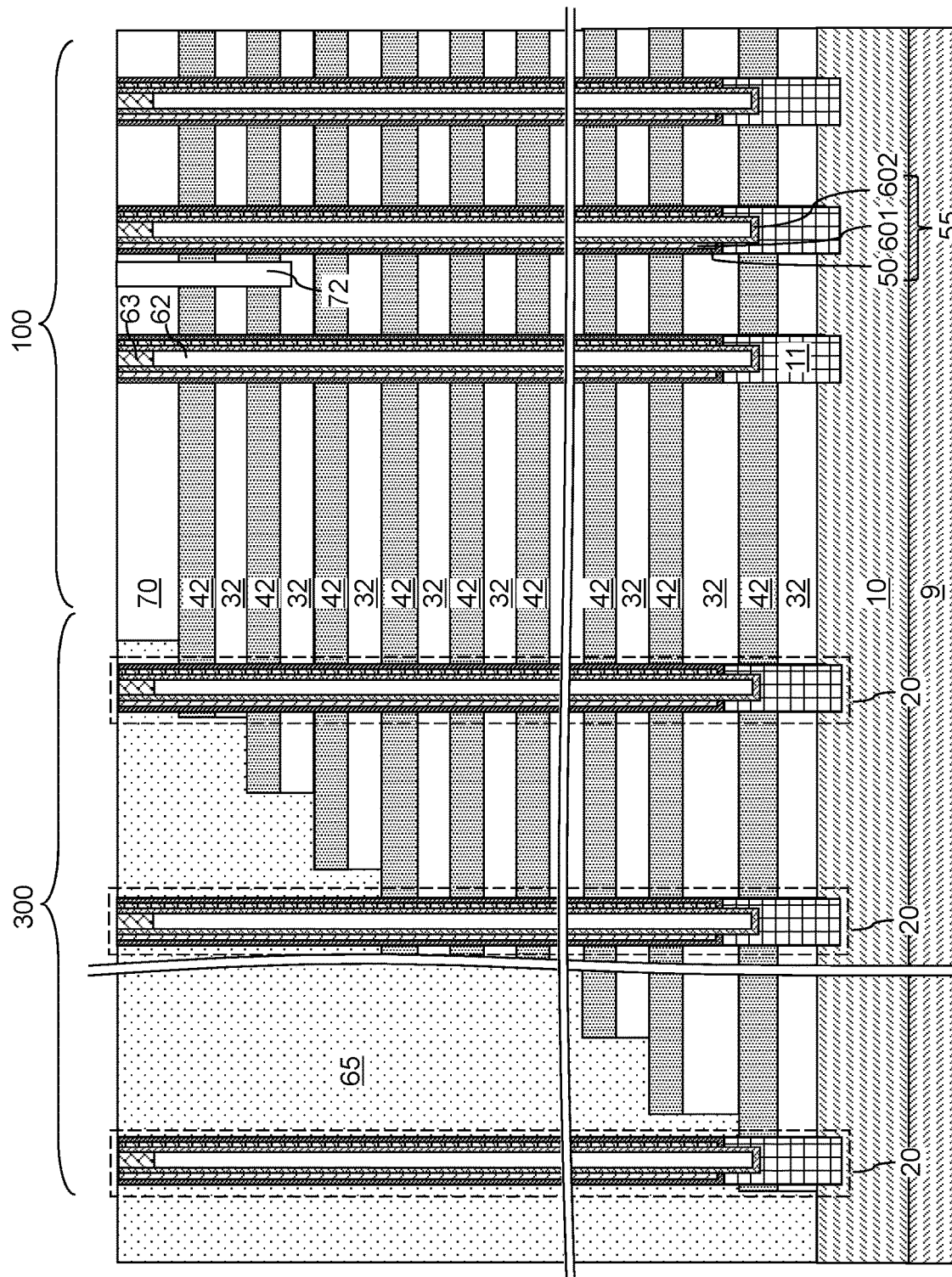
FIG. 5 is a schematic vertical cross-sectional view of the exemplary structure after formation of memory stack structures and support pillar structures according to an embodiment of the present disclosure.

Referring to FIG. 5, the exemplary structure is illustrated after formation of memory opening fill structures (11, 55, 62, 63) and support pillar structure 20 within the memory openings 49 and the support openings 19, respectively. An instance of a memory opening fill structure (11, 55, 62, 63) can be formed within each memory opening 49 of the structure of FIGS. 4A and 4B. An instance of the support pillar structure 20 can be formed within each support opening 19 of the structure of FIGS. 4A and 4B.

Each memory stack structure 55 includes a vertical semiconductor channel 60, which may comprise multiple semiconductor channel layers (601, 602), and a memory film 50. The memory film 50 may comprise a tunneling dielectric layer 56 laterally surrounding the vertical semiconductor channel 60 and a vertical stack of charge storage regions laterally surrounding the tunneling dielectric layer 56 (comprising a memory material layer 54) and an optional blocking dielectric layer 52. While the descriptions in present disclosure use the illustrated configuration for the memory stack structure, the methods of various embodiments of the present disclosure can be applied to alternative memory stack structures including different layer stacks or structures for the memory film 50 and/or for the vertical semiconductor channel 60.

Figure 6A:
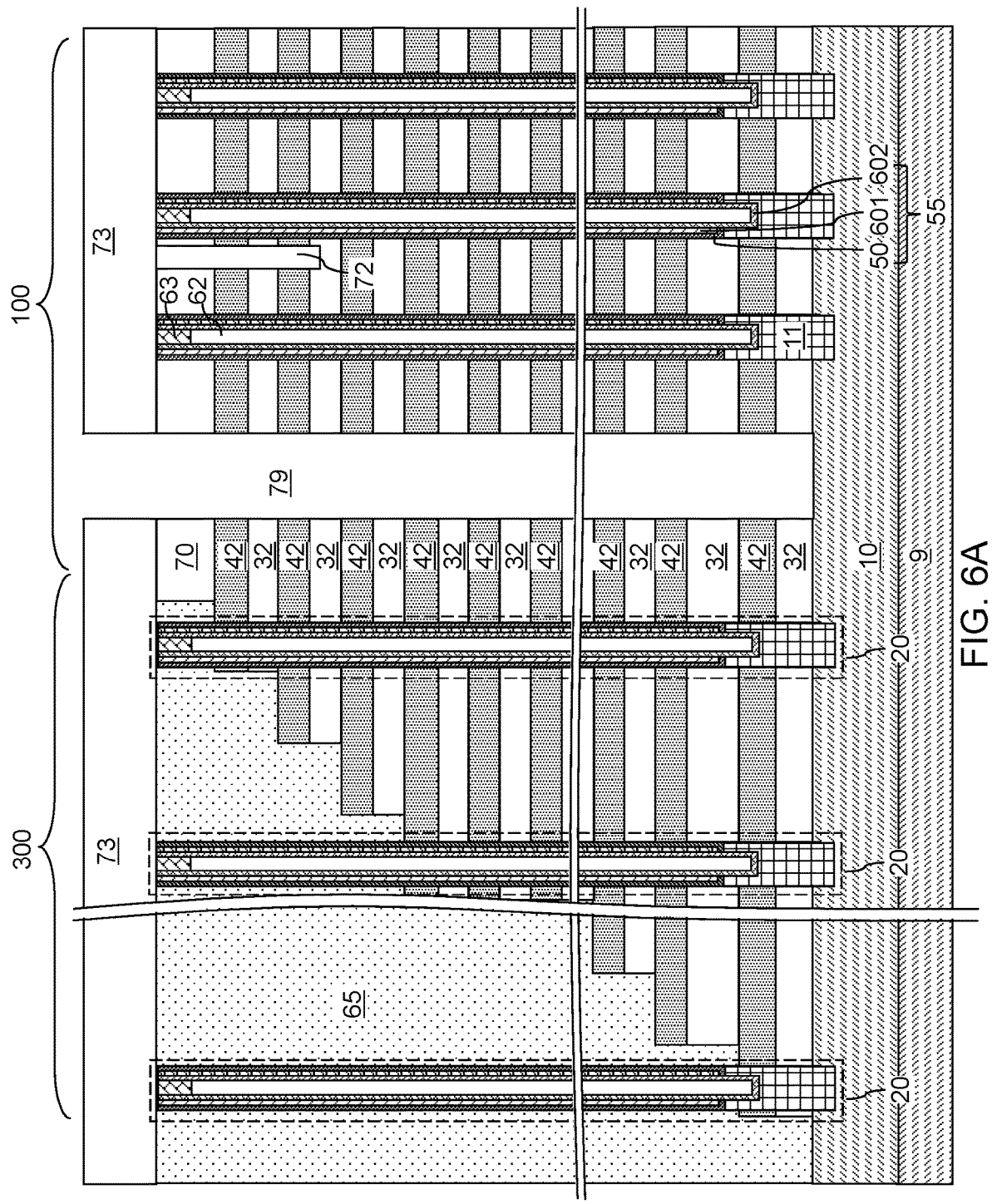
FIG. 6A is a schematic vertical cross-sectional view of the exemplary structure after formation of backside trenches according to an embodiment of the present disclosure.
Figure 6B:
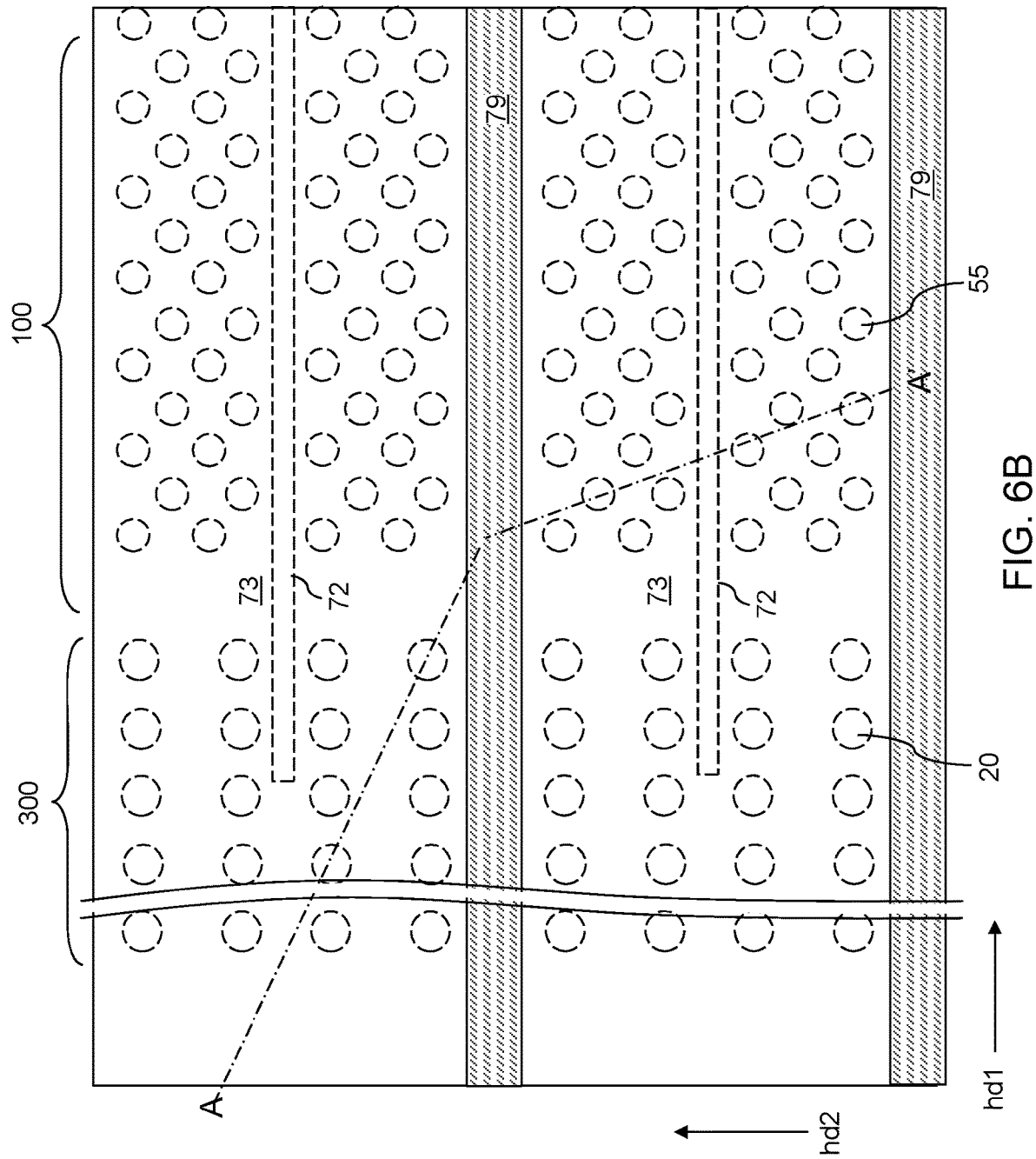
FIG. 6B is a partial see-through top-down view of the exemplary structure of FIG. 6A. The vertical plane A-A' is the plane of the schematic vertical cross-sectional view of FIG. 6A.

Referring to FIGS. 6A and 6B, a contact level dielectric layer 73 can be formed over the alternating stack (32, 42) of insulating layer 32 and sacrificial material layers 42, and over the memory stack structures 55 and the support pillar structures 20. The contact level dielectric layer 73 includes a dielectric material that is different from the dielectric material of the sacrificial material layers 42. For example, the contact level dielectric layer 73 can include silicon oxide. The contact level dielectric layer 73 can have a thickness in a range from 50 nm to 500 nm, although lesser and greater thicknesses can also be used.

A photoresist layer (not shown) can be applied over the contact level dielectric layer 73, and is lithographically patterned to form openings in areas between clusters of memory stack structures 55. The pattern in the photoresist layer can be transferred through the contact level dielectric layer 73, the alternating stack (32, 42) and/or the retro-stepped dielectric material portion 65 using an anisotropic etch to form backside trenches 79, which vertically extend from the top surface of the contact level dielectric layer 73 at least to the top surface of the substrate (9, 10), and laterally extend through the memory array region 100 and the staircase region 300.

In one embodiment, the backside trenches 79 can laterally extend along a first horizontal direction hd1 and can be laterally spaced apart one from another along a second horizontal direction hd2 that is perpendicular to the first horizontal direction hd1. The memory stack structures 55 can be arranged in rows that extend along the first horizontal direction hd1. The drain select level isolation structures 72 can laterally extend along the first horizontal direction hd1. Each backside trench 79 can have a uniform width that is invariant along the lengthwise direction (i.e., along the first horizontal direction hd1). Each drain select level isolation structure 72 can have a uniform vertical cross-sectional profile along vertical planes that are perpendicular to the first horizontal direction hd1 that is invariant with translation along the first horizontal direction hd1. Multiple rows of memory stack structures 55 can be located between a neighboring pair of a backside trench 79 and a drain select level isolation structure 72, or between a neighboring pair of drain select level isolation structures 72. In one embodiment, the backside trenches 79 can include a source contact opening in which a source contact via structure can be subsequently formed. The photoresist layer can be removed, for example, by ashing.

Figure 7:
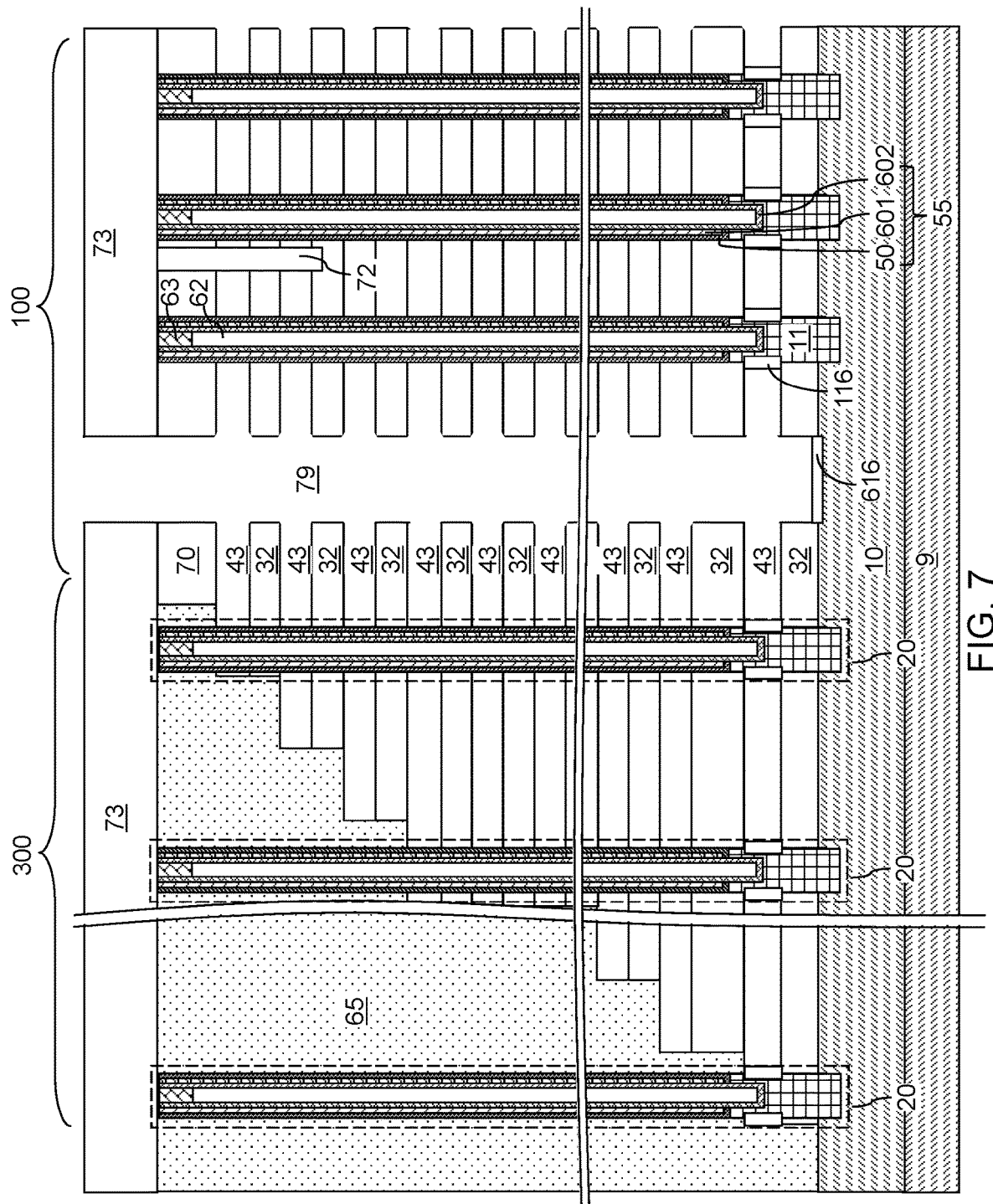
FIG. 7 is a schematic vertical cross-sectional view of the exemplary structure after formation of backside recesses according to an embodiment of the present disclosure.

Referring to FIGS. 7 and 8A, an etchant that selectively etches the second material of the sacrificial material layers 42 with respect to the first material of the insulating layers 32 can be introduced into the backside trenches 79, for example, using an etch process. FIG. 8A illustrates a region of the exemplary structure of FIG. 7. Backside recesses 43 are formed in volumes from which the sacrificial material layers 42 are removed. The removal of the second material of the sacrificial material layers 42 can be selective to the first material of the insulating layers 32, the material of the retro-stepped dielectric material portion 65, the semiconductor material of the semiconductor material layer 10, and the material of the outermost layer of the memory films 50. In one embodiment, the sacrificial material layers 42 can include silicon nitride, and the materials of the insulating layers 32 and the retro-stepped dielectric material portion 65 can be selected from silicon oxide and dielectric metal oxides.

The etch process that removes the second material selective to the first material and the outermost layer of the memory films 50 can be a wet etch process using a wet etch solution, or can be a gas phase (dry) etch process in which the etchant is introduced in a vapor phase into the backside trenches 79. For example, if the sacrificial material layers 42 include silicon nitride, the etch process can be a wet etch process in which the exemplary structure is immersed within a wet etch tank including phosphoric acid, which etches silicon nitride selective to silicon oxide, silicon, and various other materials used in the art. The support pillar structure 20, the retro-stepped dielectric material portion 65, and the memory stack structures 55 provide structural support while the backside recesses 43 are present within volumes previously occupied by the sacrificial material layers 42.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. The memory openings in which the memory stack structures 55 are formed are herein referred to as front side openings or front side cavities in contrast with the backside recesses 43. In one embodiment, the memory array region 100 comprises an array of monolithic three-dimensional NAND strings having a plurality of device levels disposed above the substrate (9, 10). In this case, each backside recess 43 can define a space for receiving a respective word line of the array of monolithic three-dimensional NAND strings.

Each of the plurality of backside recesses 43 can extend substantially parallel to the top surface of the substrate (9, 10). A backside recess 43 can be vertically bounded by a top surface of an underlying insulating layer 32 and a bottom surface of an overlying insulating layer 32. In one embodiment, each backside recess 43 can have a uniform height throughout.

Physically exposed surface portions of the optional pedestal channel portions 11 and the semiconductor material layer 10 can be converted into dielectric material portions by thermal conversion and/or plasma conversion of the semiconductor materials into dielectric materials. For example, thermal conversion and/or plasma conversion can be used to convert a surface portion of each pedestal channel portion 11 into a tubular dielectric spacer 116, and to convert each physically exposed surface portion of the semiconductor material layer 10 into a planar dielectric portion 616. In one embodiment, each tubular dielectric spacer 116 can be topologically homeomorphic to a torus, i.e., generally ring-shaped. As used herein, an element is topologically homeomorphic to a torus if the shape of the element can be continuously stretched without destroying a hole or forming a new hole into the shape of a torus. The tubular dielectric spacers 116 include a dielectric material that includes the same semiconductor element as the pedestal channel portions 11 and additionally includes at least one non-metallic element such as oxygen and/or nitrogen such that the material of the tubular dielectric spacers 116 is a dielectric material. In one embodiment, the tubular dielectric spacers 116 can include a dielectric oxide, a dielectric nitride, or a dielectric oxynitride of the semiconductor material of the pedestal channel portions 11. Likewise, each planar dielectric portion 616 includes a dielectric material that includes the same semiconductor element as the semiconductor material layer and additionally includes at least one non-metallic element such as oxygen and/or nitrogen such that the material of the planar dielectric portions 616 is a dielectric material. In one embodiment, the planar dielectric portions 616 can include a dielectric oxide, a dielectric nitride, or a dielectric oxynitride of the semiconductor material of the semiconductor material layer 10.

Referring to FIG. 8B, a backside blocking dielectric layer 44 can be optionally formed. The backside blocking dielectric layer 44, if present, comprises a dielectric material that functions as a control gate dielectric for the control gates to be subsequently formed in the backside recesses 43. In case the blocking dielectric layer 52 is present within each memory opening, the backside blocking dielectric layer 44 is optional. In case the blocking dielectric layer 52 is omitted, the backside blocking dielectric layer 44 is present.

The backside blocking dielectric layer 44 can be formed in the backside recesses 43 and on a sidewall of the backside trench 79. The backside blocking dielectric layer 44 can be formed directly on horizontal surfaces of the insulating layers 32 and sidewalls of the memory stack structures 55 within the backside recesses 43. If the backside blocking dielectric layer 44 is formed, formation of the tubular dielectric spacers 116 and the planar dielectric portion 616 prior to formation of the backside blocking dielectric layer 44 is optional. In one embodiment, the backside blocking dielectric layer 44 can be formed by a conformal deposition process such as atomic layer deposition (ALD). The backside blocking dielectric layer 44 can consist essentially of aluminum oxide. The thickness of the backside blocking dielectric layer 44 can be in a range from 1 nm to 15 nm, such as 2 to 6 nm, although lesser and greater thicknesses can also be used.

The dielectric material of the backside blocking dielectric layer 44 can be a dielectric metal oxide such as aluminum oxide, a dielectric oxide of at least one transition metal element, a dielectric oxide of at least one Lanthanide element, a dielectric oxide of a combination of aluminum, at least one transition metal element, and/or at least one Lanthanide element. Alternatively or additionally, the backside blocking dielectric layer 44 can include a silicon oxide layer. The backside blocking dielectric layer 44 can be deposited by a conformal deposition method such as chemical vapor deposition or atomic layer deposition. The backside blocking dielectric layer 44 is formed on the sidewalls of the backside trenches 79, horizontal surfaces and sidewalls of the insulating layers 32, the portions of the sidewall surfaces of the memory stack structures 55 that are physically exposed to the backside recesses 43, and a top surface of the planar dielectric portion 616. A backside cavity 79' is present within the portion of each backside trench 79 that is not filled with the backside blocking dielectric layer 44.

Referring to FIG. 8C, a metallic barrier layer 46A can be deposited in the backside recesses 43. The metallic barrier layer 46A includes an electrically conductive metallic material that can function as a diffusion barrier layer and/or adhesion promotion layer for a metallic fill material to be subsequently deposited. The metallic barrier layer 46A can include a conductive metallic nitride material such as TiN, TaN, WN, or a stack thereof, or can include a conductive metallic carbide material such as TiC, TaC, WC, or a stack thereof. In one embodiment, the metallic barrier layer 46A can be deposited by a conformal deposition process such as chemical vapor deposition (CVD) or atomic layer deposition (ALD). The thickness of the metallic barrier layer 46A can be in a range from 2 nm to 8 nm, such as from 3 nm to 6 nm, although lesser and greater thicknesses can also be used. In one embodiment, the metallic barrier layer 46A can consist essentially of a conductive metal nitride such as TiN.

Figure 9:
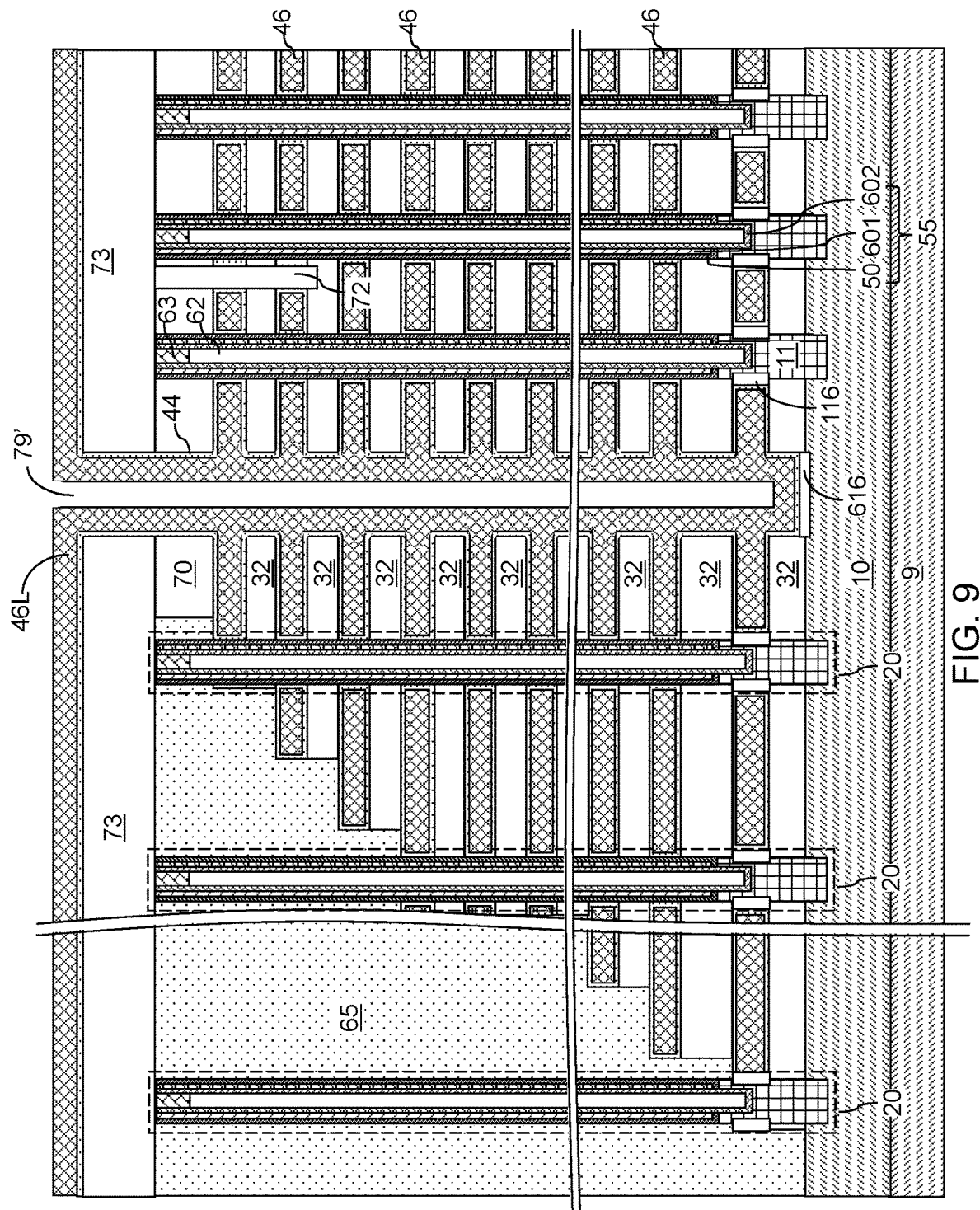
FIG. 9 is a schematic vertical cross-sectional view of the exemplary structure at the processing step of FIG. 8D.

Referring to FIGS. 8D and 9, a metal fill material is deposited in the plurality of backside recesses 43, on the sidewalls of the backside trench 79, and over the top surface of the contact level dielectric layer 73 to form a metallic fill material layer 46B. The metallic fill material can be deposited by a conformal deposition method, which can be, for example, chemical vapor deposition (CVD), atomic layer deposition (ALD), electroless plating, electroplating, or a combination thereof. In one embodiment, the metallic fill material layer 46B can consist essentially of at least one elemental metal. The at least one elemental metal of the metallic fill material layer 46B can be selected, for example, from tungsten, cobalt, ruthenium, titanium, and tantalum. In one embodiment, the metallic fill material layer 46B can consist essentially of a single elemental metal. In one embodiment, the metallic fill material layer 46B can be deposited using a fluorine-containing precursor gas such as $WF_6$. In one embodiment, the metallic fill material layer 46B can be a tungsten layer including a residual level of fluorine atoms as impurities. The metallic fill material layer 46B is spaced from the insulating layers 32 and the memory stack structures 55 by the metallic barrier layer 46A, which is a metallic barrier layer that blocks diffusion of fluorine atoms therethrough.

A plurality of electrically conductive layers 46 can be formed in the plurality of backside recesses 43, and a continuous metallic material layer 46L can be formed on the sidewalls of each backside trench 79 and over the contact level dielectric layer 73. Each electrically conductive layer 46 includes a portion of the metallic barrier layer 46A and a portion of the metallic fill material layer 46B that are located between a vertically neighboring pair of dielectric material layers such as a pair of insulating layers 32. The continuous metallic material layer 46L includes a continuous portion of the metallic barrier layer 46A and a continuous portion of the metallic fill material layer 46B that are located in the backside trenches 79 or above the contact level dielectric layer 73.

Each sacrificial material layer 42 can be replaced with an electrically conductive layer 46. A backside cavity 79' is present in the portion of each backside trench 79 that is not filled with the backside blocking dielectric layer 44 and the continuous metallic material layer 46L. A tubular dielectric spacer 116 laterally surrounds a pedestal channel portion 11. A bottommost electrically conductive layer 46 laterally surrounds each tubular dielectric spacer 116 upon formation of the electrically conductive layers 46.

Figure 10A:
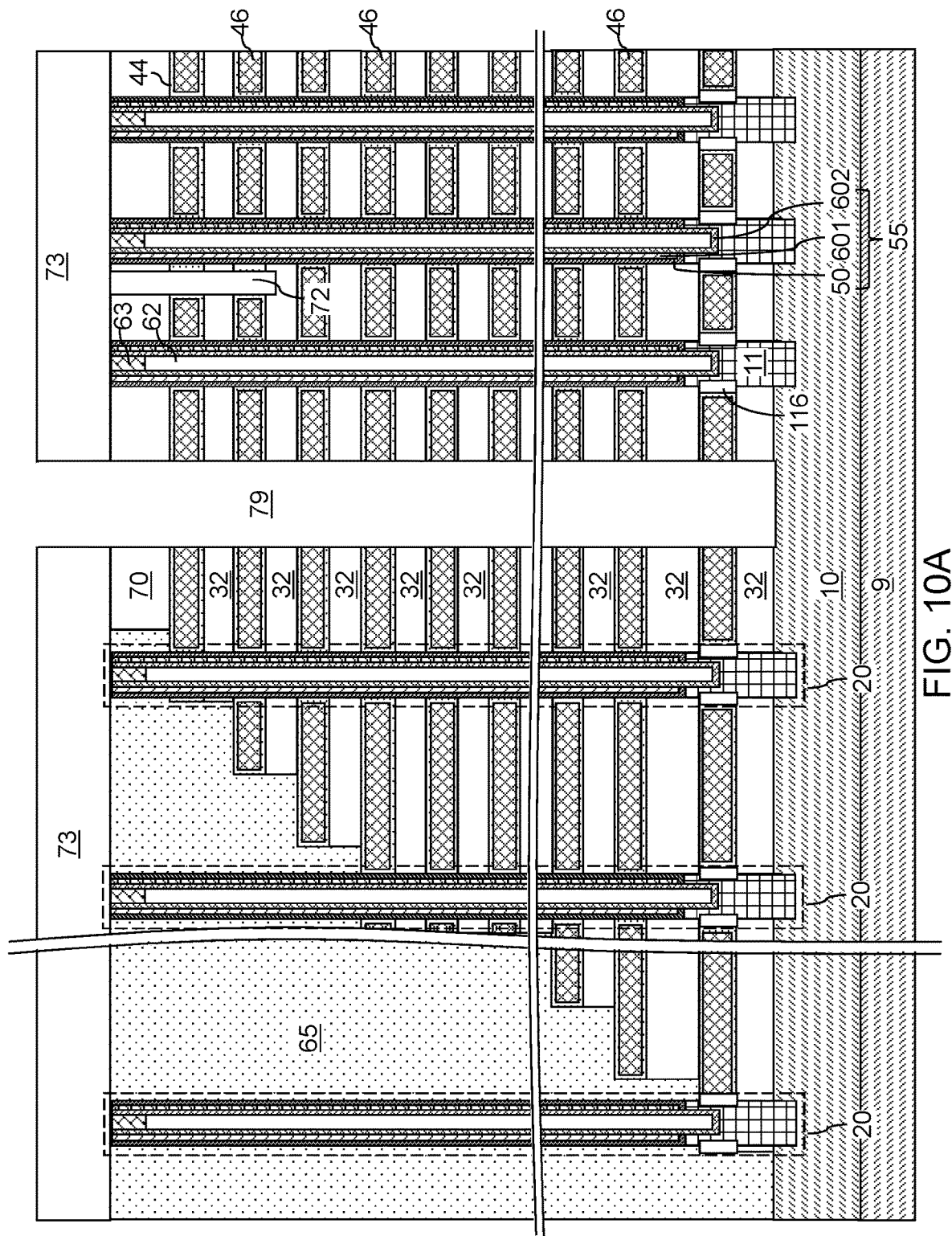
FIG. 10A is a schematic vertical cross-sectional view of the exemplary structure after removal of a deposited conductive material from within the backside trench according to an embodiment of the present disclosure.
Figure 10B:
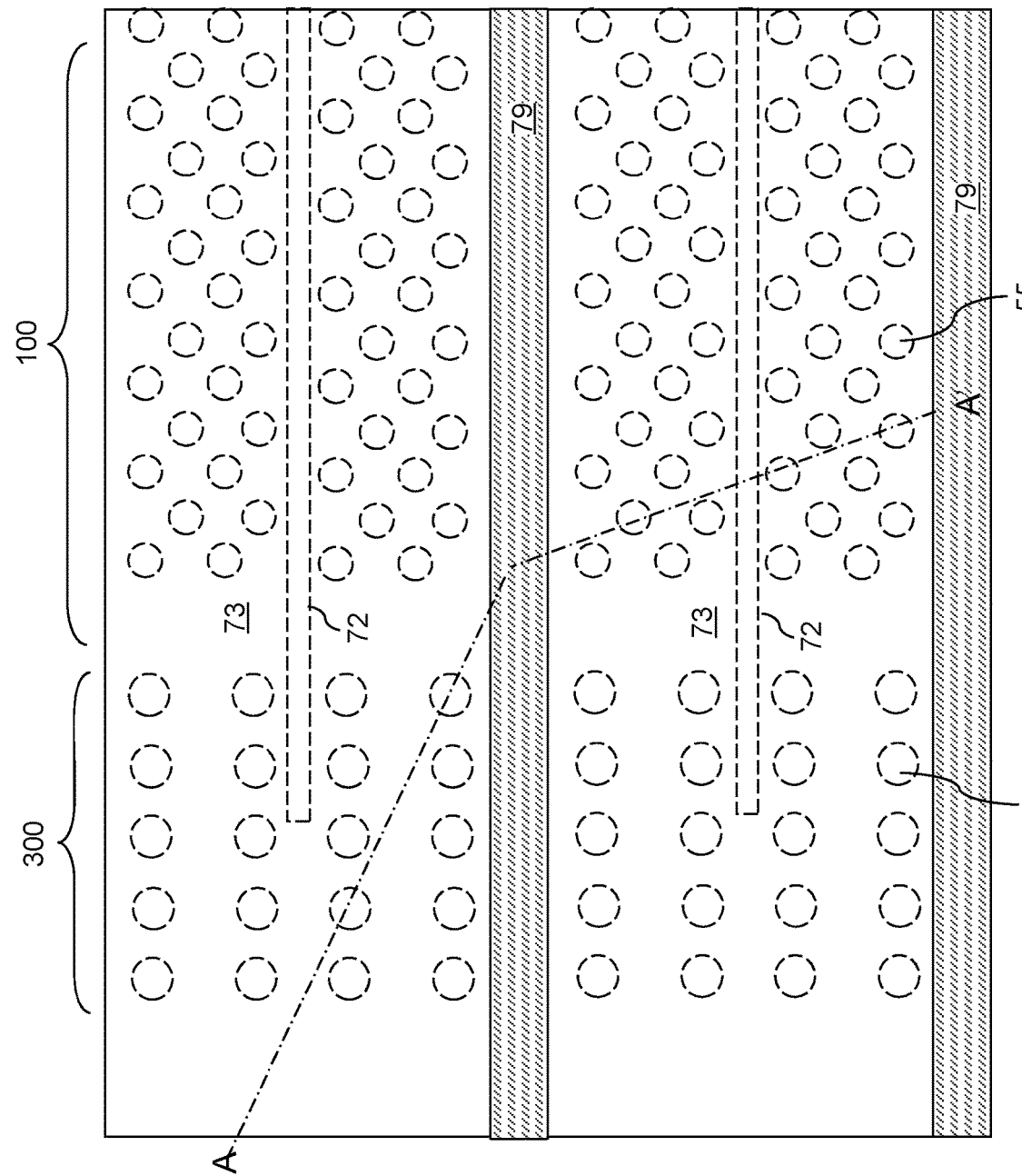
FIG. 10B is a top-down view of the exemplary structure of FIG. 10A.

Referring to FIGS. 10A and 10B, the deposited metallic material of the continuous electrically conductive material layer 46L is etched back from the sidewalls of each backside trench 79 and from above the contact level dielectric layer 73, for example, by an isotropic wet etch, an anisotropic dry etch, or a combination thereof. Each remaining portion of the deposited metallic material in the backside recesses 43 constitutes an electrically conductive layer 46. Each electrically conductive layer 46 can be a conductive line structure. Thus, the sacrificial material layers 42 are replaced with the electrically conductive layers 46.

Each electrically conductive layer 46 can function as a combination of a plurality of control gate electrodes located at a same level and a word line electrically interconnecting, i.e., electrically connecting, the plurality of control gate electrodes located at the same level. The plurality of control gate electrodes within each electrically conductive layer 46 are the control gate electrodes for the vertical memory devices including the memory stack structures 55. In other words, each electrically conductive layer 46 can be a word line that functions as a common control gate electrode for the plurality of vertical memory devices.

In one embodiment, the removal of the continuous electrically conductive material layer 46L can be selective to the material of the backside blocking dielectric layer 44. In this case, a horizontal portion of the backside blocking dielectric layer 44 can be present at the bottom of each backside trench 79. In another embodiment, the removal of the continuous electrically conductive material layer 46L may not be selective to the material of the backside blocking dielectric layer 44 or, the backside blocking dielectric layer 44 may not be used. The planar dielectric portions 616 can be removed during removal of the continuous electrically conductive material layer 46L. A backside cavity 79' is present within each backside trench 79.

Figure 11B:
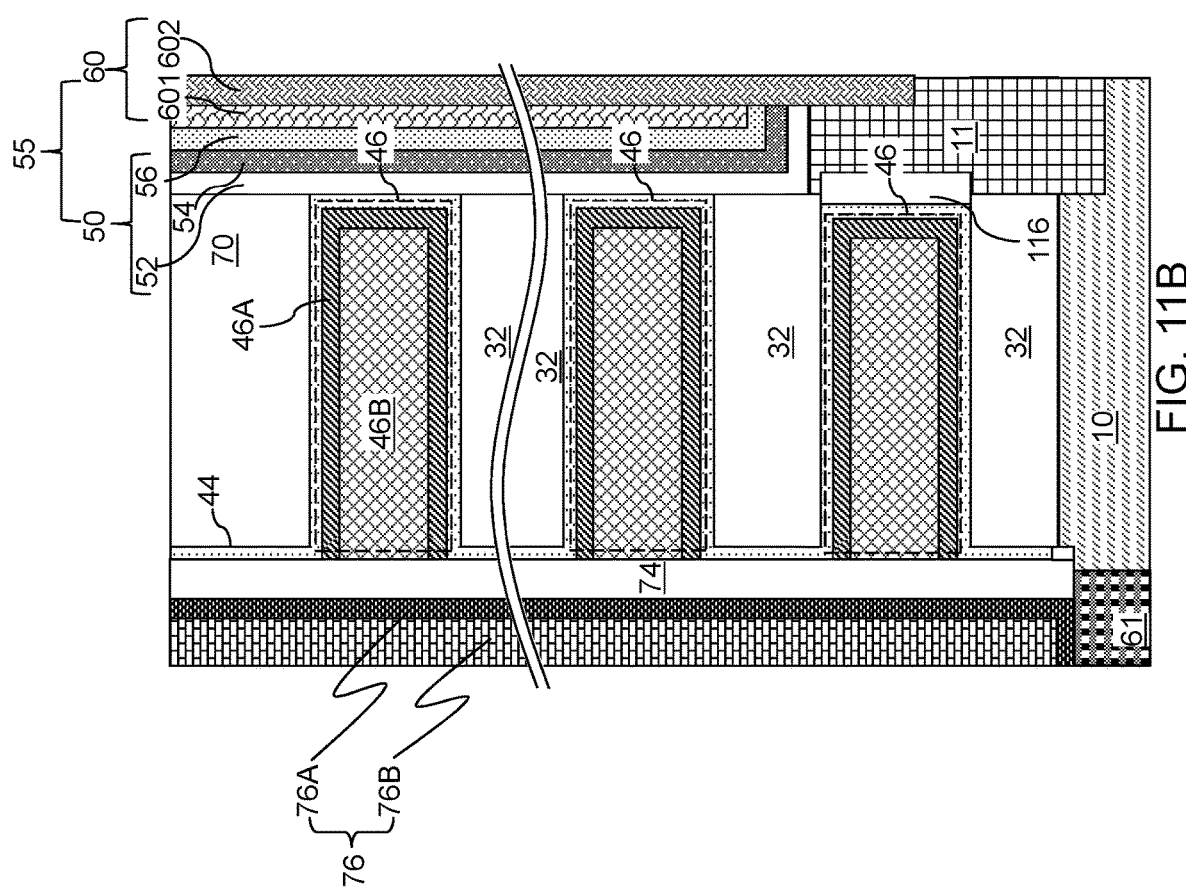
FIG. 11B is a magnified view of a region of the exemplary structure of FIG. 11A.

Referring to FIGS. 11A and 11B, an insulating material layer can be formed in the backside trenches 79 and over the contact level dielectric layer 73 by a conformal deposition process. Exemplary conformal deposition processes include, but are not limited to, chemical vapor deposition and atomic layer deposition. The insulating material layer includes an insulating material such as silicon oxide, silicon nitride, a dielectric metal oxide, an organosilicate glass, or a combination thereof. In one embodiment, the insulating material layer can include silicon oxide. The insulating material layer can be formed, for example, by low pressure chemical vapor deposition (LPCVD) or atomic layer deposition (ALD). The thickness of the insulating material layer can be in a range from 1.5 nm to 60 nm, although lesser and greater thicknesses can also be used.

If a backside blocking dielectric layer 44 is present, the insulating material layer can be formed directly on surfaces of the backside blocking dielectric layer 44 and directly on the sidewalls of the electrically conductive layers 46. If a backside blocking dielectric layer 44 is not used, the insulating material layer can be formed directly on sidewalls of the insulating layers 32 and directly on sidewalls of the electrically conductive layers 46.

An anisotropic etch is performed to remove horizontal portions of the insulating material layer from above the contact level dielectric layer 73 and at the bottom of each backside trench 79. Each remaining portion of the insulating material layer constitutes an insulating spacer 74. A backside cavity 79' is present within a volume surrounded by each insulating spacer 74. A top surface of the semiconductor material layer 10 can be physically exposed at the bottom of each backside trench 79.

A source region 61 can be formed at a surface portion of the semiconductor material layer 10 under each backside cavity 79' by implantation of electrical dopants into physically exposed surface portions of the semiconductor material layer 10. Each source region 61 is formed in a surface portion of the substrate (9, 10) that underlies a respective opening through the insulating spacer 74. Due to the straggle of the implanted dopant atoms during the implantation process and lateral diffusion of the implanted dopant atoms during a subsequent activation anneal process, each source region 61 can have a lateral extent greater than the lateral extent of the opening through the insulating spacer 74.

An upper portion of the semiconductor material layer 10 that extends between the source region 61 and the plurality of pedestal channel portions 11 constitutes a horizontal semiconductor channel 59 for a plurality of field effect transistors. The horizontal semiconductor channel 59 is connected to multiple vertical semiconductor channels 60 through respective pedestal channel portions 11. The horizontal semiconductor channel 59 contacts the source region 61 and the plurality of pedestal channel portions 11. A bottommost electrically conductive layer 46 provided upon formation of the electrically conductive layers 46 within the alternating stack (32, 46) can comprise a select gate electrode for the field effect transistors. Each source region 61 is formed in an upper portion of the semiconductor substrate (9, 10). Semiconductor channels (59, 11, 60) extend between each source region 61 and a respective set of drain regions 63. The semiconductor channels (59, 11, 60) include the vertical semiconductor channels 60 of the memory stack structures 55.

A backside contact via structure 76 can be formed within each backside cavity 79'. Each contact via structure 76 can fill a respective cavity 79'. The contact via structures 76 can be formed by depositing at least one conductive material in the remaining unfilled volume (i.e., the backside cavity 79') of the backside trench 79. For example, the at least one conductive material can include a conductive liner 76A and a conductive fill material portion 76B. The conductive liner 76A can include a conductive metallic liner such as TiN, TaN, WN, TiC, TaC, WC, an alloy thereof, or a stack thereof.

The thickness of the conductive liner 76A can be in a range from 3 nm to 30 nm, although lesser and greater thicknesses can also be used. The conductive fill material portion 76B can include a metal or a metallic alloy. For example, the conductive fill material portion 76B can include W, Cu, Al, Co, Ru, Ni, an alloy thereof, or a stack thereof.

The at least one conductive material can be planarized using the contact level dielectric layer 73 overlying the alternating stack (32, 46) as a stopping layer. If chemical mechanical planarization (CMP) process is used, the contact level dielectric layer 73 can be used as a CMP stopping layer. Each remaining continuous portion of the at least one conductive material in the backside trenches 79 constitutes a backside contact via structure 76.

The backside contact via structure 76 extends through the alternating stack (32, 46), and contacts a top surface of the source region 61. If a backside blocking dielectric layer 44 is used, the backside contact via structure 76 can contact a sidewall of the backside blocking dielectric layer 44.

Figure 12A:
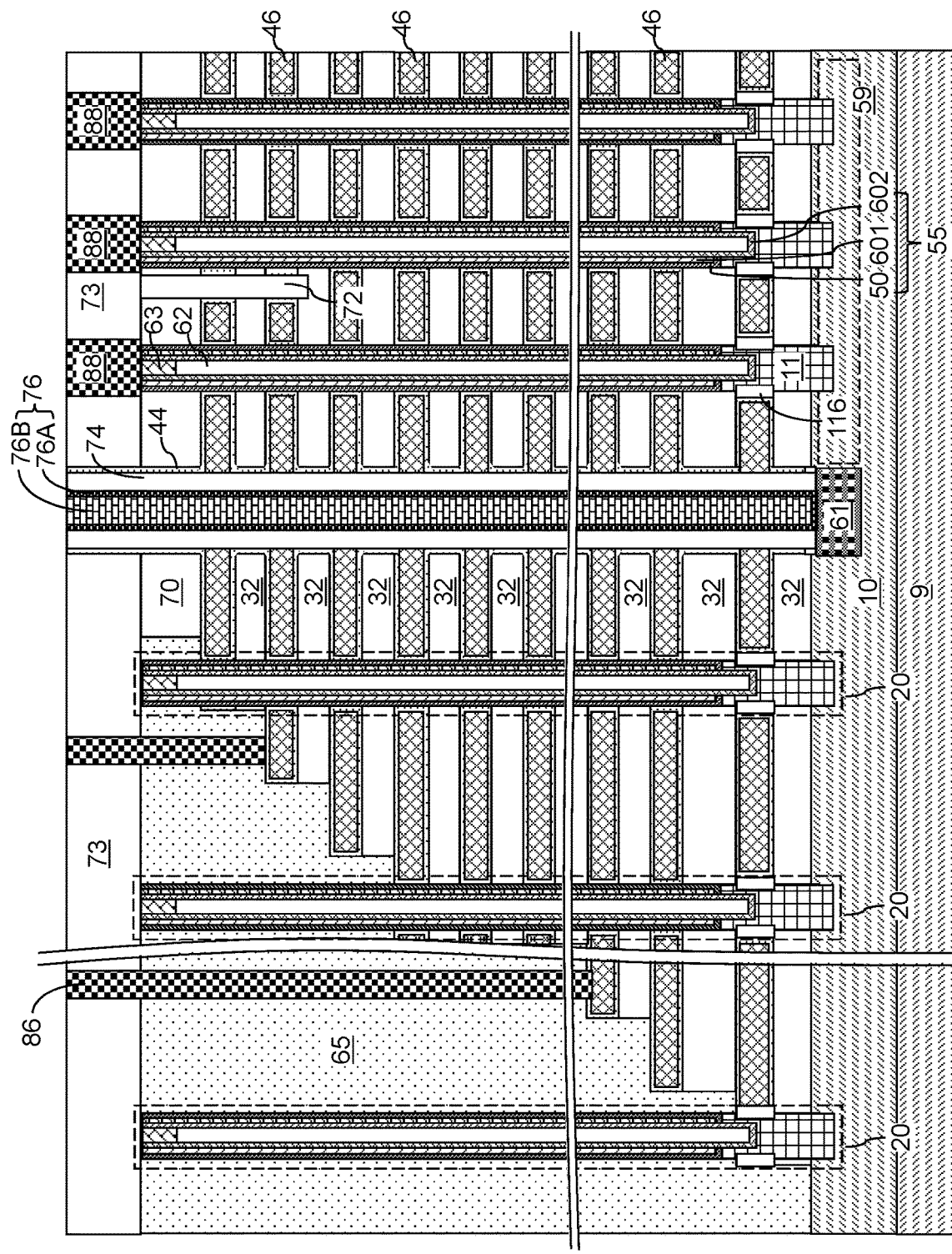
FIG. 12A is a schematic vertical cross-sectional view of the exemplary structure after formation of additional contact via structures according to an embodiment of the present disclosure.
Figure 12B:
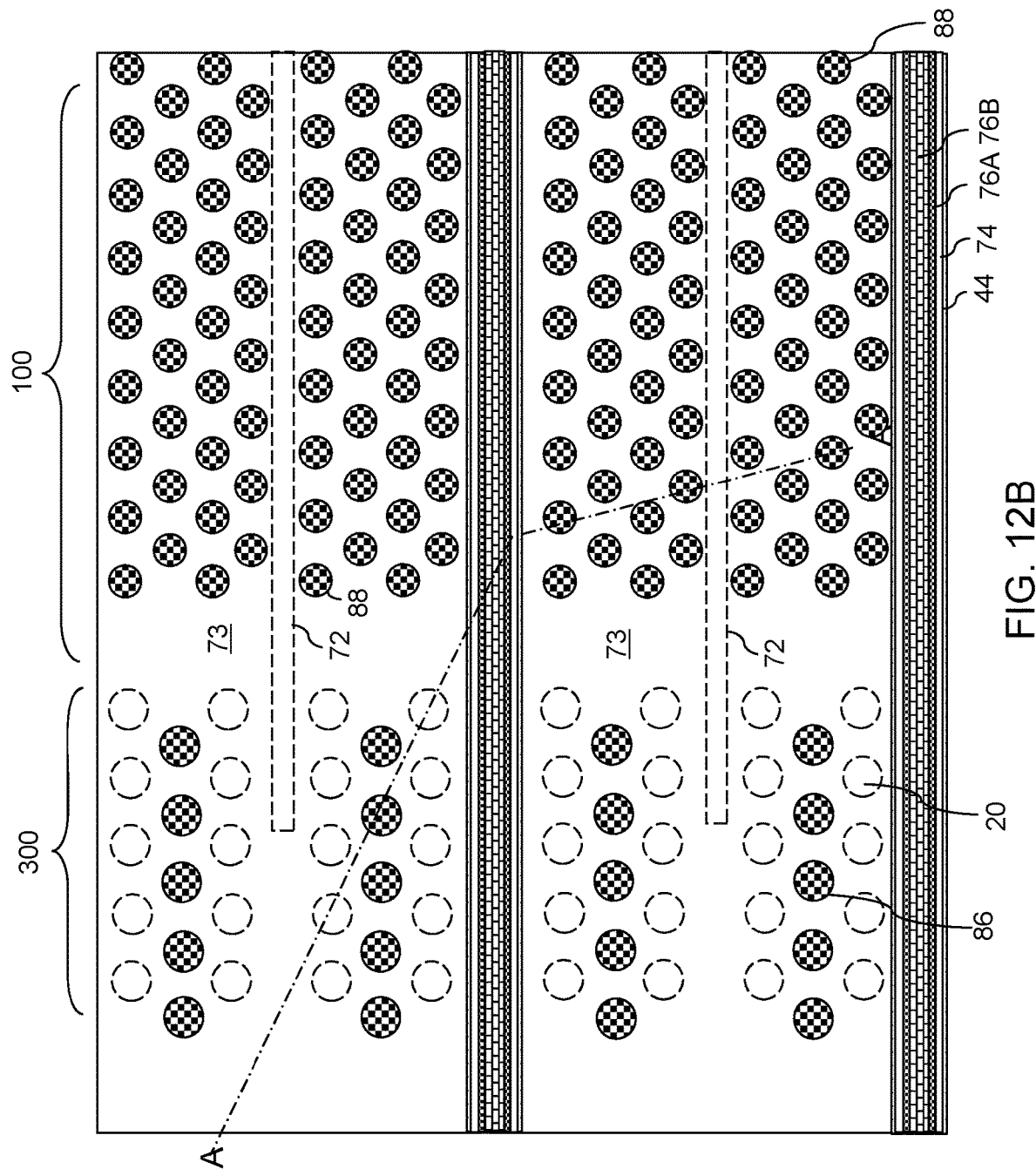
FIG. 12B is a top-down view of the exemplary structure of FIG. 12A. The vertical plane A-A' is the plane of the schematic vertical cross-sectional view of FIG. 12A.

Referring to FIGS. 12A and 12B, additional contact via structures (88, 86) can be formed through the contact level dielectric layer 73, and optionally through the retro-stepped dielectric material portion 65. For example, drain contact via structures 88 can be formed through the contact level dielectric layer 73 on each drain region 63. Word line contact via structures 86 can be formed on the electrically conductive layers 46 through the contact level dielectric layer 73, and through the retro-stepped dielectric material portion 65.

Figure 13A:
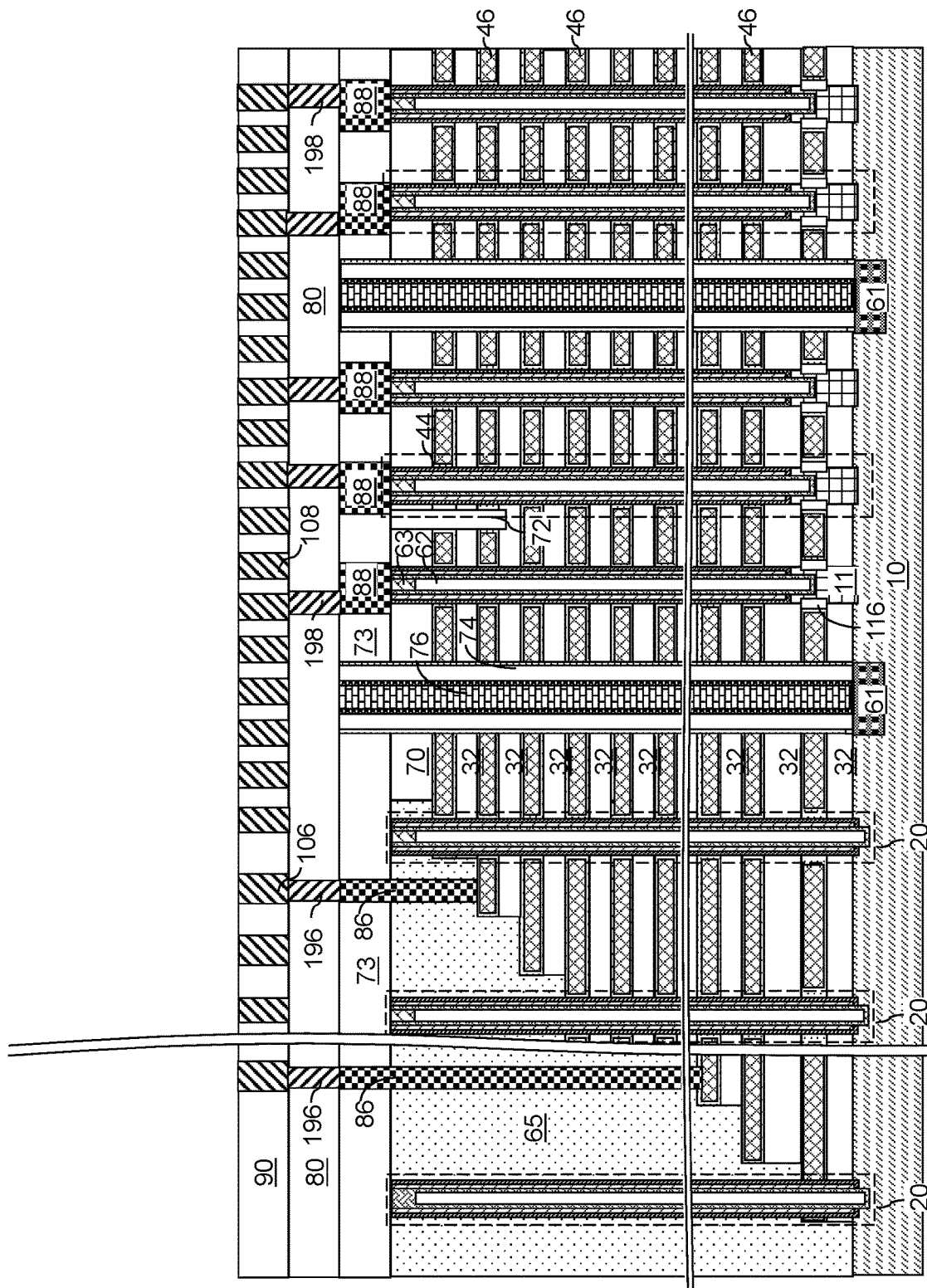
FIG. 13A is a schematic vertical cross-sectional view of the exemplary structure after formation of conductive via structures and bit lines according to an embodiment of the present disclosure.
Figure 13B:
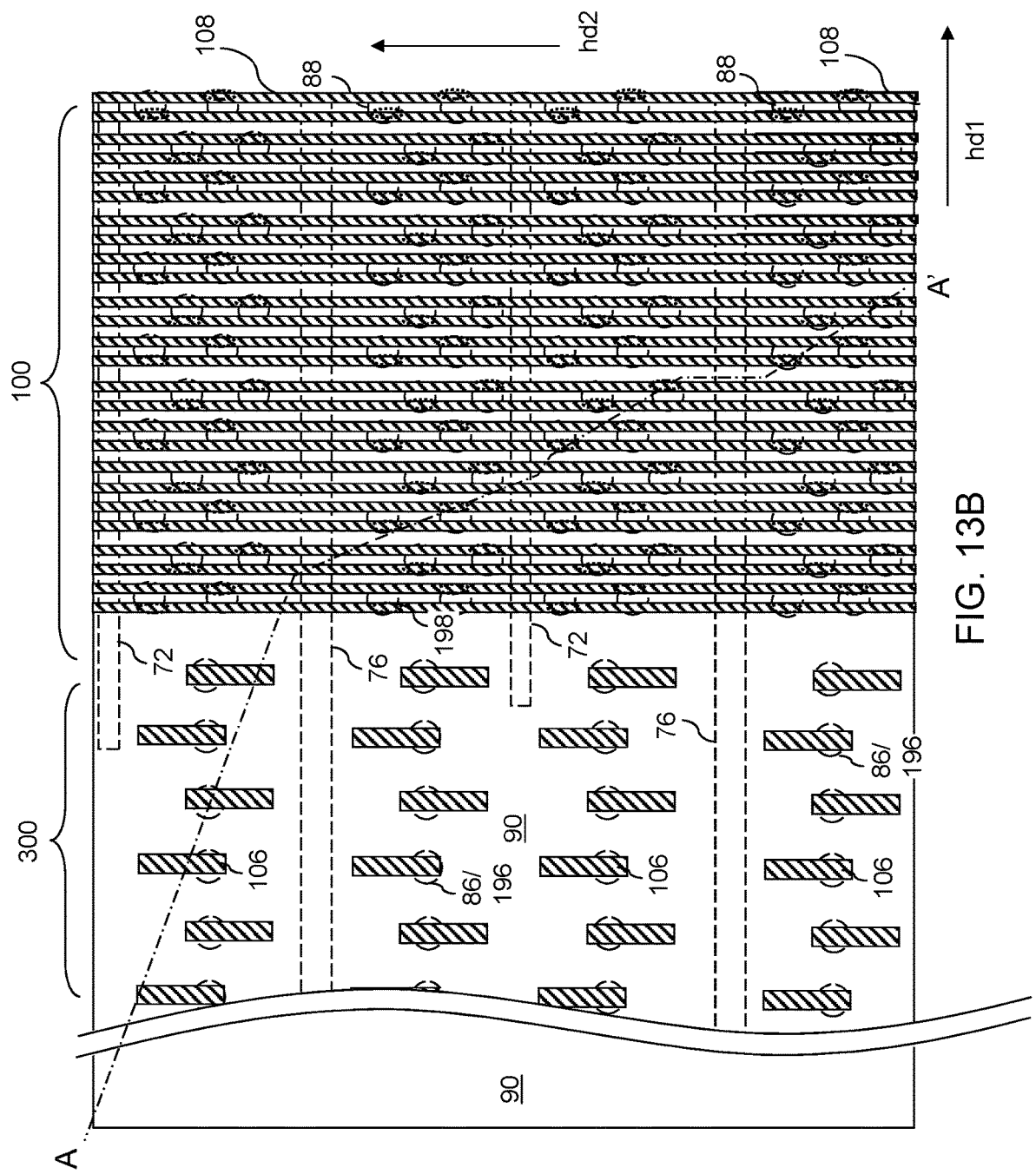
FIG. 13B is a top-down view of the exemplary structure of FIG. 13A. The vertical plane A-A' is the plane of the schematic vertical cross-sectional view of FIG. 13A.

Referring to FIGS. 13A and 13B, a bit-line-connection level dielectric layer 80 can be formed over the contact level dielectric layer 73. The bit-line-connection level dielectric layer 80 can include silicate glass or organosilicate glass, and can have a thickness in a range from 100 nm to 500 nm, although lesser and greater thicknesses can also be used. Bit-line-connection via structures 198 and word-line-connection via structures 196 can be formed through the bit-line-connection level dielectric layer 80. Each bit-line-connection via structure 198 contacts a respective one of the drain contact via structures 88. Each bit-line-connection via structure 198 can be elongated along a bit line direction. Each word-line-connection via structure 196 contacts a respective one of the word line contact via structures 86.

A bit-line-level dielectric layer 90 can be formed over the bit-line-connection level dielectric layer 80. The bit-line-level dielectric layer 90 can include silicate glass or organosilicate glass, and can have a thickness in a range from 100 nm to 500 nm, although lesser and greater thicknesses can also be used. Bit lines 108 and word-line-connection line structures 106 can be formed through the bit-line-level dielectric layer 90. Each bit line 108 contacts a respective set of bit-line-connection via structures 198. The bit lines 108 can laterally extend along the second horizontal direction hd2, and can be laterally spaced apart along the first horizontal direction hd1. Each word-line-connection line structure 106 contacts a respective one of the word-line-connection via structure 196.

Conductive via structures including the drain contact via structures 88 and the bit-line-connection via structures 198 overlie the drain regions 63. In one embodiment, electrical connection paths between a drain region 63 and a bit line 108 can include a subset of the conductive via structures (88, 198), such as a combination of a drain contact via structure 88 and a bit-line-connection via structure 198. The bit lines 108 are electrically connected to an end portion of a respective one of the vertical semiconductor channels 60 via a respective drain region 63 and a respective set of conductive via structures (88, 198). In one embodiment, the bit lines 108 comprise a one-dimensional periodic array of metal lines that laterally extend along a lengthwise direction (such as the second horizontal direction hd2) and are laterally spaced apart along a widthwise direction (such as the first horizontal direction) with a uniform pitch, which can be a center-to-center distance between a neighboring pair of bit lines 108 along the first horizontal direction hd1.

Referring to FIGS. 14A-14D, a bump-connection-level dielectric layer 130 can be formed over the bit lines 108. Bump connection via structures 128 are formed through the bump-connection-level dielectric layer 130 directly on a respective one of the bit lines 108. Each of the bump connection via structures 128 has a greater lateral dimension along a lengthwise direction of the bit lines 108 (such as the second horizontal direction hd2) than along a widthwise direction (such as the first horizontal direction hd1) of the bit lines 108. In one embodiment, the bump connection via structures have a length-to-width ratio of greater than 2, such as in a range from 3 to 30, although lesser or greater ratio is also possible.

Metallic bump structures 180 can be formed over, and directly on, a respective one of the bump connection via structures 128 after, or concurrently with, formation of the bump connection via structures 128. The metallic bump structures 180 can be formed above or within the bump-connection-level dielectric layer 130. In one embodiment, each of the metallic bump structures 180 comprises a solder material portion. In one embodiment, each the metallic bump structure 180 can comprise an under-bump metallization (UBM) layer stack contacting a respective one of the solder material portions and a respective one of the bump connection via structures 128.

Figure 15A:
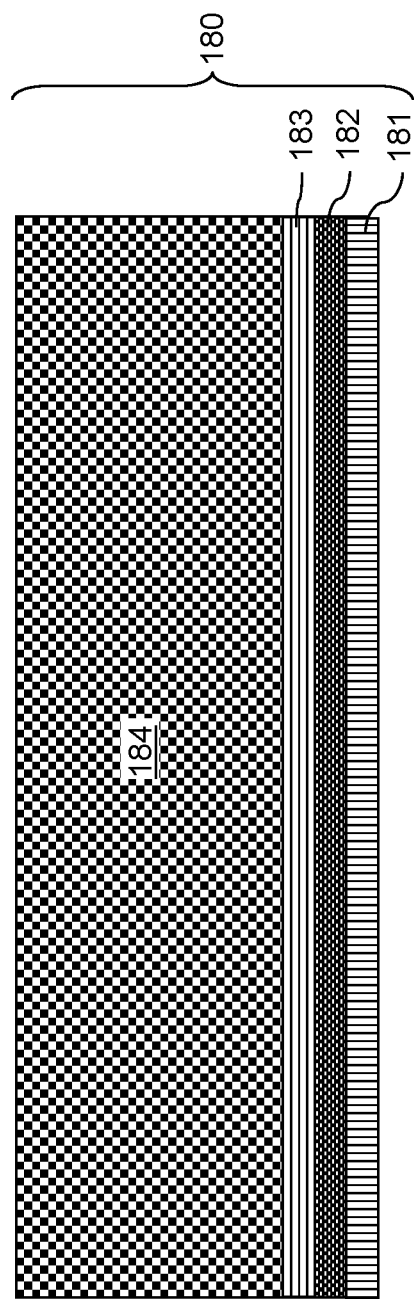
FIG. 15A-15D are vertical cross-sectional views of various configurations of the metallic bump structures according to embodiments of the present disclosure.
Figure 15B:
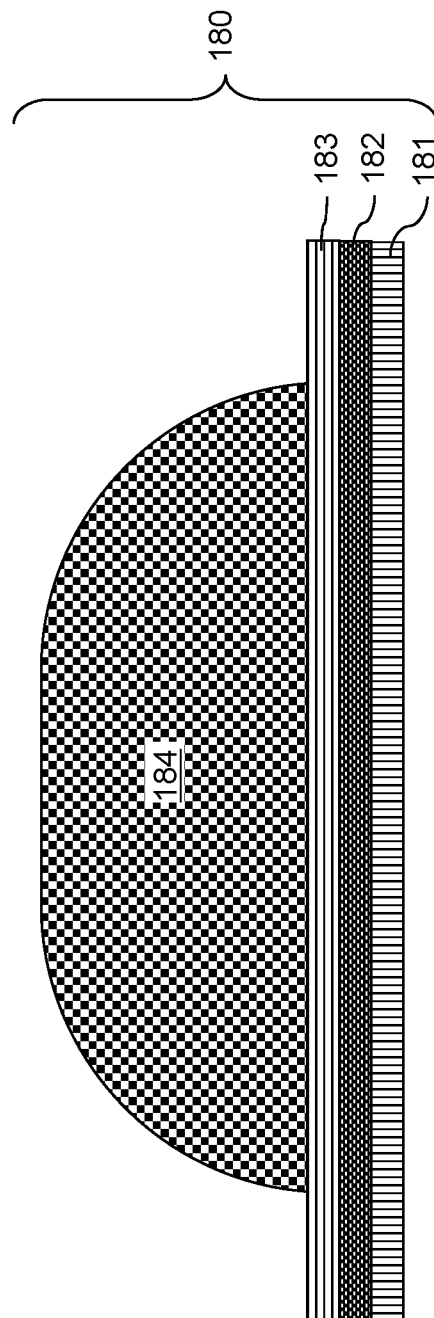
Figure 15C:
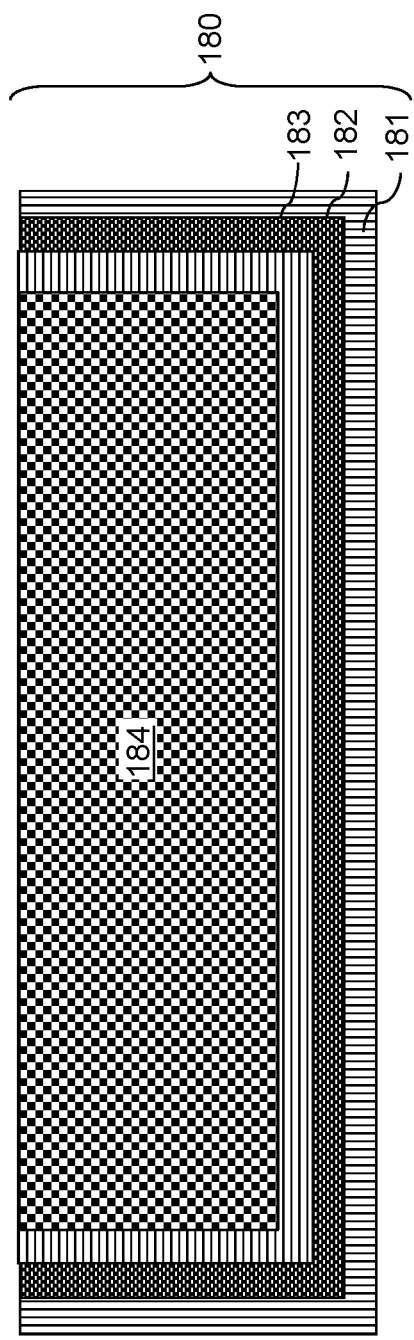
Figure 15D:
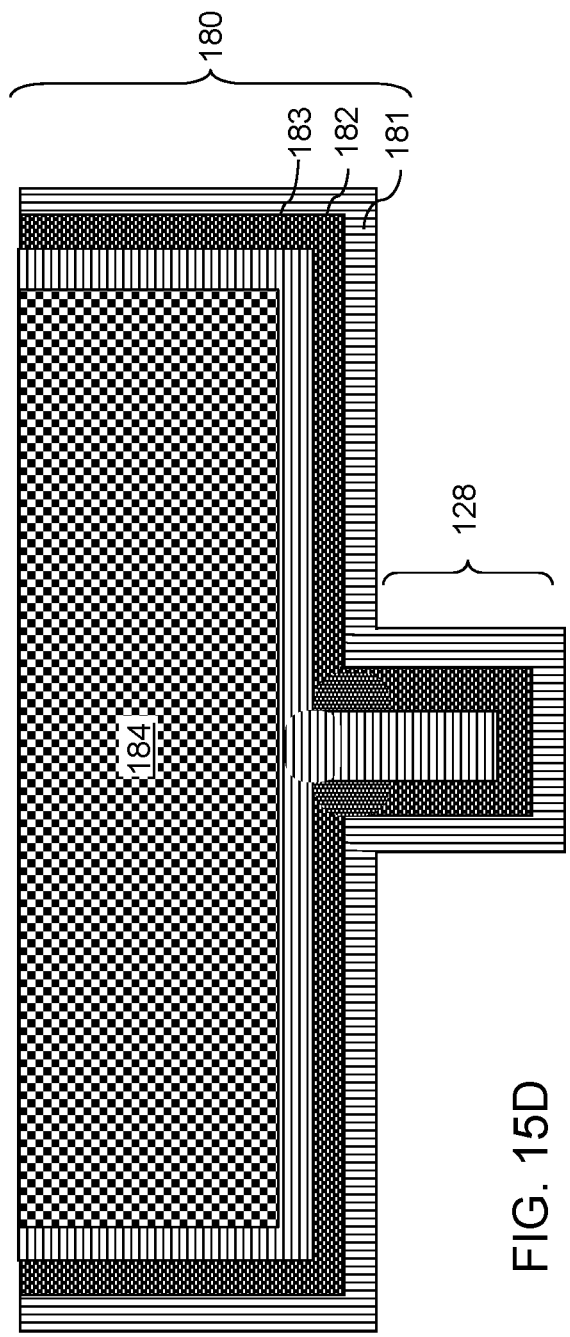

Referring to FIG. 15A-15D, various configurations of the metallic bump structures 180 are illustrated. Generally, a metallic bump structure 180 can include an UBM layer stack (181, 182, 183) and a solder material portion 184. The UBM layer stack (181, 182, 183) includes at least two metallic barrier material layers, such as two, three, or four metallic barrier material layers. In one embodiment, the UBM layer stack (181, 182, 183) can include a first metallic barrier material layer 181, a second metallic barrier material layer 182, and a third metallic barrier material layer 183. A solder material portion 184 can be formed on top of each UBM layer stack (181, 182, 183). In some embodiments, each of the metallic bump structures 180 can include a planar top surface and a planar bottom surface that are parallel to planar surfaces of the insulating layers 32 and the electrically conductive layers 46 within the alternating stack (32, 46). Alternatively, the solder material portions 184 can have a generally hemispherical shape as shown in FIG. 15B. Methods for forming the UBM layer stacks (181, 182, 183) and the solder material portions 184 are described herebelow according to various embodiments of the present disclosure. Various compositions can be used for each UBM layer stack (181, 182, 183) and the solder material portions 184.

In illustrative examples, the solder material portions 184 of the metallic bump structures 180 can include a metal selected from gold, a lead-tin alloy, and a tin-silver-copper alloy. In case the solder material portions 184 of the metallic bump structures 180 include gold, the UBM layer stack (181, 182, 183) of the metallic bump structures 180 can include a stack of a titanium-tungsten layer and a gold layer, or a stack of titanium layer and a gold layer. In case the solder material portions 184 of the metallic bump structures 180 include a lead-tin alloy or a tin-silver-copper alloy, the UBM layer stack (181, 182, 183) of the metallic bump structures 180 can include a stack of a titanium layer and a copper layer; a titanium-tungsten layer and a copper layer; an aluminum layer, a nickel-vanadium layer, and a copper layer; or a chromium layer, a chromium-copper layer, and a copper layer. Alternatively, the metallic bump structures 180 may be configured for copper-to-copper bonding. In this case, the metallic bump structures 180 include copper portions having planar top surfaces. Optionally, the metallic bump structures 180 may also include any suitable copper barrier material.

Figure 16:
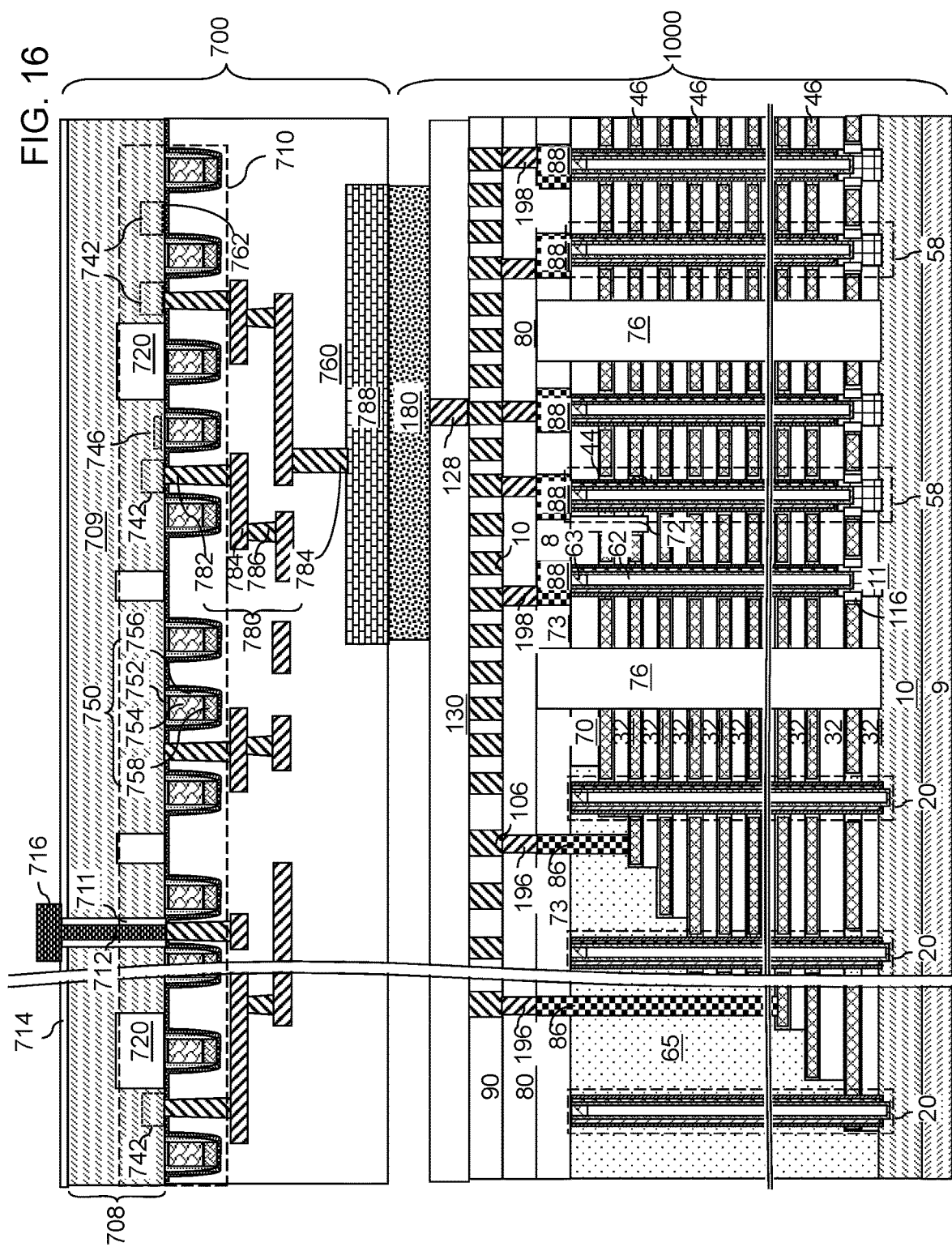
FIG. 16 is a vertical cross-sectional view of the exemplary structure after bonding the memory die of FIGS. 14A-14D to a logic die including a peripheral circuitry according to an embodiment of the present disclosure.

Referring to FIG. 16, an exemplary structure includes a memory die 1000 including a three-dimensional array of memory elements. A logic die 700 including various semiconductor devices 710 is provided. The semiconductor devices 710 includes a peripheral circuitry for operation of the three-dimensional memory arrays in the memory die 1000. The peripheral circuitry can include a word line driver that drives the electrically conductive layers 46 within the memory die 1000, a bit line driver that drives the bit lines 108 in the memory die 1000, a word line decoder circuitry that decodes the addresses for the electrically conductive layers 46, a bit line decoder circuitry that decodes the addresses for the bit lines 108, a sense amplifier circuitry that senses the states of memory elements within the memory stack structures 55 in the memory die 1000, a power supply/distribution circuitry that provides power to the memory die 1000, a data buffer and/or latch, or any other semiconductor circuitry that can be used to operate the array of memory stack structures 58 in the memory die 1000.

The logic die 700 can include a logic-die substrate 708, which can be a semiconductor substrate. The logic-die substrate can include a substrate semiconductor layer 709. The substrate semiconductor layer 709 may be a semiconductor wafer or a semiconductor material layer, and can include at least one elemental semiconductor material (e.g., single crystal silicon wafer or layer), at least one III-V compound semiconductor material, at least one II-VI compound semiconductor material, at least one organic semiconductor material, or other semiconductor materials known in the art.

Shallow trench isolation structures 720 can be formed in an upper portion of the substrate semiconductor layer 709 to provide electrical isolation among semiconductor devices (e.g., transistors) of the sense amplifier circuitry and other circuitry. The various semiconductor devices 710 can include field effect transistors, which include respective transistor active regions 742 (i.e., source regions and drain regions), a channel 746, and a gate structure 750. The field effect transistors may be arranged in a CMOS configuration. Each gate structure 750 can include, for example, a gate dielectric 752, a gate electrode 754, a dielectric gate spacer 756 and a gate cap dielectric 758. For example, the semiconductor devices 710 can include word line drivers for electrically biasing word lines of the memory die 1000, which comprise the electrically conductive layers 46.

Dielectric material layers are formed over the semiconductor devices 710, which are herein referred to as logic-chip dielectric layers 760. Optionally, a dielectric liner 762 (such as a silicon nitride liner) can be formed to apply mechanical stress to the various field effect transistors and/or to prevent diffusion of hydrogen or impurities from the logic-chip dielectric layers 760 into the semiconductor devices 710. Logic-chip metal interconnect structures 780 are positioned within the logic-chip dielectric layers 760. The logic-chip metal interconnect structures 780 can include various device contact via structures 782 (e.g., source and drain electrodes which contact the respective source and drain nodes of the device or gate electrode contacts), interconnect-level metal line structures 784, interconnect-level metal via structures 786, and logic-side metallic bump structures 788 that are configured to function as bonding pads.

The logic die 700 can include a backside insulating layer 714 located on the backside surface of the logic die substrate 708. Laterally-insulated through-substrate via structures (711, 712) can be formed through the logic die substrate 708 to provide electrical contact to various input nodes and output nodes of the first and second periphery circuitries. Each laterally-insulated through-substrate via structure (711, 712) includes a through-substrate conductive via structure 712 and a tubular insulating liner 711 that laterally surrounds the through-substrate conductive via structure 712. Logic-side external bonding pads 716 can be formed on surface portions of the laterally-insulated through-substrate via structures (711, 712).

The memory die 1000 and the logic die 700 are positioned such that the logic-side metallic bump structures 788 of the logic die 700 face metallic bump structures 788 of the memory die 1000. In one embodiment, the memory die 1000 and the logic die 700 can be designed such that the pattern of the logic-side metallic bump structures 788 of the logic die 700 is the mirror pattern of the pattern of the metallic bump structures 180 of the memory die 1000. The memory die 1000 and the logic die 700 can be bonded to each other by metal-to-metal bonding. Alternatively, an array of solder material portions may be used to bond the memory die 1000 and the logic die 700 through the array of solder material portions (such as solder balls).

If the metallic bump structures 180 and the logic-side metallic bump structures 788 include solder materials, facing pairs of a metallic bump structure 180 of the memory die 1000 and a logic-side metallic bump structure 788 of the logic die 700 can be brought into direct contact with each other, and can be subjected to an elevated temperature to induce reflow of the materials of the metallic bump structures 180 and the logic-side metallic bump structures 788. Alternatively, the metallic bump structures 180 and the logic-side metallic bump structures 788 may be configured for copper-to-copper bonding. In this case, material diffusion across the interfaces between adjoined pairs of metallic pad structures (180, 788) can provide copper-to-copper bonding between the memory die 1000 and the logic die 700.

Figure 14A:
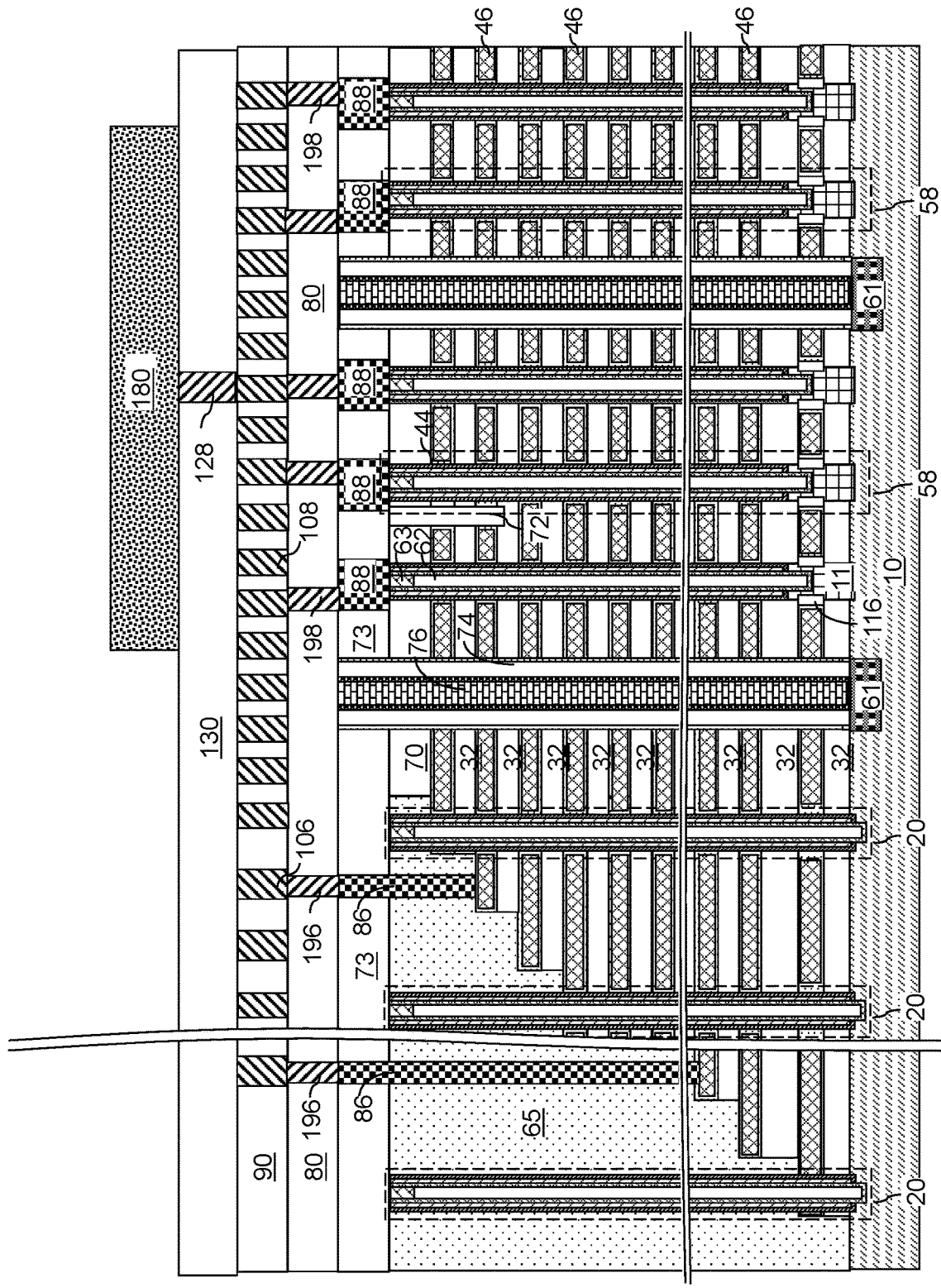
FIG. 14A is a schematic vertical cross-sectional view of the exemplary structure after formation of bump connection via structures and metallic bump structures according to an embodiment of the present disclosure.
Figure 14B:
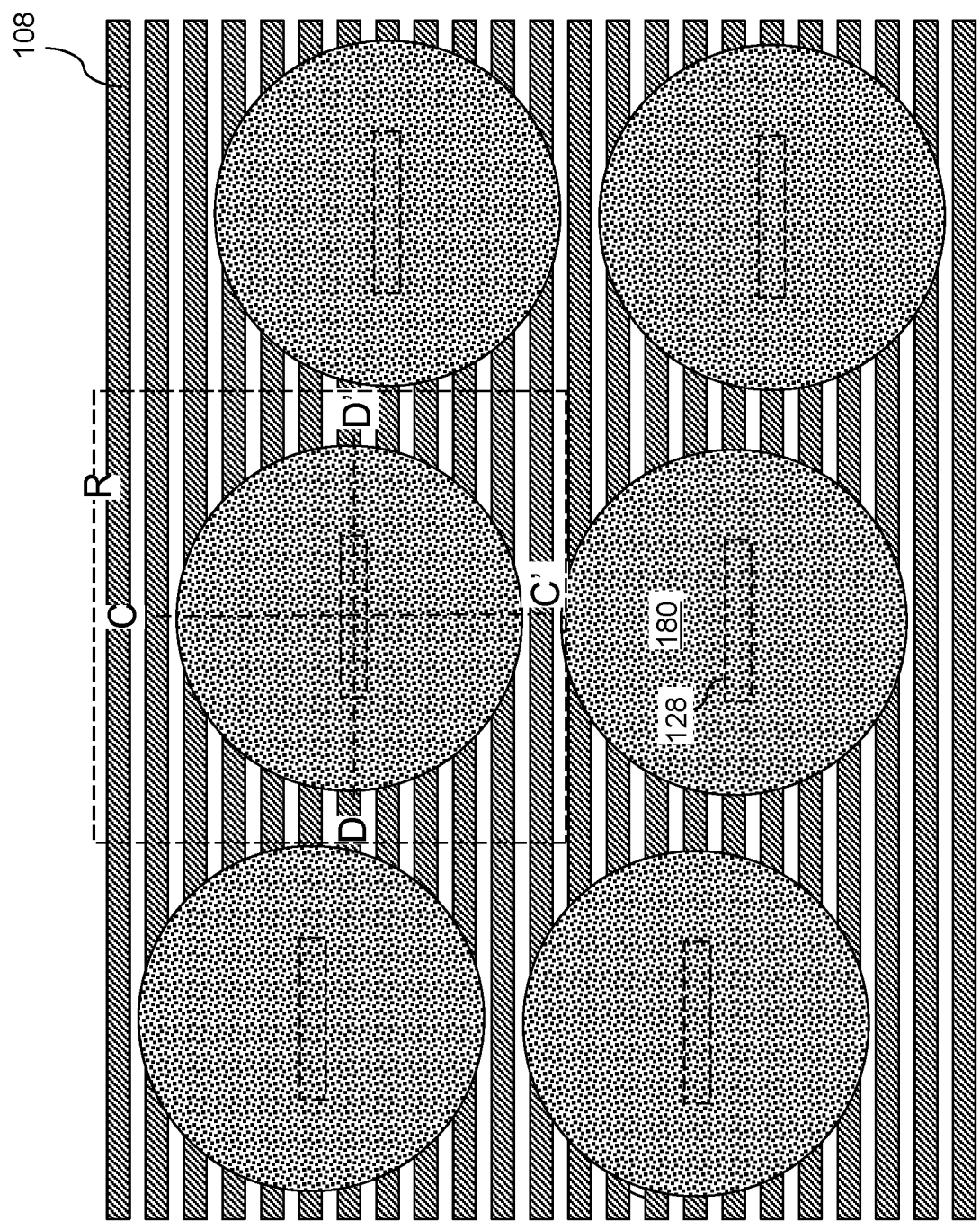
FIG. 14B is a top-down view of a region of the exemplary structure of FIG. 14A.

Referring to FIGS. 17A and 17B, a region of the exemplary structure corresponding to the region R in FIG. 14B is illustrated. A planar dielectric spacer layer 120 having a uniform thickness can be formed on the top surfaces of each of the bit lines 108. The planar dielectric spacer layer 120 includes a dielectric material that can be used as an etch stop layer during a subsequent anisotropic etch process. For example, the planar dielectric spacer layer 120 can include silicon nitride or a dielectric metal oxide such as aluminum oxide. The planar dielectric spacer layer 120 can have a thickness in a range from 5 nm to 30 nm, although lesser and greater thicknesses can also be used.

A bump-connection-level dielectric layer 130 having a uniform thickness can be formed over the planar dielectric spacer layer 120. The bump-connection-level dielectric layer 130 includes a dielectric material such as undoped silicate glass or a doped silicate glass. The thickness of the bump-connection-level dielectric layer 130 can be in a range from 60 nm to 600 nm, although lesser and greater thicknesses can also be used.

Figure 18A:
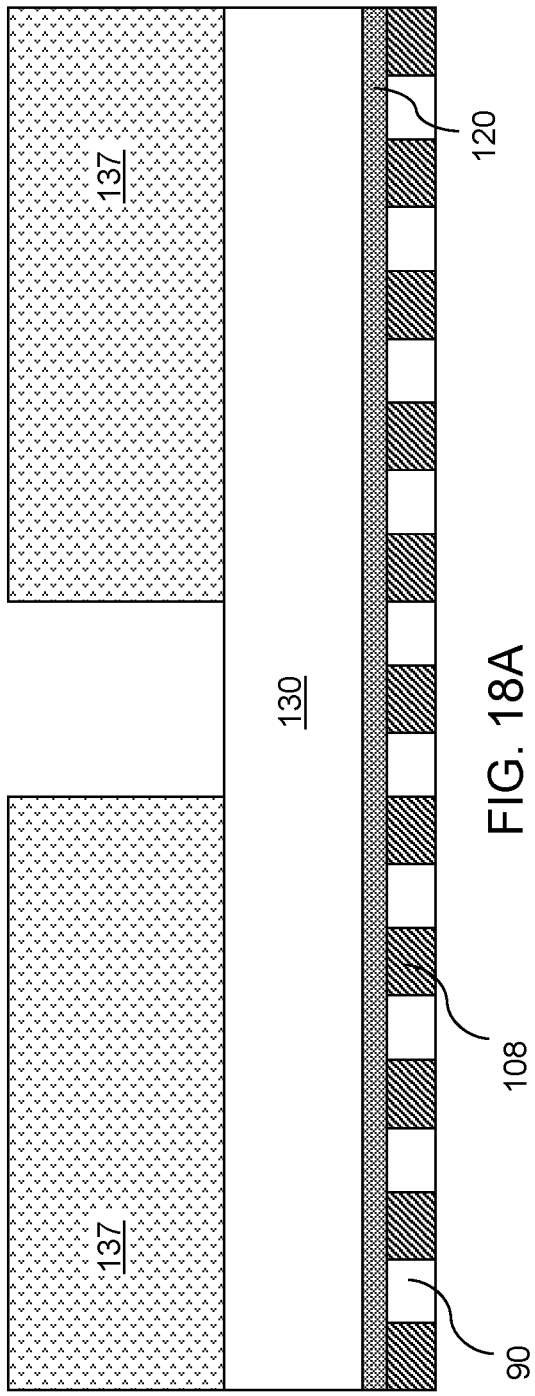
FIGS. 18A and 18B are vertical cross-sectional views of the first exemplary configuration of the region of the exemplary structure corresponding to the region R in FIG. 14B along vertical planes that correspond to the vertical planes C-C' and D-D' of FIG. 14B, respectively, after application and patterning a photoresist layer according to an embodiment of the present disclosure.
Figure 18B:
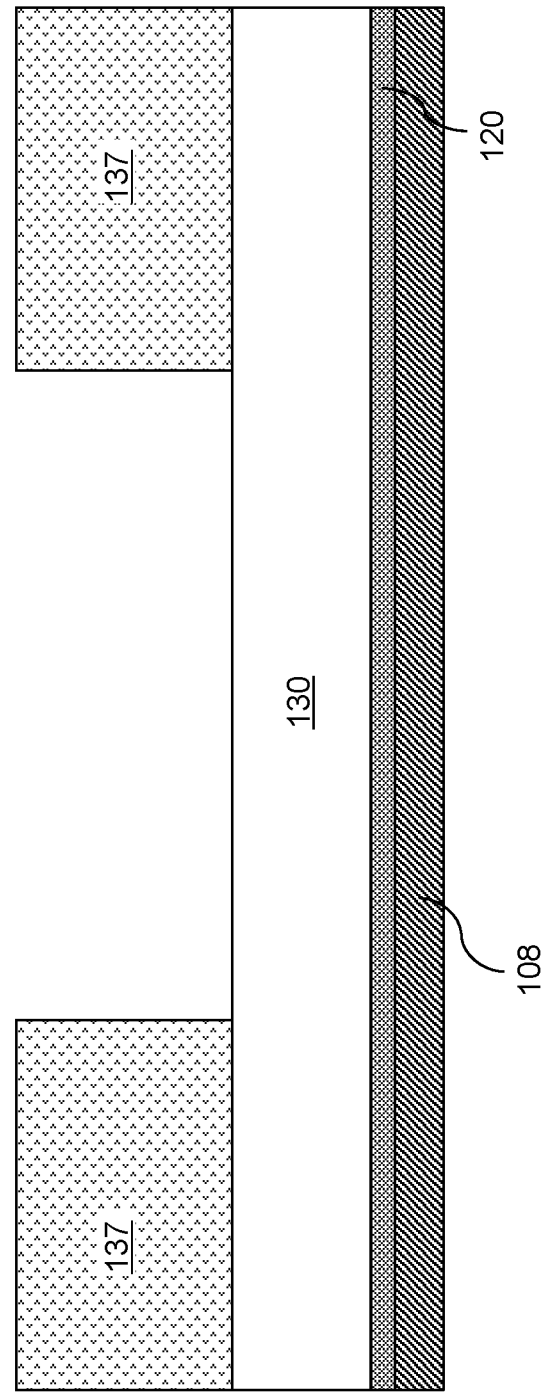

Referring to FIGS. 18A and 18B, a photoresist layer 137 can be applied over the bump-connection-level dielectric layer 130, and then lithographically patterned to form elongated openings. Each of the elongated openings can overlap with only a single one of the bit lines 108, and can laterally extend along the lengthwise direction of the bit lines 108. For example, the width of each elongated opening in the photoresist layer 137 can be less than the sum of the pitch of the bit lines 108 along the widthwise direction of the bit lines 108 (such as the first horizontal direction hd1) and the inter-bit-line spacing between a neighboring pair of bit lines 108, which is the same as the sum of the width of a bit line 108 and twice the inter-bit-line spacing between a neighboring pair of bit lines 108.

Referring to FIGS. 19A and 19B, an anisotropic etch process can be performed to transfer the pattern of the photoresist layer 137 through the bump-connection-level dielectric layer 130 and the planar dielectric spacer layer 120. The photoresist layer 137 is used as an etch mask during the anisotropic etch process. Elongated openings 119 are formed through the bump-connection-level dielectric layer 130 and the planar dielectric spacer layer 120 by the anisotropic etch process. In one embodiment, each of the elongated openings 119 may have a width that is greater than the uniform pitch of the bit lines 108. In this case, a top surface of a bit line 108 and two narrow strip areas of the top surface of the bit-line-level dielectric layer 90 can be physically exposed at the bottom of elongated opening 119.

Referring to FIGS. 20A and 20B, a conformal dielectric spacer layer 132L can be deposited at a periphery of each elongated opening 119 and over the bump-connection-level dielectric layer 130. The conformal dielectric spacer layer 132L has a thickness that is less than one half of the width of each bump connection cavity 129. In one embodiment, the conformal dielectric spacer layer 132L can have a thickness of about one half of the difference between the width of an elongated opening 119 and the width of a bit line 108. The conformal dielectric spacer layer 132L includes a dielectric material such as silicon oxide. Each remaining cavity of the elongated openings 119 that is not filled with the conformal dielectric spacer layer 132L is herein referred to as a bump connection cavity 129, which is laterally surrounded by the conformal dielectric spacer layer 132L and the bump-connection-level dielectric layer 130.

Figure 21A:
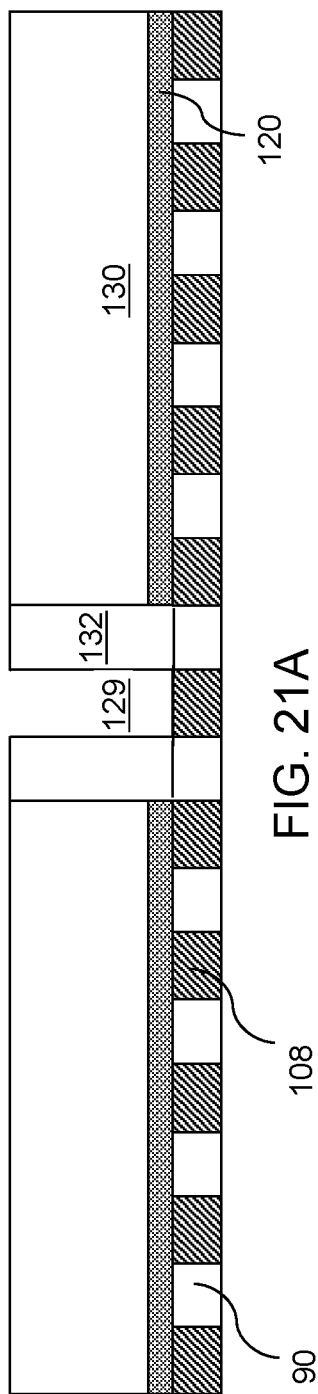
FIGS. 21A and 21B are vertical cross-sectional views of the first exemplary configuration of the region of the exemplary structure corresponding to the region R in FIG. 14B along vertical planes that correspond to the vertical planes C-C' and D-D' of FIG. 14B, respectively, after formation of annular dielectric spacers according to an embodiment of the present disclosure.
Figure 21B:
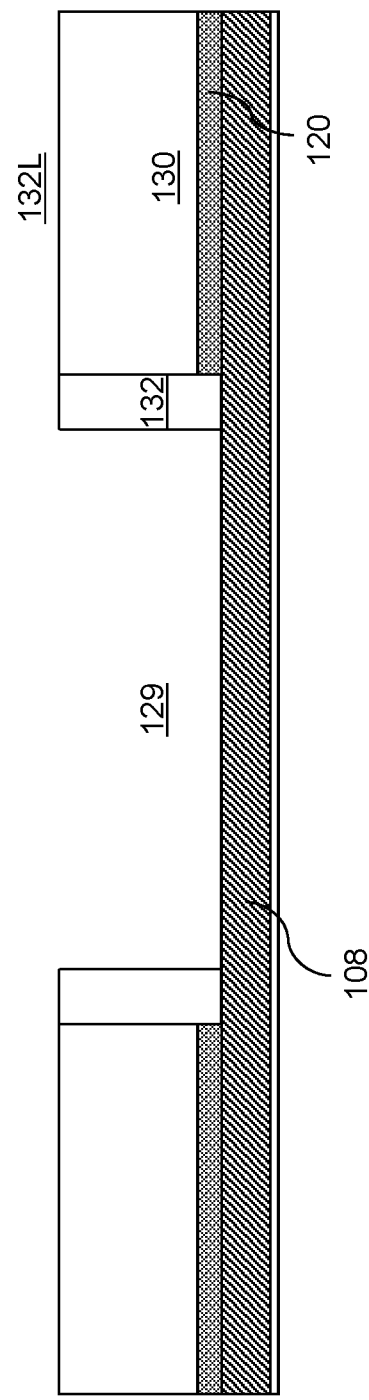

Referring to FIGS. 21A and 21B, an anisotropic etch process is performed to remove horizontal portions of the conformal dielectric spacer layer 132L. Each remaining cylindrical portion of the conformal dielectric spacer layer 132L in the elongated openings 119 in the bump-connection-level dielectric layer 130 constitutes an annular dielectric spacer 132. Each bump connection cavity 129 (i.e., each cavity that remains within the volumes of the elongated openings 119) has a respective width that is less than the uniform pitch of the bit lines 108. The width of each bump connection cavity 129 can be in a range from 75% to 125% of the width of a bit line 108.

Figure 22A:
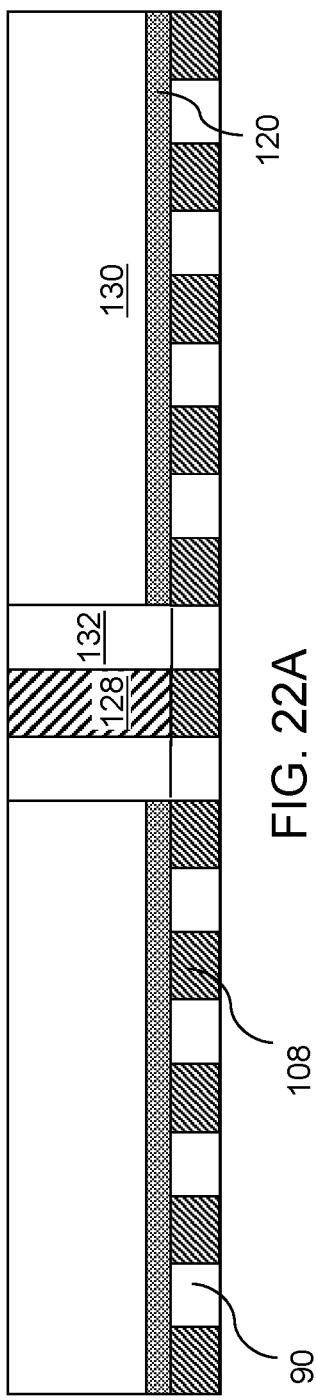
FIGS. 22A and 22B are vertical cross-sectional views of the first exemplary configuration of the region of the exemplary structure corresponding to the region R in FIG. 14B along vertical planes that correspond to the vertical planes C-C' and D-D' of FIG. 14B, respectively, after formation of bump connection via structures according to an embodiment of the present disclosure.
Figure 22B:
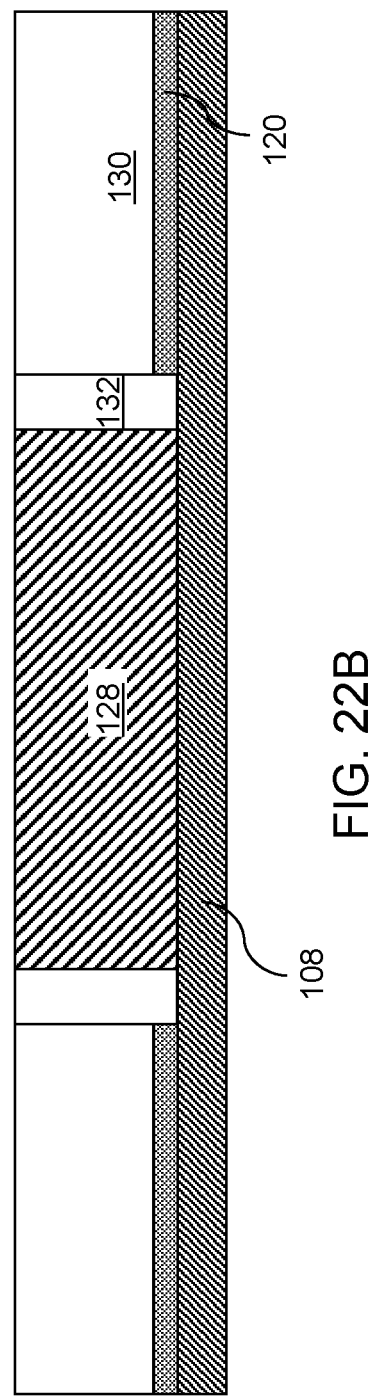

Referring to FIGS. 22A and 22B, at least one conductive material can be deposited in the bump connection cavities 129. The at least one conductive material can include, for example, a conductive metallic nitride (such as TiN, TaN, or WIN) or an elemental metal (such as copper or tungsten). In one embodiment, a combination of two or more materials, such as a metallic nitride liner or barrier material, such as TiN, and a metal fill material, such as copper, may be deposited in the bump cavities 129. Excess portions of the at least one conductive material can be removed from above the horizontal plane including the top surface of the bump-connection-level dielectric layer 130. Each remaining portion of the at least one conductive material constitutes a bump connection via structure 128 that contacts a top surface of a respective underlying bit line 108. Each of the bump connection via structures 128 is laterally surrounded by a respective annular dielectric spacer 132 having a uniform width and contacting a horizontal surface of a respective one of the bit lines 108. Each of the bump connection via structures 128 vertically extends through the planar dielectric spacer layer 120.

Referring to FIGS. 23A and 23B, metallic bump structures 180 can be formed on each of the bump connection via structures 128. The metallic bump structures 180 can be formed by deposition and patterning of planar material layers including the materials of the UBM layer stacks (181, 182, 183) and the solder material portions 184 described above. The planar material layers can be patterned by applying and patterning a photoresist layer to cover discrete portions of the planar material layers, and isotropically or anisotropically etching portions of the planar material layers that are not covered by the photoresist. Each metallic bump structure 180 can contact a top surface of a respective one of the bump connection via structures 128. In one embodiment, each metallic bump structure 180 can contact only a respective one of the bump connection via structure 128.

Figure 24A:
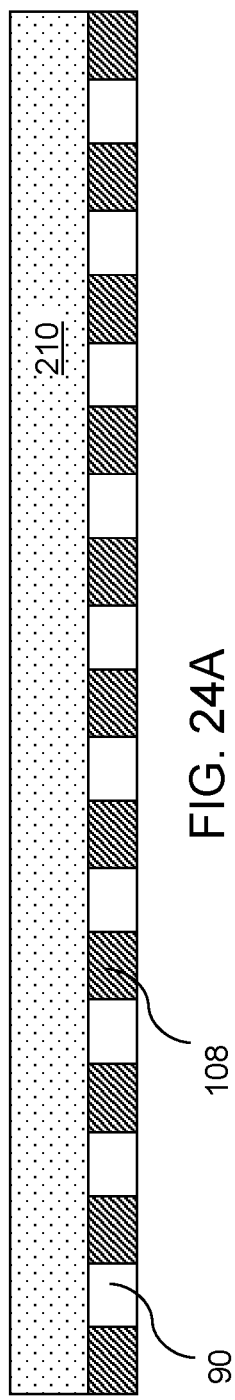
FIGS. 24A and 24B are vertical cross-sectional views of a second exemplary configuration of a region of the exemplary structure corresponding to the region R in FIG. 14B along vertical planes that correspond to the vertical planes C-C' and D-D' of FIG. 14B, respectively, after formation of a planar dielectric spacer layer according to an embodiment of the present disclosure.
Figure 24B:
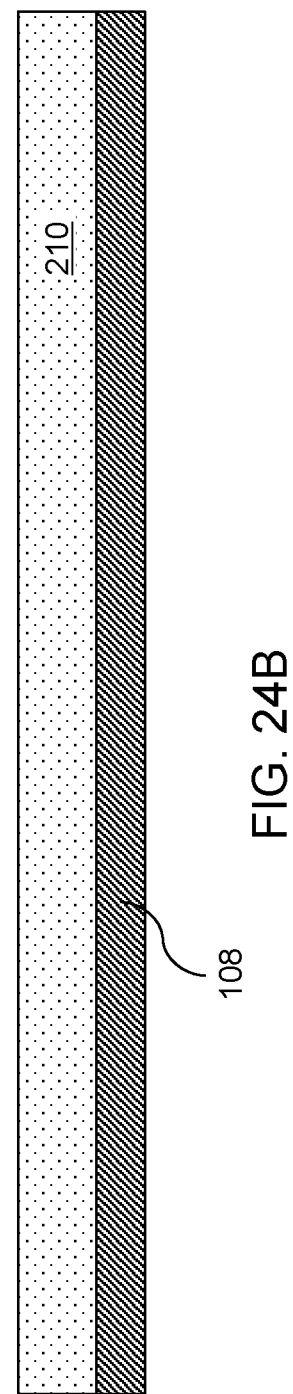

Referring to FIGS. 24A and 24B, a second exemplary configuration of a region of the exemplary structure corresponding to the region R in FIG. 14B is illustrated. The second exemplary configuration can be provided by forming a planar dielectric spacer layer 210 directly on the top surface of the bit-line-level dielectric layer 90 and on the top surfaces of the bit lines 108. The planar dielectric spacer layer 210 can include undoped silicate glass, a doped silicate glass, or organosilicate glass. The planar dielectric spacer layer 210 can have a uniform thickness in a range from 30 nm to 300 nm, although lesser and greater thicknesses can also be used.

Referring to FIGS. 25A and 25B, a sacrificial matrix material layer can be applied over the planar dielectric spacer layer 210, and then lithographically patterned to form discrete sacrificial matrix material portions 127. In one embodiment, the discrete sacrificial matrix material portions 127 can include photoresist material portions that can be directly patterned by photolithographic exposure and development. Each of the sacrificial matrix material portions 127 can overlap with only a single one of the bit lines 108, and can laterally extend along the lengthwise direction of the bit lines 108. For example, the width of each sacrificial matrix material portions 127 can be less than the sum of the pitch of the bit lines 108 along the widthwise direction of the bit lines 108 (such as the first horizontal direction hd1) and the inter-bit-line spacing between a neighboring pair of bit lines 108, which is the same as the sum of the width of a bit line 108 and twice the inter-bit-line spacing between a neighboring pair of bit lines 108. In one embodiment, each of the sacrificial matrix material portions 127 can have a width that is greater than the uniform pitch of the bit lines 108.

Referring to FIGS. 26A and 26B, the sacrificial matrix material portions 127 can be trimmed by an isotropic trimming process. For example, if the sacrificial matrix material portions 127 include a photoresist material, a slow isotropic ashing process with a controlled ashing rate may be used to isotropically trim the sacrificial matrix material portions 127. In one embodiment, the trimming distance can be about one half of the difference between the width of the sacrificial matrix material portions 127 as formed at the processing steps of FIGS. 25A and 25B and the width of a bit line 108. Each trimmed sacrificial matrix material portion 127 can have a respective width that is less than the uniform pitch of the bit lines 108. In one embodiment, the width of each trimmed sacrificial matrix material portion 127 can be in a range from 75% to 125% of the width of a bit line 108.

Referring to FIGS. 27A and 27B, a bump-connection-level dielectric layer 230 can be formed around the sacrificial matrix material portions 127. The bump-connection-level dielectric layer 230 can be deposited at a low temperature that does not damage the sacrificial matrix material portion 127. For example, a silicon dioxide material can be deposited by a plasma assisted chemical vapor deposition process at a temperature in a range from 250 degrees Celsius to 350 degrees Celsius. The deposited dielectric material of the bump-connection-level dielectric layer 230 can be planarized, for example, by chemical mechanical planarization (CMP) so that excess portions of the deposited dielectric material can be removed from above the horizontal plane including the top surfaces of the sacrificial matrix material portions 127. The bump-connection-level dielectric layer 230 can be formed around the remaining portions of the sacrificial matrix material portions 127.

Figure 28A:
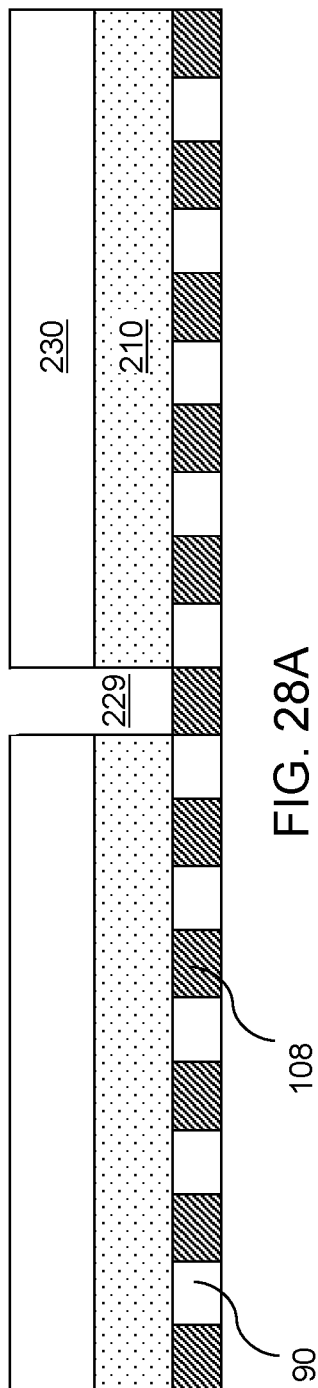
FIGS. 28A and 28B are vertical cross-sectional views of the second exemplary configuration of the region of the exemplary structure corresponding to the region R in FIG. 14B along vertical planes that correspond to the vertical planes C-C' and D-D' of FIG. 14B, respectively, after formation of elongated cavities through the bump-connection-level dielectric layer and the planar dielectric spacer layer according to an embodiment of the present disclosure.
Figure 28B:
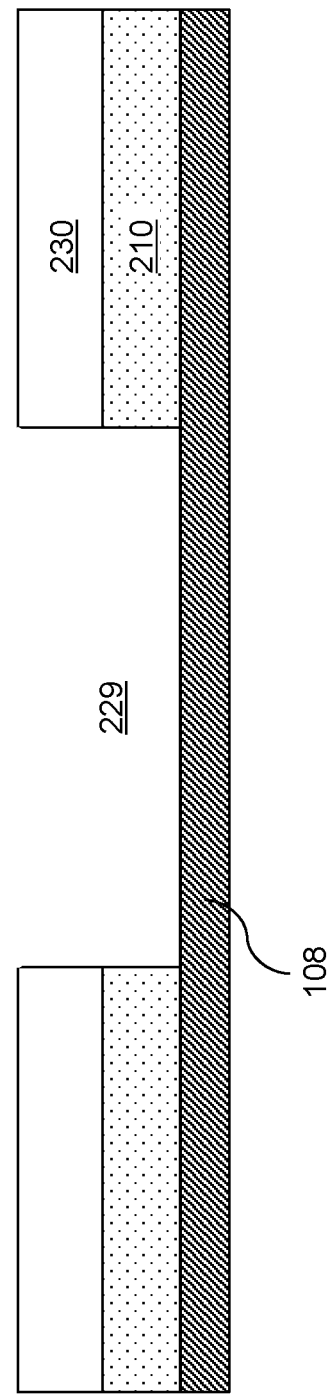

Referring to FIGS. 28A and 28B, the sacrificial matrix material portions 127 can be removed selective to the material of the bump-connection-level dielectric layer 230. For example, if the sacrificial matrix material portions 127 include photoresist material portions, an ashing process can be performed to remove the sacrificial matrix material portions 127. Elongated cavities 229 are formed in the volumes from which the sacrificial matrix material portions 127 are removed. Portions of the planar dielectric spacer layer 210 that underlie the elongated cavities 229 can be removed by an anisotropic etch process to vertically extend the elongated cavities 229 to the top surfaces of underlying bit lines 108. The anisotropic etch process etches the material of the planar dielectric spacer layer 210 at the same rate as, or at a higher rate than, the etch rate of the bump-connection-level dielectric layer 230. In one embodiment, the planar dielectric spacer layer 210 can include a dielectric material having a higher etch rate than the bump-connection-level dielectric layer 230 during the anisotropic etch process.

Referring to FIGS. 29A and 29B, the processing steps of FIGS. 22A and 22B can be performed to form bump connection via structures 128 in the elongated cavities 229.

Referring to FIGS. 30A and 30B, the processing steps of FIGS. 23A and 23B can be performed to form metallic bump structures 180 on top of the bump connection via structures 128.

Referring to FIGS. 31A and 31B, a third exemplary configuration of the region of the exemplary structure corresponding to the region R in FIG. 14B is illustrated. The third configuration illustrated in FIGS. 31A and 31B can be derived from the second configuration illustrated in FIGS. 26A and 26B by depositing a bump-connection-level dielectric layer 240 around, and over, the sacrificial matrix material portions 127. The bump-connection-level dielectric layer 240 can be deposited at a low temperature that does not damage the sacrificial matrix material portion 127. For example, a silicon dioxide material can be deposited by a plasma assisted chemical vapor deposition process at a temperature in a range from 250 degrees Celsius to 350 degrees Celsius. The deposited dielectric material of the bump-connection-level dielectric layer 240 may, or may not, be planarized. In case the deposited dielectric material of the bump-connection-level dielectric layer 230 are not planarized, bump regions can be present in the bump-connection-level dielectric layer 240 above each sacrificial matrix material portion 127. The vertical distance between the top surface of the bump-connection-level dielectric layer 240 and the top surfaces of the sacrificial matrix material portion 127 can be in a range from 500 nm to 5,000 nm, although lesser and greater thicknesses can also be used.

Referring to FIGS. 32A and 32B, a photoresist layer 177 can be applied over the bump-connection-level dielectric layer 240, and then lithographically patterned to form openings having the shapes of the metallic bump structures 180 to be subsequently formed. In other words, the shapes of the openings in the photoresist layer 177 can be the same as the shapes of the metallic bump structures 180 to be subsequently formed. As such, the patterned photoresist layer 177 can be a continuous matrix material layer including multiple disjoined openings therein. The area of each sacrificial matrix material portion 127 can be entirely within the area of a respective one of the openings in the photoresist layer 177.

Referring to FIGS. 33A and 33B, an anisotropic etch process is performed to transfer the pattern in the photoresist layer 177 through an upper region of the bump-connection-level dielectric layer 240. The pattern in the photoresist layer 177 is replicated in the upper region of the bump-connection-level dielectric layer 240 to form recess regions, which are herein referred to as bump-region recesses 179. In one embodiment, the depth of the bump-region recesses 179 can be controlled such that top surfaces of the sacrificial matrix material portions 127 are physically exposed at the bottom of each bump-region recess 179.

Referring to FIGS. 34A and 34B, the sacrificial matrix material portions 127 can be removed selective to the material of the bump-connection-level dielectric layer 240. For example, if the sacrificial matrix material portions 127 include photoresist material portions, an ashing process can be performed to remove the sacrificial matrix material portions 127. The photoresist layer 177 may be removed during removal of the sacrificial matrix material portions 127. Elongated cavities 229 are formed in the volumes from which the sacrificial matrix material portions 127 are removed. Portions of the planar dielectric spacer layer 210 that underlie the elongated cavities 229 can be removed by an anisotropic etch process to vertically extend the elongated cavities 229 to the top surfaces of underlying bit lines 108. The anisotropic etch process etches the material of the planar dielectric spacer layer 210 at the same rate as, or at a higher rate than, the etch rate of the bump-connection-level dielectric layer 240. In one embodiment, the planar dielectric spacer layer 210 can include a dielectric material having a higher etch rate than the bump-connection-level dielectric layer 240 during the anisotropic etch process. An integrated recess and via cavity (179, 229) is formed above each physically exposed surface of a bit line 108. Each integrated recess and via cavity (179, 229) includes an elongated cavity 229 and a bump recess region 179.

Referring to FIGS. 35A and 35B, material layers including materials of the UBM layer stack (181, 182, 183) and the solder material portions 184 can be deposited in the integrated recess and via cavities (179, 229). The materials for the UBM layer stack (181, 182, 183) and the solder material portions 184 can be any of the material sets described above. Excess portions of the materials for the UBM layer stack (181, 182, 183) and the solder material portions 184 can be removed from above the horizontal plane including the top surface of the bump-connection-level dielectric layer 240 by a planarization process. Each remaining portion of the materials for the UBM layer stack (181, 182, 183) and the solder material portions 184 after the planarization process constitutes an integrated plate and via structure 280.

Each integrated plate and via structure 280 includes a respective combination of a bump connection via structure 228 and a metallic bump structure 180. Thus, the bump connection via structures 228 and the metallic bump structures 180 are formed as a plurality of integrated plate and via structures 280, each of which is a unitary structure, i.e., a continuously extending structure comprising a single contiguous set of material portions. As such, each of the plurality of integrated plate and via structures 280 includes an adjoined pair of a respective one of the metallic bump structures 180 and a respective one of the bump connection via structures 228. Each material within the respective one of the bump connection via structures 228 continuously extends into at least a peripheral volume of the respective one of the metallic bump structures 180 as a continuous material portion. In one embodiment, any component layer of a UBM layer stack (181, 182, 183) located within a bump connection via structure 228 of an integrated plate and via structure 280 continuously extends into at least a peripheral volume of an overlying metallic bump structure 180 as a continuous material layer. In one embodiment, each of the integrated plate and via structure 280 can have a general configuration for the metallic bump structures 180 illustrated in FIG. 15D.

Referring to FIGS. 36A and 26B, a fourth exemplary configuration of the region of the exemplary structure corresponding to the region R in FIG. 14B is illustrated. The fourth exemplary configuration can be derived from the second exemplary configuration illustrated in FIGS. 24A and 24B by forming a sacrificial matrix material layer 327L on top of the planar dielectric spacer layer 210. The sacrificial matrix material layer 327L can include a non-photoresist material such as amorphous carbon, diamond-like carbon, a semiconductor material (such as amorphous silicon or polysilicon), an organic polymer, or an inorganic polymer such as a silicon-based polymer.

A patterned photoresist layer 317 is formed over the sacrificial matrix material layer 327L. The pattern in the patterned photoresist layer 317 can be the same as the pattern of the sacrificial matrix material portions 127 in FIGS. 25A and 25B, which may be patterned discrete photoresist material portions.

Referring to FIGS. 37A and 37B, an anisotropic etch process is performed to etch through unmasked portions of the sacrificial matrix material layer 327L using the patterned photoresist layer 317 as an etch mask. The planar dielectric spacer layer 210 can be used as an etch stop structure for the anisotropic etch process. Each remaining patterned portion of the sacrificial matrix material layer 327L constitutes a sacrificial matrix material portion 327. The sacrificial matrix material portions 327 can have the same pattern as the sacrificial matrix material portions 127 in FIGS. 25A and 25B. The patterned photoresist layer 317 can be subsequently removed, for example, by ashing or by dissolution in a solvent.

Referring to FIGS. 38A and 38B, the sacrificial matrix material portions 327 can be trimmed by an isotropic trimming process. For example, an isotropic wet etch process or an isotropic dry etch process may be used to isotropically trim the sacrificial matrix material portions 327. In one embodiment, the trimming distance can be about one half of the difference between the width of the sacrificial matrix material portions 327 as formed at the processing steps of FIGS. 37A and 37B and the width of a bit line 108. Each trimmed sacrificial matrix material portion 327 can have a respective width that is less than the uniform pitch of the bit lines 108. In one embodiment, the width of each trimmed sacrificial matrix material portions 327 can be in a range from 75% to 125% of the width of a bit line 108.

Subsequently, the processing steps of FIGS. 27A and 27B, 28A and 28B, 29A and 29B, and 30A and 30B can be performed to form bump connection via structures 228 and metallic bump structures 180. Alternatively, the processing steps of FIGS. 31A and 31B, 32A and 32B, 33A and 33B, 34A and 34B, and 35A and 35B can be performed to form integrated plate and via structures 280.

Referring to FIGS. 39A and 39B, a fifth exemplary configuration of the region of the exemplary structure corresponding to the region R in FIG. 14B is illustrated, which can be the same as the fourth exemplary configuration of the region of the exemplary structure illustrated in FIGS. 36A and 36B. The patterned photoresist layer 317 includes discrete portions that cover the area of a respective one of the bit lines 108.

Referring to FIGS. 40A and 40B, the patterned photoresist layer 317 can be trimmed by an isotropic trimming process. For example, a slow isotropic ashing process with a controlled ashing rate may be used to isotropically trim the patterned photoresist layer 317. In one embodiment, the trimming distance can be about one half of the difference between the width of the discrete patterned portions of the photoresist layer 317 as formed at the processing steps of FIGS. 39A and 39B and the width of a bit line 108. Each trimmed portion of the photoresist layer 317 can have a respective width that is less than the uniform pitch of the bit lines 108. In one embodiment, the width of each trimmed portion of the photoresist layer 317 can be in a range from 75% to 125% of the width of a bit line 108.

Referring to FIGS. 41A and 41B, an anisotropic etch process is performed to etch through unmasked portions of the sacrificial matrix material layer 327L using the trimmed discrete portions of the photoresist layer 317 as an etch mask. The planar dielectric spacer layer 210 can be used as an etch stop structure for the anisotropic etch process. Each remaining patterned portion of the sacrificial matrix material layer 327L constitutes a sacrificial matrix material portion 327. The sacrificial matrix material portions 327 can have the same pattern as the sacrificial matrix material portions 327 in FIGS. 38A and 38B. The patterned photoresist layer 317 can be subsequently removed, for example, by ashing or by dissolution in a solvent.

Subsequently, the processing steps of FIGS. 27A and 27B, 28A and 28B, 29A and 29B, and 30A and 30B can be performed to form bump connection via structures 228 and metallic bump structures 180. Alternatively, the processing steps of FIGS. 31A and 31B, 32A and 32B, 33A and 33B, 34A and 34B, and 35A and 35B can be performed to form integrated plate and via structures 280.

Referring to all drawings and according to various embodiments of the present disclosure, a three-dimensional memory device comprising a memory die is provided. The memory die comprises: an alternating stack of insulating layers 32 and electrically conductive layers 46 located over a substrate (9, 10); memory stack structures 55 extending through the alternating stack (32, 46), wherein each of the memory stack structures 55 comprises a memory film 50 and a vertical semiconductor channel 60 contacting an inner sidewall of the memory film 50; bit lines 108 electrically connected to an end portion of a respective one of the vertical semiconductor channels 60; bump connection via structures 128 contacting a top surface of a respective one of the bit lines 108, wherein each of the bump connection via structures 128 has a greater lateral dimension along a lengthwise direction of the bit lines 108 than along a widthwise direction of the bit lines 108; and metallic bump structures 180 contacting a respective one of the bump connection via structures 128.

In one embodiment, each of the metallic bump structures 180 comprises a solder material portion 184. In one embodiment, each of the metallic bump structures 180 comprises an under-bump metallization (UBM) layer stack (181, 182, 183) contacting a respective one of the solder material portions 184 and a respective one of the bump connection via structures 128. In one embodiment, the solder material portions 180 comprise a metal selected from gold, a lead-tin alloy, and a tin-silver-copper alloy.

In one embodiment, the bit lines 108 comprise a one-dimensional periodic array of metal lines that laterally extend along the lengthwise direction and are laterally spaced apart along the widthwise direction with a uniform pitch. In one embodiment, the bump connection via structures 128 have a length-to-width ratio of greater than 2, such as in a range from 3 to 30. However, greater or lesser ratios may also be used. In one embodiment, the memory die comprises drain regions 63 contacting an end of a respective one of the vertical semiconductor channels 60, and conductive via structures (88, 198) overlying the drain regions 63. Electrical connection paths between the drain regions 63 and the bit lines 108 consist of subsets of the conductive via structures (88, 198).

In one embodiment, a logic chip 700 can be bonded to the metallic bump structures 180. A bump-connection-level dielectric layer 130 can laterally surround each of the bump connection via structures 128 and can contact a planar surface (such as a bottom surface) of each of the metallic bump structures 180.

In one embodiment, each of the bump connection via structures 128 is laterally surrounded by a respective annular dielectric spacer 132 having a uniform width and contacting a horizontal surface of a respective one of the bit lines 108.

In one embodiment, a planar dielectric spacer layer (120 or 210) can have a uniform thickness, can contact top surfaces of each of the bit lines 108, and can contact a bottom surface of the bump-connection-level dielectric layer 130. Each of the bump connection via structures 128 vertically extends through the planar dielectric spacer layer 130.

In one embodiment, the bump connection via structures 128 and the metallic bump structures 180 can be formed as a plurality of integrated plate and via structures 280 that are unitary structures. Each of the plurality of integrated plate and via structures 280 can include an adjoined pair of a respective one of the metallic bump structures 180 and a respective one of the bump connection via structures 128. Each material within the respective one of the bump connection via structures 128 continuously extends into at least a peripheral volume of the respective one of the metallic bump structures 180 as a continuous material portion.

In one embodiment, each of the metallic bump structures 180 includes a planar top surface (such as a horizontal top surface) and a planar bottom surface (such as a horizontal bottom surface) that are parallel to planar surfaces of the insulating layers 32 and the electrically conductive layers 46 within the alternating stack (32, 42).

Although the foregoing refers to particular preferred embodiments, it will be understood that the disclosure is not so limited. It will occur to those of ordinary skill in the art that various modifications may be made to the disclosed embodiments and that such modifications are intended to be within the scope of the claims. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment using a particular structure and/or configuration is illustrated in the present disclosure, it is understood that the claims may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A three-dimensional memory device comprising a memory die, wherein the memory die comprises:
    an alternating stack of insulating layers and electrically conductive layers located over a substrate;
    memory stack structures extending through the alternating stack, wherein each of the memory stack structures comprises a memory film and a vertical semiconductor channel contacting an inner sidewall of the memory film;
    bit lines electrically connected to an end portion of a respective one of the vertical semiconductor channels;
    bump connection via structures contacting a top surface of a respective one of the bit lines, wherein each of the bump connection via structures has a greater lateral dimension along a lengthwise direction of the bit lines than along a widthwise direction of the bit lines; and
    metallic bump structures contacting a respective one of the bump connection via structures.

2. The three-dimensional memory device of claim 1, wherein each of the metallic bump structures comprises copper suitable for copper-to-copper bonding or a solder material portion.

3. The three-dimensional memory device of claim 2, wherein each of the metallic bump structures comprises an under-bump metallization (UBM) layer stack contacting a respective one of the solder material portions and a respective one of the bump connection via structures.

4. The three-dimensional memory device of claim 2, wherein the solder material portions comprise a metal selected from gold, a lead-tin alloy, and a tin-silver-copper alloy.

5. The three-dimensional memory device of claim 1, wherein the bit lines comprise a one-dimensional periodic array of metal lines that laterally extend along the lengthwise direction and are laterally spaced apart along the widthwise direction with a uniform pitch.

6. The three-dimensional memory device of claim 5, wherein the bump connection via structures have a length-to-width ratio greater than 2.

7. The three-dimensional memory device of claim 5, wherein:
    the memory die comprises drain regions contacting an end of a respective one of the vertical semiconductor channels, and conductive via structures overlying the drain regions; and
    electrical connection paths between the drain regions and the bit lines consist of subsets of the conductive via structures.

8. The three-dimensional memory device of claim 1, further comprising a logic chip bonded to the metallic bump structures.

9. The three-dimensional memory device of claim 1, further comprising a bump-connection-level dielectric layer laterally surrounding each of the bump connection via structures and contacting a planar surface of each of the metallic bump structures.

10. The three-dimensional memory device of claim 9, wherein each of the bump connection via structures is laterally surrounded by a respective annular dielectric spacer having a uniform width and contacting a horizontal surface of a respective one of the bit lines.

11. The three-dimensional memory device of claim 9, further comprising a planar dielectric spacer layer having a uniform thickness and contacting top surfaces of each of the bit lines and contacting a bottom surface of the bump-connection-level dielectric layer, wherein each of the bump connection via structures vertically extends through the planar dielectric spacer layer.

12. The three-dimensional memory device of claim 9, wherein:
    the bump connection via structures and the metallic bump structures are formed as a plurality of integrated plate and via structures that are unitary structures;
    each of the plurality of integrated plate and via structures includes an adjoined pair of a respective one of the metallic bump structures and a respective one of the bump connection via structures; and
    each material within the respective one of the bump connection via structures continuously extends into at least a peripheral volume of the respective one of the metallic bump structures as a continuous material portion.

13. The three-dimensional memory device of claim 9, wherein each of the metallic bump structures includes a planar top surface and a planar bottom surface that are parallel to planar surfaces of the insulating layers and the electrically conductive layers within the alternating stack.

* * * * *